United States Patent
Hack et al.

(10) Patent No.: US 10,243,023 B2
(45) Date of Patent: Mar. 26, 2019

(54) TOP EMISSION AMOLED DISPLAYS USING TWO EMISSIVE LAYERS

(71) Applicant: Universal Display Corporation, Ewing, NJ (US)

(72) Inventors: Michael Hack, Princeton, NJ (US); Michael Stuart Weaver, Princeton, NJ (US); Ruiqing Ma, Morristown, NJ (US); William E. Quinn, Whitehouse Station, NJ (US); Gregory McGraw, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/698,352

(22) Filed: Apr. 28, 2015

(65) Prior Publication Data

US 2015/0340410 A1  Nov. 26, 2015

Related U.S. Application Data

(63) Continuation-in-part of application No. 14/605,876, filed on Jan. 26, 2015, which is a continuation-in-part of application No. 14/333,756, filed on Jul. 17, 2014, which is a continuation-in-part of application No. 14/243,145, filed on Apr. 2, 2014, which is a
(Continued)

(51) Int. Cl.
| | |
|---|---|
| *H01L 27/32* | (2006.01) |
| *H01L 51/56* | (2006.01) |
| *H01L 51/52* | (2006.01) |

(52) U.S. Cl.
CPC ........ *H01L 27/3218* (2013.01); *H01L 27/322* (2013.01); *H01L 27/3213* (2013.01); *H01L 51/5265* (2013.01); *H01L 51/56* (2013.01); *H01L 2251/5315* (2013.01)

(58) Field of Classification Search
CPC ............. H01L 27/3206; H01L 51/5265; H01L 51/5209; H01L 51/56
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| (Continued) | | |

FOREIGN PATENT DOCUMENTS

| | | |
|---|---|---|
| CN | 1689064 A | 10/2005 |
| CN | 101874317 A | 10/2010 |
| (Continued) | | |

OTHER PUBLICATIONS

International Search Report and Written Opinion dated Nov. 10, 2015 in corresponding International Application No. PCT/US2015/032672., Nov. 10, 2015.
(Continued)

*Primary Examiner* — Joseph L Williams
(74) *Attorney, Agent, or Firm* — Morris & Kamlay LLP

(57) ABSTRACT

Full-color pixel arrangements for use in devices such as OLED displays are provided, in which multiple sub-pixels are configured to emit different colors of light, with each sub-pixel having a different optical path length than some or all of the other sub-pixels within the pixel.

20 Claims, 48 Drawing Sheets

Related U.S. Application Data continuation-in-part of application No. 13/744,581, filed on Jan. 18, 2013.

(60) Provisional application No. 62/003,269, filed on May 27, 2014, provisional application No. 62/005,343, filed on May 30, 2014, provisional application No. 62/026,494, filed on Jul. 18, 2014, provisional application No. 62/068,281, filed on Oct. 24, 2014.

(56) References Cited

U.S. PATENT DOCUMENTS

| | | | |
|---|---|---|---|
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,280,559 B1 | 8/2001 | Terada et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,038,373 B2 | 5/2006 | Arnold et al. | |
| 7,279,704 B2 | 10/2007 | Walters et al. | |
| 7,431,968 B1 | 10/2008 | Shtein et al. | |
| 7,714,500 B2 | 5/2010 | Hirakata et al. | |
| 7,968,146 B2 | 6/2011 | Wagner et al. | |
| 7,982,385 B2 * | 7/2011 | Kimura | H01L 27/3213 313/503 |
| 8,040,052 B2 | 10/2011 | Kobayashi | |
| 8,084,940 B2 | 12/2011 | Kim et al. | |
| 8,159,426 B2 | 4/2012 | Chang et al. | |
| 8,400,018 B2 | 3/2013 | Joannopoulos et al. | |
| 8,502,445 B2 | 8/2013 | Levermore et al. | |
| 8,766,531 B1 | 7/2014 | Hack | |
| 8,896,200 B2 | 11/2014 | Huang et al. | |
| 2003/0160915 A1 | 8/2003 | Liu | |
| 2003/0178936 A1 | 9/2003 | Park et al. | |
| 2003/0230980 A1 | 12/2003 | Forrest et al. | |
| 2004/0061107 A1 | 4/2004 | Duggal | |
| 2004/0174116 A1 | 9/2004 | Lu et al. | |
| 2005/0225232 A1 | 10/2005 | Boroson | |
| 2005/0242717 A1 | 11/2005 | Bae et al. | |
| 2006/0044226 A1 | 3/2006 | Liedenbaum | |
| 2006/0238118 A1 | 10/2006 | Spindler | |
| 2006/0238120 A1 | 10/2006 | Miller | |
| 2007/0052354 A1 | 3/2007 | Chang | |
| 2007/0063946 A1 | 3/2007 | Nakamura | |
| 2007/0205423 A1 | 9/2007 | Yamazaki et al. | |
| 2007/0257944 A1 | 11/2007 | Miller et al. | |
| 2007/0273295 A1 | 11/2007 | Wakabayashi | |
| 2007/0279372 A1 | 12/2007 | Brown Elliott et al. | |
| 2008/0198180 A1 | 8/2008 | Langendijk | |
| 2008/0203905 A1 | 8/2008 | Je | |
| 2009/0051283 A1 | 2/2009 | Cok | |
| 2009/0085478 A1 | 4/2009 | Cok | |
| 2009/0091238 A1 | 4/2009 | Cok | |
| 2009/0092325 A1 | 4/2009 | Brown Elliott et al. | |
| 2009/0109172 A1 | 4/2009 | Lee et al. | |
| 2009/0121983 A1 | 5/2009 | Sung et al. | |
| 2009/0189881 A1 | 7/2009 | Ooishi et al. | |
| 2009/0295283 A1 | 12/2009 | Kim et al. | |
| 2010/0053043 A1 | 3/2010 | Sakamoto | |
| 2010/0090620 A1 | 4/2010 | Hack et al. | |
| 2010/0103187 A1 | 4/2010 | Linssen | |
| 2010/0187988 A1 | 7/2010 | Forrest et al. | |
| 2010/0219427 A1 | 9/2010 | Fukuda | |
| 2010/0231484 A1 | 9/2010 | Cok et al. | |
| 2010/0244069 A1 | 9/2010 | Weaver | |
| 2011/0062427 A1 | 3/2011 | Jeong et al. | |
| 2011/0095276 A1 | 4/2011 | Imai et al. | |
| 2011/0096530 A1 | 4/2011 | Shimizu et al. | |
| 2011/0248294 A1 | 10/2011 | Weaver et al. | |
| 2011/0309389 A1 | 12/2011 | Yu et al. | |
| 2012/0001207 A1 | 1/2012 | Lee | |
| 2012/0026210 A1 | 2/2012 | Yano | |
| 2012/0075278 A1 | 3/2012 | Hara et al. | |
| 2012/0147065 A1 | 6/2012 | Byun et al. | |
| 2012/0287605 A1 | 11/2012 | Chen et al. | |
| 2012/0313843 A1 | 12/2012 | Kondoh | |
| 2013/0020933 A1 | 1/2013 | Levermore et al. | |
| 2013/0082589 A1 | 4/2013 | So et al. | |
| 2013/0105777 A1 | 5/2013 | Adamovich et al. | |
| 2013/0105778 A1 | 5/2013 | Kim et al. | |
| 2013/0105833 A1 | 5/2013 | Weaver et al. | |
| 2013/0146853 A1 | 6/2013 | Lee | |
| 2013/0146904 A1 | 6/2013 | Edmond | |
| 2013/0187132 A1 | 7/2013 | Ando et al. | |
| 2013/0235094 A1 | 9/2013 | Cok | |
| 2013/0285537 A1 | 10/2013 | Chaji | |
| 2013/0337588 A1 | 12/2013 | Lee | |
| 2014/0061595 A1 | 3/2014 | Kim et al. | |
| 2014/0065750 A1 | 3/2014 | Harikrishna Mohan et al. | |
| 2014/0084256 A1 | 3/2014 | Kim et al. | |
| 2014/0111406 A1 | 4/2014 | Wang et al. | |
| 2014/0183471 A1 | 7/2014 | Heo | |
| 2014/0291647 A1 | 10/2014 | Suzuki | |
| 2015/0009194 A1 | 1/2015 | Kim | |
| 2015/0034911 A1 | 2/2015 | Liu | |
| 2015/0138463 A1 | 5/2015 | Jinta | |

FOREIGN PATENT DOCUMENTS

| | | |
|---|---|---|
| JP | 2007317915 | 12/2007 |
| JP | 2008218300 A | 9/2008 |
| JP | 2008539554 A | 11/2008 |
| JP | 2010050014 A | 3/2010 |
| JP | 2010165510 A | 7/2010 |
| JP | 2012077069 A | 4/2012 |
| JP | 2012089513 A | 5/2012 |
| JP | 2012109576 A | 6/2012 |
| JP | 2014045166 | 3/2014 |
| WO | WO-2006115960 A1 | 11/2006 |
| WO | 2008057394 | 5/2008 |
| WO | 2010011390 | 1/2010 |
| WO | 2014020817 A1 | 2/2014 |
| WO | WO-2014020817 A1 | 2/2014 |

OTHER PUBLICATIONS

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Hack, et al., "Novel Two Mask AMOLED Display Architecture", SID 2014 Digest; pp. 567-569.

Wood, "MacAdam Ellipses", Protocol, 2010, 15-18.

Office Action dated Feb. 14, 2017 as received in JP Application No. 2014-005666.

Notice of Allowance dated Aug. 15, 2016 as received in U.S. Appl. No. 14/243,145.

Office Action dated Apr. 14, 2017 as received in CN Application No. 201410019395.X.

Intenational Search Report and Written Opinion dated Nov. 10, 2015 in corresponding International Application No. PCT/US2015/032672., Nov. 10, 2015.

Office Action dated Jul. 11, 2017 as received in JP Application No. 2014-005666.

CN Office Action dated Dec. 13, 2017 in Application No. 201410019395.X, 5 pages.

Chinese Office Action dated Jun. 12, 2018 for CN Application No. 201410019395.X, 8 pages.

Chinese Office Action issued in corresponding CN Application No. 201580028268.9, dated Oct. 25, 2018, 5 pages.

(56) References Cited

OTHER PUBLICATIONS

Japanese Office Action (including English translation) issued in corresponding JP Application No. 2016-569684, dated Oct. 30, 2018, 9 pages.

* cited by examiner

FIG. 28A         FIG. 28B
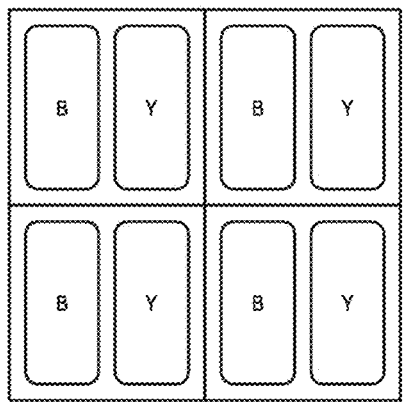
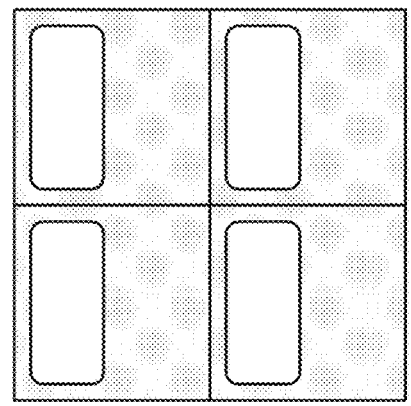
FIG. 29A
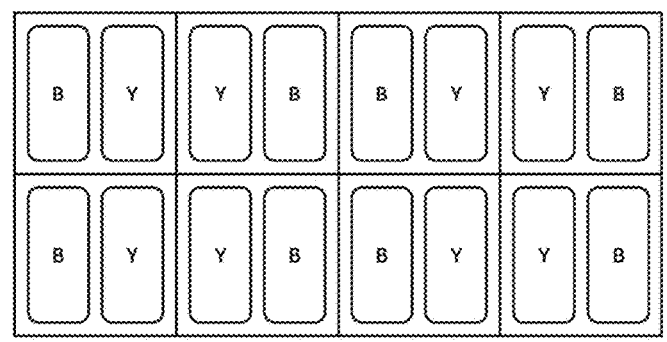
FIG. 29B
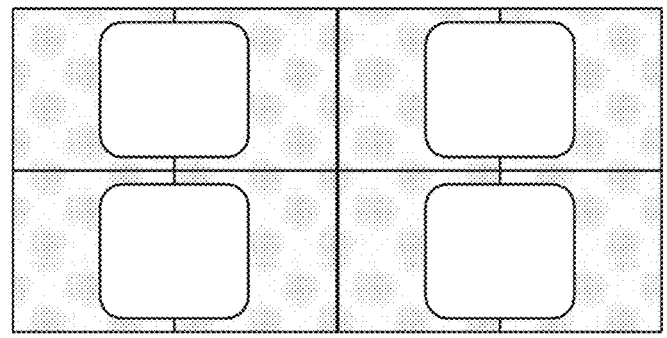

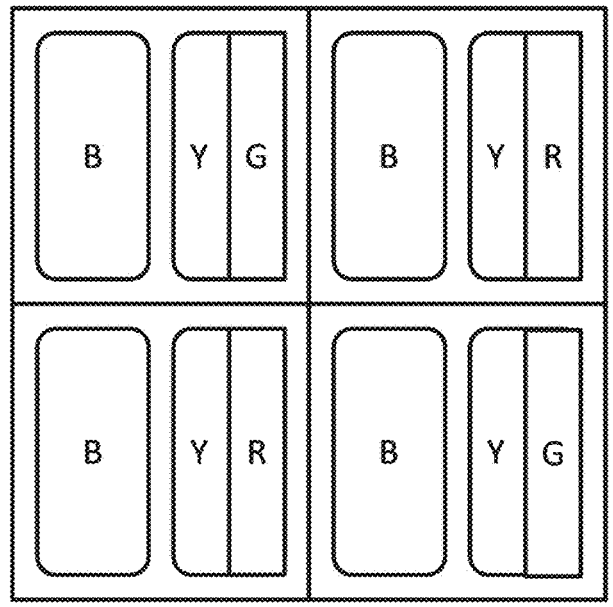
FIG. 36
FIG. 37
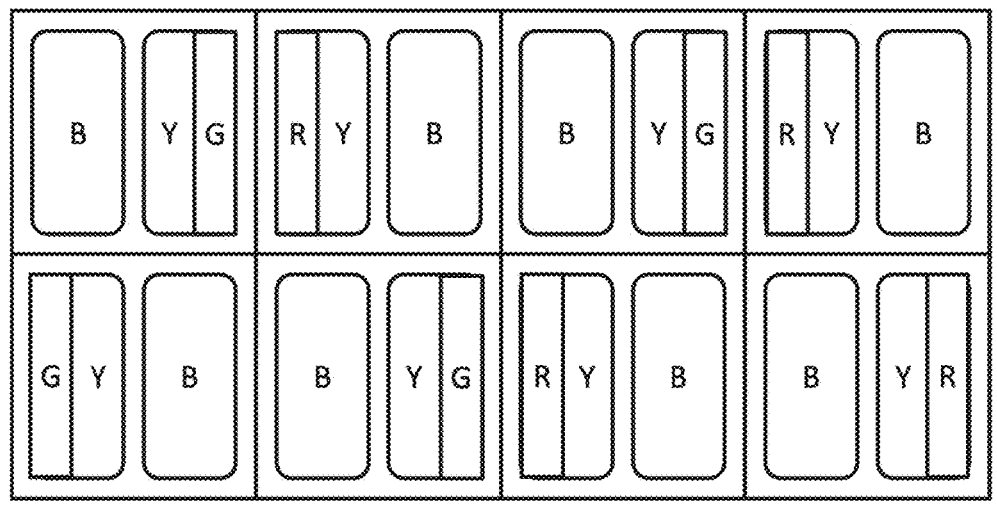

RGB side-by-side　　　　　　　YB two-deposition

TOP EMISSION AMOLED DISPLAYS USING TWO EMISSIVE LAYERS

PRIORITY

This application claims the benefit of U.S. Provisional Patent Application Ser. No. 62/003,269, filed May 27, 2014; 62/005,343, filed May 30, 2014; 62/026,494, filed Jul. 18, 2014; and 62/068,281, filed Oct. 24, 2014, the disclosure of each of which is incorporated by reference in its entirety. This application is also a continuation-in-part of U.S. application Ser. No. 14/605,876, filed Jan. 26, 2015, which is a continuation-in-part of U.S. application Ser. No. 14/333, 756, filed Jul. 17, 2014, which is a continuation-in-part of U.S. application Ser. No. 14/243,145, filed Apr. 2, 2014, which is a continuation-in-part of U.S. application Ser. No. 13/744,581, filed Jan. 18, 2013, the disclosure of each of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices such as OLED devices and, more specifically, to devices that include full-color pixel arrangements that have pixel arrangements that include not more than two colors of emissive regions and/or four colors of sub-pixels, and to OLEDs and other devices incorporating the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)3, which has the following structure:

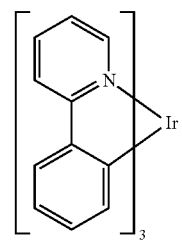

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between. As used herein, two layers or regions may be described as being disposed in a "stack" when at least a portion of one layer or region is disposed over at least a portion of the other.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm; a "green" layer, material, region, or device refers to one that has an emission spectrum with a peak wavelength in the range of about 500-600 nm; a "blue" layer, material, or device refers to one that has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy.

More details on OLEDs, and the definitions described above, can be found in U.S. Pat. No. 7,279,704, which is incorporated herein by reference in its entirety.

SUMMARY OF THE INVENTION

Various embodiments disclosed herein provide devices, such as OLED displays, and techniques for the fabrication thereof, which include a limited number of emissive regions, while still being capable of providing sufficient color range to provide full-color displays and similar devices.

In all embodiment, a full-color pixel arrangement for a device such as an OLED display is provided. The arrangement includes a substrate and a plurality of pixels, each of which includes emissive regions of exactly two colors, which are disposed laterally adjacent to one another over the substrate. Each pixel may include multiple sub-pixels configured to emit different colors of light, where each sub-pixel may have a different optical path length than some or all of the others. The arrangement may include two, three, four, or more sub-pixels. The differing optical path lengths may be provided by layers having different thicknesses within each sub-pixel, such as transport or blocking layers of different thicknesses. In some embodiments, the total thickness of organic layers within each sub-pixel may be the same, and/or the thicknesses of the same type of organic layer within each sub-pixel may be the same as in some or all of the other sub-pixels. Alternatively or in addition, each sub-pixel may be disposed in a stack with an electrode stack, each of which may have a different thickness relative to electrode stacks of the other sub-pixels. Each pixel may include color altering layers, and may include not more than two such color altering layers.

Arrangements disclosed herein may be incorporated into a wide variety of devices, such as a wearable device, a flat panel display, a computer monitor, a medical monitor, a television, a billboard, a light for interior or exterior illumination, a signal, a color tunable or color temperature tunable lighting source, a heads-up display, a 3D display, a fully transparent display, a flexible display, a laser printer, a telephone, a cell phone, a personal digital assistant (PDA), a laptop computer, a digital camera, a camcorder, a viewfinder, a micro-display, a vehicle, a large area wall, a theater or stadium screen, and a sign.

In an embodiment, a method of fabricating a pixel arrangement is provided, in which a transparent layer is constructed having at least one optical characteristic, such as the optical path length or thickness, or the index of refraction, which is different in different regions of the layer, each of which may correspond to different sub-pixels within the display. The layer may be disposed in the arrangement as part of an electrode stack.

In an embodiment, a pixel arrangement may include multiple sub-pixels, where at least one layer in each sub-pixel has a different thickness than the same layer in each other sub-pixel. The arrangement may include emissive regions of not more than two colors.

In an embodiment, a pixel arrangement including multiple sub-pixels may be fabricated by fabricating a plurality of layers over a substrate, at least one layer in each sub-pixel having a different thickness than the same layer in each of the other sub-pixels.

BRIEF DESCRIPTION OF THE DRAWINGS

FIG. 28A shows an example OLED deposition according to an embodiment. FIG. 28B shows the corresponding pixelated mask, in which the unshaded areas correspond to openings in the mask.

FIG. 29A shows an example sub-pixel emissive material layout according to an embodiment, in which sub-pixels of the same color are grouped together in adjacent pixels on the same row. FIG. 29B shows the corresponding pixelated mask arrangement.

FIG. 36 shows art example arrangement according to an embodiment.

FIG. 37 shows a variation on the arrangement shown in FIG. 36 in which the blue and yellow sub-pixels may be deposited in pairs according to an embodiment.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
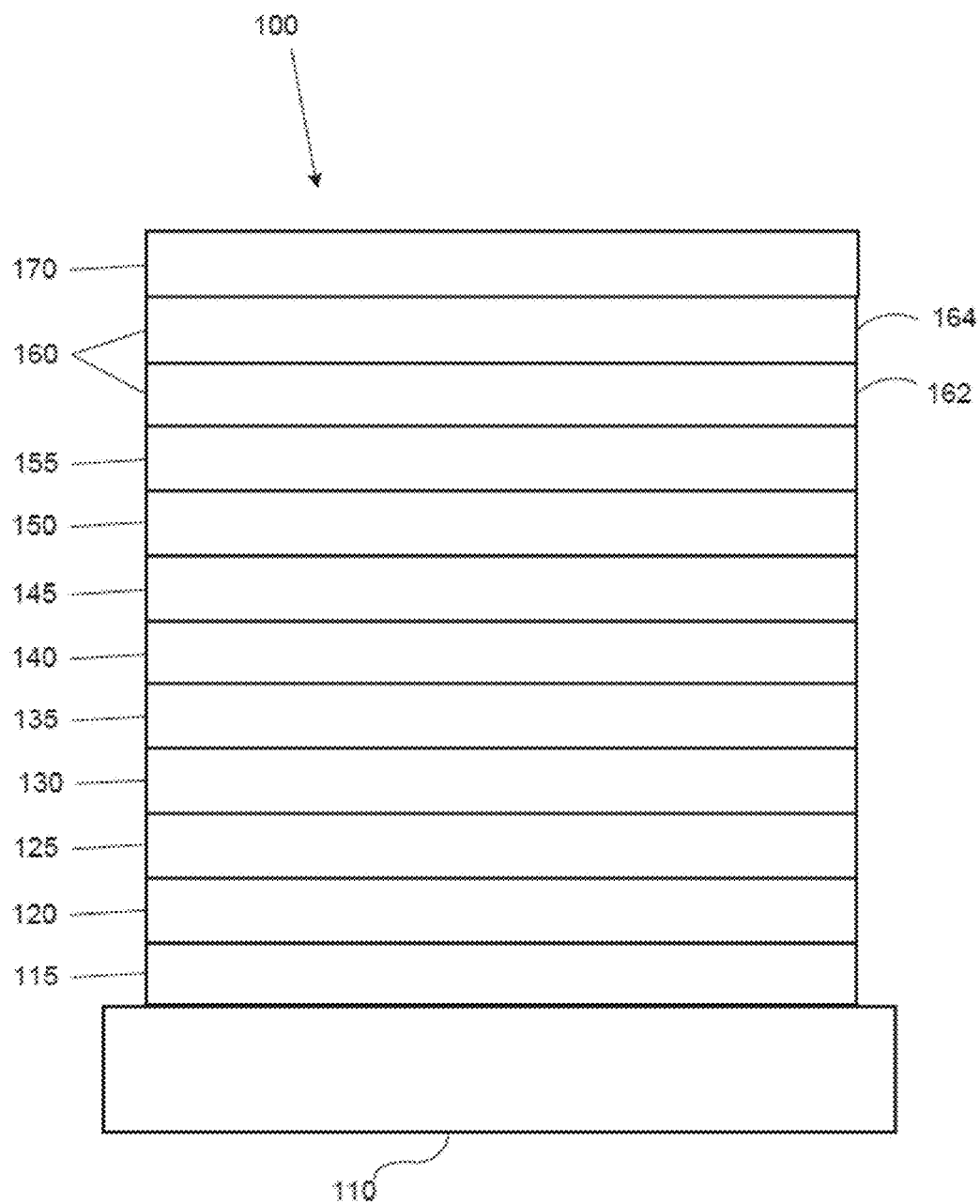
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
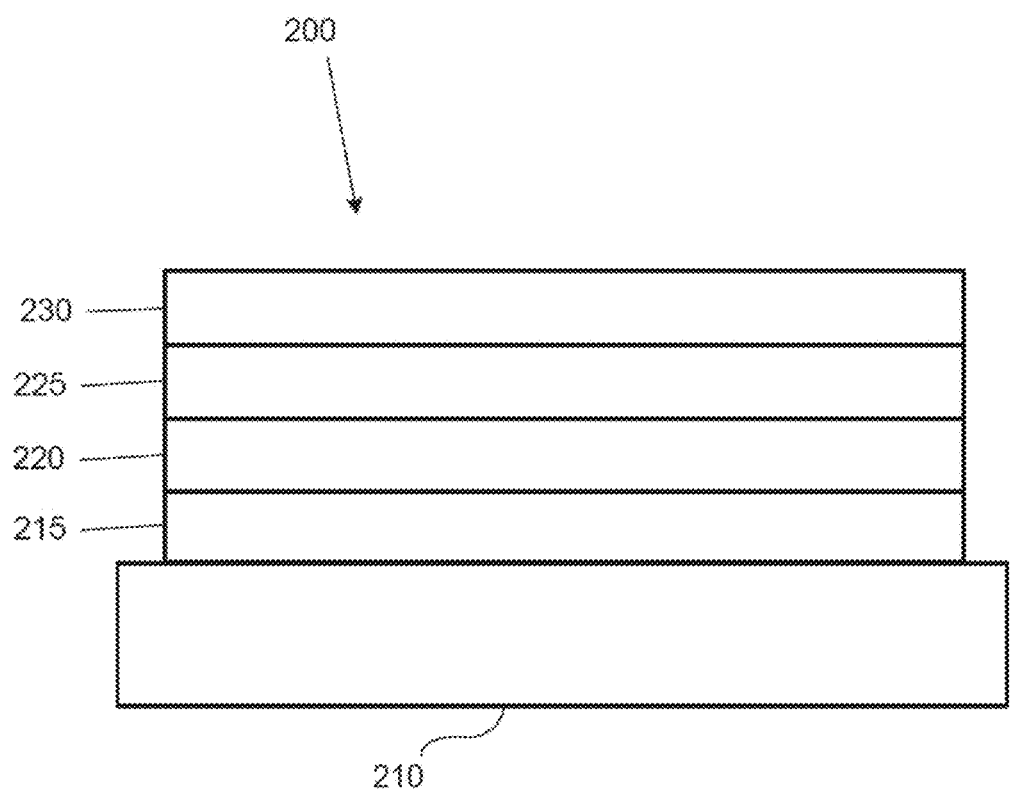
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, color tunable or color temperature tunable lighting sources, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are primarily intended for use in a temperature range comfortable to humans, such as 18 degrees C. to 30 degrees C., and more preferably at room temperature (20-25 degrees C.), but can operate at temperatures outside this range, such as −40 C to +85 C or higher.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Current display architectures and manufacturing capabilities typically do not allow for low power consumption and high resolution OLED displays. For example, side by side (SBS) architecture typically can achieve relatively low power consumption (and therefore good lifetime), but this architecture may require relatively high resolution shadow masking. Such techniques often are limited to around 250 dpi resolution. To achieve higher resolutions, architectures using white devices in conjunction with color filters may be used to avoid patterning the OLED emissive layers. However, such techniques typically suffer from relatively lower efficiency and therefore higher power consumption, which also reduces lifetime. These constraints may be somewhat overcome by employing a RGBW pixel architecture that uses both an unfiltered white sub-pixel and devices that emit at individual colors by employing color filters over other white sub-pixels. This architecture generally is considered to result in poorer image quality, and typically still has a lower power consumption and poorer lifetime than a comparable RGB SBS display.

The present disclosure provides arrangements of pixel components that allow for full-color devices, while using emissive devices that emit not more than two colors, and/or a limited number of color altering layers. Embodiments disclosed herein may provide improved performance over conventional RGBW displays, such as lower power consumption and longer lifetime, with fewer high resolution masking steps, and at a lower resolution, in comparison to a conventional RGB SBS display That is, although an arrangement as disclosed herein may include any number of sub-pixels or other emissive devices or regions, within the arrangement there may be a limited number of colors emitted by emissive devices or regions within the arrangement. As a specific example, an arrangement as disclosed herein may include three sub-pixels. Two of the sub-pixels may include emissive regions, such as OLEDs, that emit light of the same color, with one of the sub-pixels being filtered or otherwise modified to produce a different color after light is emitted by the emissive region. The third sub-pixel may include an emissive region that emits light of a different color than the first emissive regions within the two sub-pixels. Thus, although the sub-pixels overall may produce light of three or more colors, the emissive regions within the arrangement need only initially emit light of two colors. Devices disclosed herein also may be achieved using simplified fabrication techniques compared to conventional SBS arrangements, because fewer masking steps may be required.

In an embodiment, two masking steps may be used. This may provide for simplified fabrication when compared to the three masking steps required for a conventional RGB SBS display. Each mask opening area may be approximately half the pixel area, as opposed to a third in a conventional SBS display. The increased area of the shadow mask opening relative to a conventional SBS display of the same pixel size may allow for higher pixel density. For example, the same size opening will allow for up to about a 50% increase in display resolution compared to a conventional SBS technique. In some configurations, the exact size of the mask openings may be determined based upon lifetime matching considerations, such as to optimize current flow through each sub-pixel and thus improve overall display lifetime.

An increase in fill factor also may also be possible using techniques disclosed herein, particularly for top emitting active matrix OLED (AMOLED) displays, which may allow for higher efficiency relative to a conventional three-mask pixilation approach of the same resolution. This is due to the relatively increased area of the three sub-pixels in a two-mask approach as disclosed, compared to a conventional three-mask approach. With a two-mask approach as disclosed, less current may be required for at least some sub-pixels, to render the same luminance from a display. This may result in higher device efficiency, lower voltage, and/or longer display lifetime.

Figure 3:
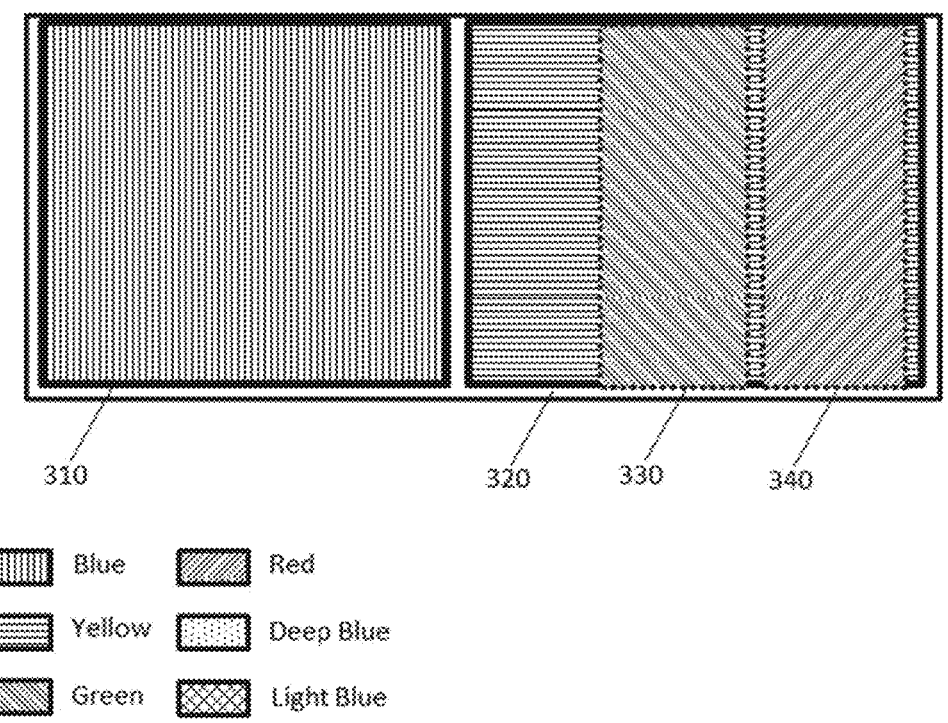
FIG. 3 shows a schematic illustration of an example masking arrangement suitable for fabricating a pixel arrangement as disclosed herein.

FIG. 3 shows a schematic illustration of an example masking arrangement suitable for fabricating a pixel arrangement as disclosed herein. In a first masked deposition, an emissive layer structure, or a stacked device structure including multiple emissive layers, may be deposited in a first region 310. The first region contains one or more emissive layers that emit light of a first color. A second masked deposition may be performed in an adjacent or otherwise nearby region 320, to deposit an emissive layer or stacked structure that emits light of a second color different from the first. Two color altering layers 330, 340, may then be disposed over the second emissive region, such that light passing through each filter may be converted from the second color to third and fourth colors, respectively, each different from the first and second. In some configurations, a portion of the second emissive region may be left uncovered, such that the illustrated arrangement may provide light having four distinct colors. In some configurations, the color altering layers 330, 340 may cover the entirety of the second region, such that the illustrated arrangement provides light of three distinct colors. Although shown as disposed with some distance between them in FIG. 3 for illustration purposes, it will be understood that in general the color filters may be disposed immediately adjacent to one another, such that no yellow light is emitted in the region between the filters. Similarly, each filter may extend to the appropriate edges of the yellow emissive region, such that no yellow light is emitted from the edge immediately adjacent to the color altering layer. Each of the emissive layers or stacked structures may include one or more emissive materials, each of which may be phosphorescent or fluorescent. More generally, each emissive material may include any of the emissive materials, layers, and/or structures disclosed herein.

As a specific example, the first mask deposition 310 may provide a blue device, which may be a single EML structure or a stacked device containing more than one EML. As is known in the art, a stacked device may be desirable to provide extended lifetime and/or reduced image sticking; in other arrangements, a single-layer emissive device may be preferred to reduce fabrication cost and complexity. The blue OLED may be phosphorescent or fluorescent. The second mask deposition 320 may provide a yellow device, which may be made, for example, by combining red and green emitters. More generally, the yellow device may be provided using any suitable combination of emissive materials and/or layers. As specific examples, separate red and green emitters may be provided in one mixed layer; in separate layers within a two-EML device; in a stacked device with a red EML in one OLED within the stack and a green EML in the other; in a yellow device using a single EML containing a yellow emitter; or in a stacked device containing two yellow EMLs. Thus, in some configurations, an emissive region may be provided by multiple emissive materials, each of which has an emission spectrum or peak emission wavelength that differs from the ultimate color of the region as a whole. Various combinations also may be used, though advantageously any selected combination may be deposited using the same second mask arrangement. In the completed example configuration, the blue device is controlled by one anode and associated active matrix control circuit. The yellow device is divided into three sub-pixels, yellow, green and red. Each sub-pixel is then controlled by its own anode and associated active matrix control circuit. The yellow sub-pixel uses the unfiltered yellow light from the yellow OLED. The green sub-pixel is obtained by placing a green color filter over the yellow OLED, and, similarly, a red sub-pixel is obtained by placing a red color filter over the yellow OLED. Thus, the resulting pixel arrangement has four sub-pixels, red, green, blue, and yellow (RGBY). Such an arrangement may be advantageous, because the blue performance may not be limited by a color filter as in a conventional RGBW display, but may have the same optimized lifetime as in a conventional RGB SBS display. Further, in a conventional RGBW arrangement, the green color filter is configured to prevent transmission of as much blue and red light as possible. Thus, a band-pass filter typically is used as the green color filter. In an RGBY arrangement as disclosed herein where yellow light is used as a multi-component light source, the green color filter may be configured to prevent transmission only of red light since the multi-component light does not include a blue component. Thus, a cut-off filter may be used instead of a band-pass filter, which may provide relatively greater efficiency and color saturation.

Embodiments disclosed herein may use unfiltered yellow light to improve display efficiency at times when highly saturated red or green is not required. In operation, the unfiltered yellow device may be used in a similar manner to white in conventional a RGBW display, and similar algorithms may be employed for signal processing. To render a specific unsaturated color, yellow light can be mixed with the three individual primary red, green or blue colors, which may provide higher efficiency than just using the red, green or blue primary colors alone. A full-color display using this technique may have only about a 12% higher power consumption than a conventional SBS RGB arrangement, in contrast to a conventional RGBW arrangement which typically has about a 50% higher power consumption than the SBS RGB arrangement. This level of power reduction may be achieved even if the overall red and green sub-pixel efficiency is reduced by 25%. For example, color filters may reduce the efficiency for the red and green alone by 50%, but the unfiltered yellow sub-pixel may restore much of this loss.

Figure 11:
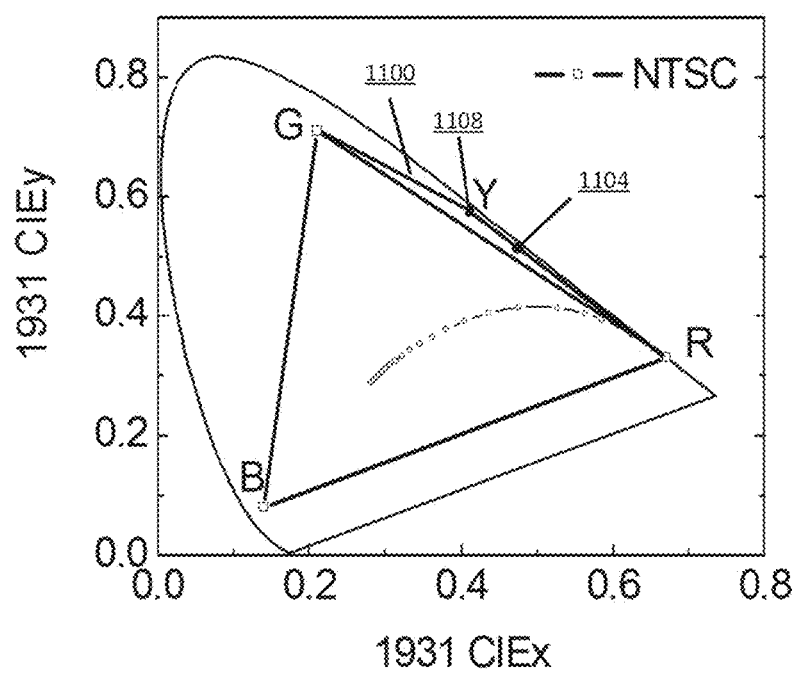
FIG. 11 shows the 1931 CIE diagram that highlights a set of points outside the RG line according to an embodiment disclosed herein.

Embodiments disclosed herein similarly may allow for increased display color range. For example, referring to FIG. 11, a yellow multi-component source may be configured such that it emits light having CIE coordinates that lie on the "RG line" between the identified pure red and green points, such as the illustrated point 1104. In some embodiments, the identified red and green points may correspond to the "pure" colors emitted by emissive regions in the corresponding sub-pixels. Alternatively, the yellow multi-component source may be configured to emit light that lies outside the RG line, such as point 1108, any point along the illustrated curve 1100, or the like. The use of such a multi-component source may increase the available display color gamut, by allowing for use of the CIE region outside the RG line. The increase in color gamut may be achieved or used when the yellow multi-component source is filtered to provide red and/or green light, or it may be used when the yellow source is used unfiltered, according to the various arrangements disclosed herein. Thus, in some configurations, it may be desirable for the yellow multi-component source to have CIE coordinates that lie outside the RG line on the 1931 CIE diagram.

Figure 4:
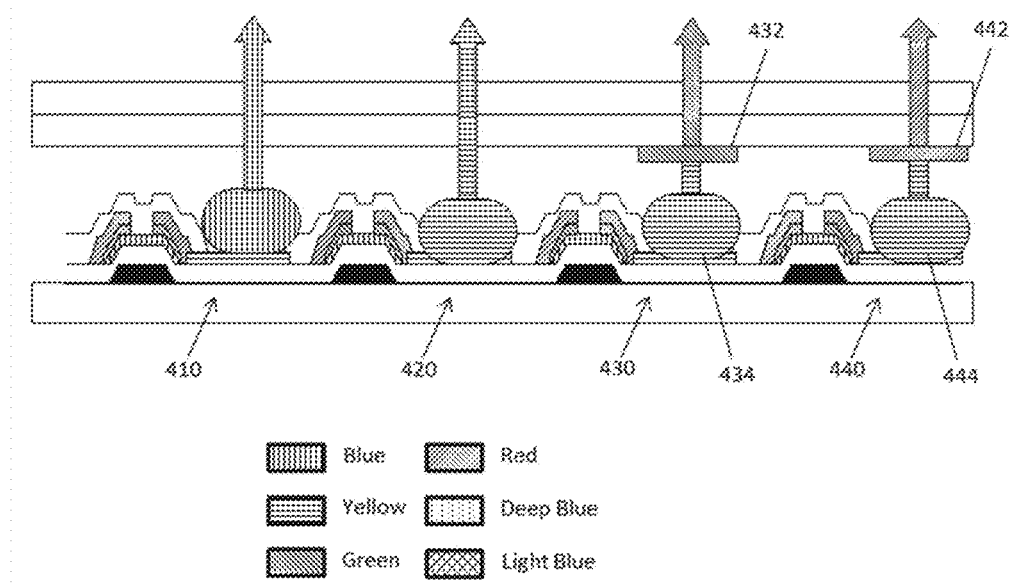
FIG. 4 shows a schematic illustration of a pixel arrangement according to an embodiment disclosed herein.

FIG. 4 shows a schematic illustration of a pixel arrangement according to an embodiment disclosed herein. As described with respect to FIG. 3, the arrangement includes four sub-pixels 410, 420, 430, 440. One sub-pixel 410 includes one or more emissive devices or regions that emit light of a first color. The other sub-pixels 420, 430, 440 are constructed using emissive regions that emit light of a second color. A color altering layer 432, 442 may be disposed over each of two of the emissive regions 434, 444. The third sub-pixel 420 is left unfiltered, resulting in a pixel arrangement that has four sub-pixels, each providing light of a different color.

Figure 15:
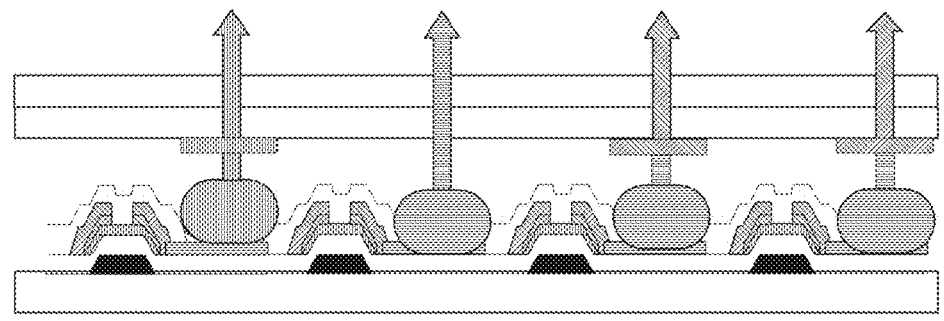
FIG. 15 shows a schematic illustration of a pixel arrangement including a blue color change layer disposed over a blue emissive region according to an embodiment disclosed herein.

In some configurations, additional color altering layers may be used. For example, a blue color altering layer may be disposed over the blue emissive region 410 to modify the spectral output resulting at the blue sub-pixel. An example of such a configuration is shown in FIG. 15, in which a blue color altering layer is disposed over the blue emissive region, while the other emissive regions and color altering layers are the same as shown in FIG. 4. Although shown generally as a blue color altering layer and a blue emissive region for clarity, the blue color altering layer may be a light blue or deep blue color altering layer. Similarly, the blue emissive region may be a deep blue or light blue emissive region.

As described with respect to FIG. 3, each sub-pixel may be controlled by an associated control circuit. Example control circuits are shown in FIG. 4 for purposes of illustration, with various control elements shaded to match the controlled emissive regions. The specific arrangement of control circuitry is provided by way of example only, and any suitable control circuitry may be used as will be readily apparent to one of skill in the art.

In general parlance in the art, a "sub-pixel" may refer to the emissive region, which may be a single-layer EML, a stacked device, or the like, in conjunction with any color altering layer that is used to modify the color emitted by the emissive region. For example, the sub-pixel 430 includes an emissive region 434 and a color altering layer 432. As used herein, the "emissive region" of a sub-pixel refers to any and all emissive layers, regions, and devices that are used initially to generate light for the sub-pixel. A sub-pixel also may include additional layers disposed in a stack with the emissive region that affect the color ultimately produced by the sub-pixel, such as color altering layers disclosed herein, though such color altering layers typically are not considered "emissive layers" as disclosed herein. An unfiltered sub-pixel is one that excludes a color modifying component such as a color altering layer, but may include one or more emissive regions, layers, or devices.

In some configurations, an "emissive region" may include emissive materials that emit light of multiple colors. For example, a yellow emissive region may include multiple materials that emit red and green light when each material is used in an OLED device alone. When used in a yellow device, the individual materials typically are not arranged such that they can be individually activated or addressed. That is, the "yellow" OLED stack containing the materials cannot be driven to produce red, green, or yellow light; rather, the stack can be driven as a whole to produce yellow light. Such an emissive region may be referred to as a yellow emissive region even though, at the level of individual emitters, the stack does not directly produce yellow light. As described in further detail below, the individual emissive materials used in an emissive region (if more than one), may be placed in the same emissive layer within the device, or in multiple emissive layers within an OLED device comprising an emissive region. As described in further detail below, embodiments disclosed herein may allow for OLED devices such as displays that include a limited number of colors of emissive regions, while including more colors of sub-pixels or other OLED devices than the number of colors of emissive regions. For example, a device as disclosed herein may include only blue and yellow emissive regions. Additional colors of sub-pixels may be achieved by the use of color altering layers disposed in a stack with yellow or blue emissive regions. In some cases, the general color provided by a sub-pixel may be the same as the color provided by the emissive region in the stack that defines the sub-pixel, such as where a deep blue color altering layer is disposed in a stack with a light blue emissive region to produce a deep blue sub-pixel. Similarly, the color provided by a sub-pixel may be different than the color provided by an emissive region in the stack that defines the sub-pixel, such as where a green color altering layer is disposed in a stack with a yellow emissive region to product a green sub-pixel.

In some configurations, emissive regions and/or emissive layers may span multiple sub-pixels, such as where additional layers and circuitry are fabricated to allow portions of an emissive region or layer to be separately addressable.

An emissive region as disclosed herein may be distinguished from an emissive "layer" as typically referred to in the art and as used herein. In some cases, a single emissive region may include multiple layers, such as where a yellow emissive region is fabricated by sequentially red and green emissive layers to form the yellow emissive region. As previously described, when such layers occur in an emissive region as disclosed herein, the layers are not individually addressable within a single emissive stack; rather, the layers are activated or driven concurrently to produce the desired color of light for the emissive region. In other configurations, an emissive region may include a single emissive layer of a single color, or multiple emissive layers of the same color, in which case the color of such an emissive layer will be the same as, or in the same region of the spectrum as, the color of the emissive region in which the emissive layer is disposed.

Figure 5:
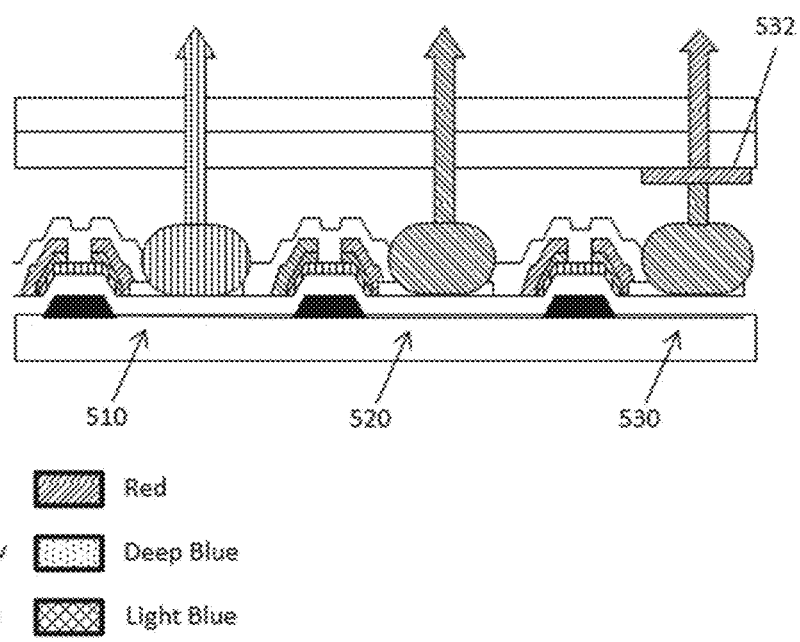
FIG. 5 shows a schematic illustration of a pixel arrangement according to an embodiment disclosed herein.

In some configurations, fewer sub-pixels may be used to achieve a full-color device or pixel arrangement. FIG. 5 shows an example arrangement that uses three sub-pixels 510, 520, 530. Similarly to the example shown in FIG. 4, a first sub-pixel 510 may be created by depositing one or more emissive regions through a mask, in a single emissive layer or a stacked arrangement, and leaving the resulting sub-pixel unfiltered. The other two sub-pixels 520, 530, may be deposited during a single masked deposition. As previously described, each may include one or more emissive materials and/or layers, and may be individual emissive layers or stacked devices. A color altering layer 532 may then be disposed over one or more of the emissive regions, to result in a full-color arrangement having three sub-pixels of different colors.

As a specific example, the two masking steps may be blue and green. That is, in a first masked deposition technique, a blue layer or stack may be deposited in a region corresponding to the first sub-pixel 510. Green layers or stacked devices may be deposited in regions corresponding to the second and third sub-pixels 520, 530 in a second masked deposition. The green sub-pixel 520 provides unfiltered green light. The red sub-pixel 530 uses a color altering layer 532, such as a green-to-red color changing layer having a relatively high conversion efficiency, to convert the green light emitted by the green device 530 to red light. Such a configuration may result in a display that with up to 50% higher resolution than a comparable conventional RGB SBS display, with little or no increase in power consumption or associated decrease in lifetime. Such an approach also may improve the display efficiency by not "losing" as much light due to use of a conventional color filter, instead using a color changing layer to provide the third color.

Figure 16:
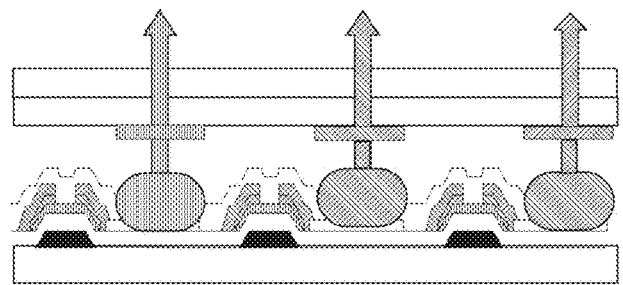
FIG. 16 shows a schematic illustration of a pixel arrangement including a blue color change layer disposed over a blue emissive region according to an embodiment disclosed herein.

As another example, a blue color altering layer may be disposed over the blue emissive region as previously described. Such a configuration is shown in FIG. 16. As previously described, the blue color altering layer may be a light blue or deep blue color altering layer, and the blue emissive region may be a deep blue or light blue emissive region.

Figure 6:
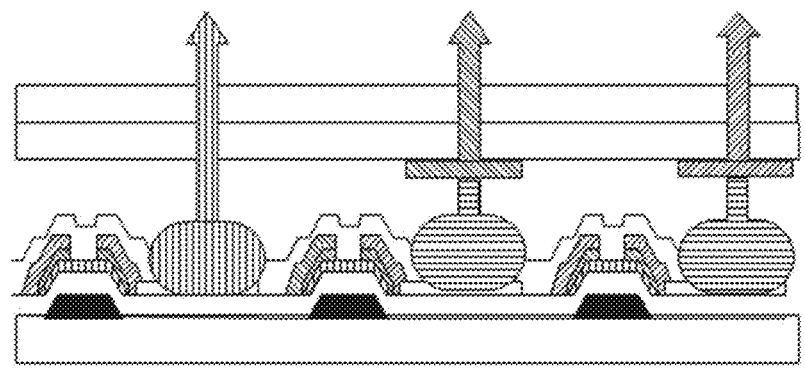
FIG. 6 shows a schematic illustration of a pixel arrangement according to an embodiment disclosed herein.
Figure 6:
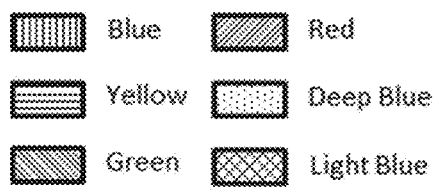

FIG. 6 shows a schematic illustration of a configuration in which the two masking steps are blue and yellow, i.e., one or more blue emissive layers are deposited during one masked deposition, and one or more yellow emissive layers are deposited during another. As with FIG. 6, the illustrated configuration uses only three sub-pixels, red, green, and blue. In this example, the green sub-pixel uses a green color filter to convert light from the yellow OLED to green, the red sub-pixel uses a red color filter to convert light from the yellow OLED to red, and the blue sub-pixel uses unfiltered light from the blue OLED. Similar configurations may use color altering layers other than or in addition to the specific color fitters shown.

Figure 17:
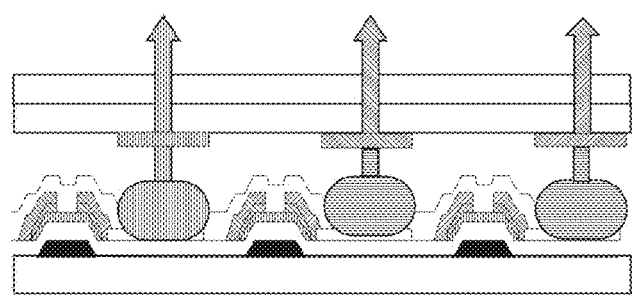
FIG. 17 shows a schematic illustration of a pixel arrangement including a blue color change layer disposed over a blue emissive region according to an embodiment disclosed herein.
Figure 17:

As another example, a blue color altering layer may be disposed over the blue emissive region as previously described. Such a configuration is shown in FIG. 17. As previously described, the blue color altering layer may be a light blue or deep blue color altering layer, and the blue emissive region may be a deep blue or light blue emissive region.

In some configurations, the efficiency of one or more sub-pixels may be enhanced by using a color changing layer instead of, or in addition to, a conventional color filter as a color altering layer as disclosed herein. For example, referring to the example shown in FIG. 6, a red color changing layer with a relatively high conversion efficiency from yellow to red may be placed between the yellow OLED and red color filter. Such a configuration may enhance the red sub-pixel efficiency. More generally, the use of a color changing layer disposed in a stack with an OLED, or an OLED and a color filter, may enhance the efficiency of that sub-pixel.

Figure 7:
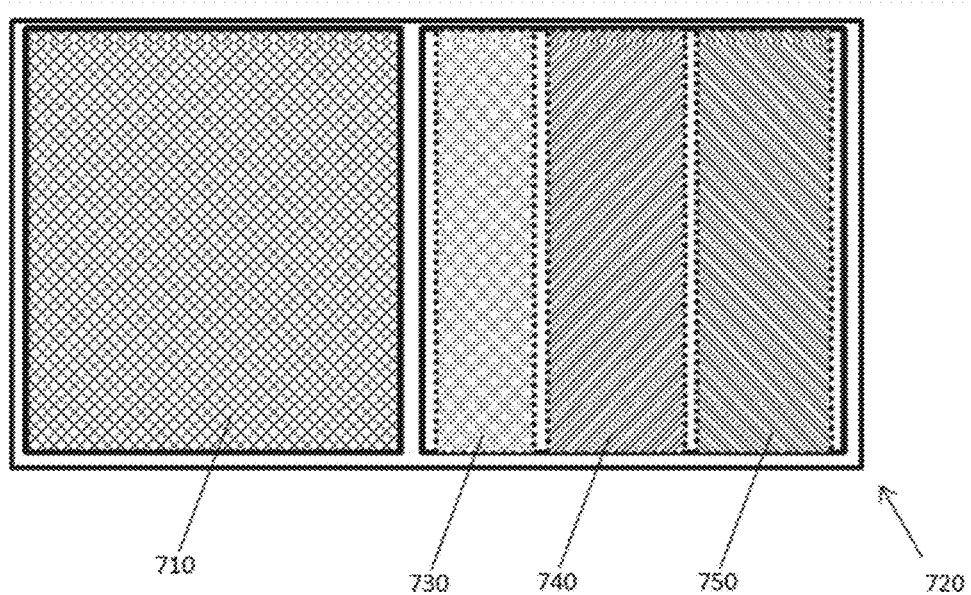
FIG. 7 shows a schematic illustration of an example masking arrangement suitable for fabricating a pixel arrangement as disclosed herein.

Other configurations disclosed herein may use additional color altering layers, and may include color altering layers disposed over multiple emissive regions or types of emissive region. FIG. 7 shows an example masking arrangement that uses emissive regions of two colors, light blue 710 and white 720. The masked areas may be used to deposit emissive regions of each color as previously disclosed. Various color altering layers also may be disposed over the resulting emissive regions to create a full-color pixel arrangement. In the example shown in FIG. 7, a deep blue color filter 730, a red color filter 740, and a green color filter 750 are disposed over corresponding white emissive regions, to form three sub-pixels of those colors, while the light blue emissive region remains unfiltered to form a light blue sub-pixel. Such a configuration may be used to enhance overall blue lifetime by using the light blue and deep blue sub-pixels as needed, as described in U.S. Patent Publication No. 2010/0090620, the disclosure of which is incorporated by reference in its entirety. As previously described, other color altering layers may be used in addition to or instead of the specific color filters described with respect to FIG. 7.

Figure 8:
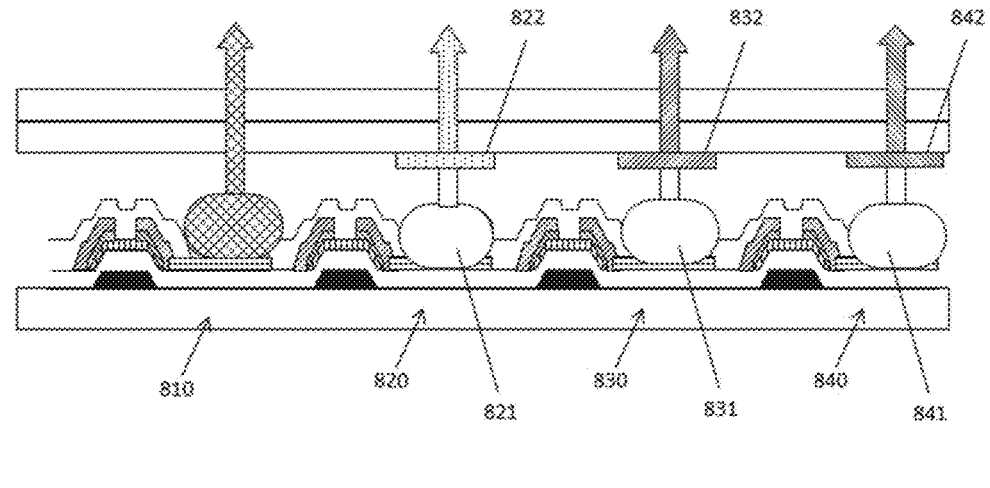
FIG. 8 shows a schematic illustration of a pixel arrangement according to an embodiment disclosed herein.

FIG. 8 shows an example pixel arrangement corresponding to the deposition arrangement shown in FIG. 7. Similarly to the arrangement shown in FIG. 4, the arrangement of FIG. 7 includes an unfiltered sub-pixel 810, and three sub-pixels 820, 830, 840 each of which is formed from an emissive region 821, 831, 841 and a color filter 822, 832, 842, respectively. In the example shown in FIG. 7, the unfiltered sub-pixel 810 is a light blue sub-pixel, and the color filters 822, 832, 842 are deep blue, red, and green, respectively. The specific emission colors and color filters shown are illustrative only, and various other colors, color altering layers, and combinations may be used without departing from the scope of embodiments disclosed herein.

Figure 9:
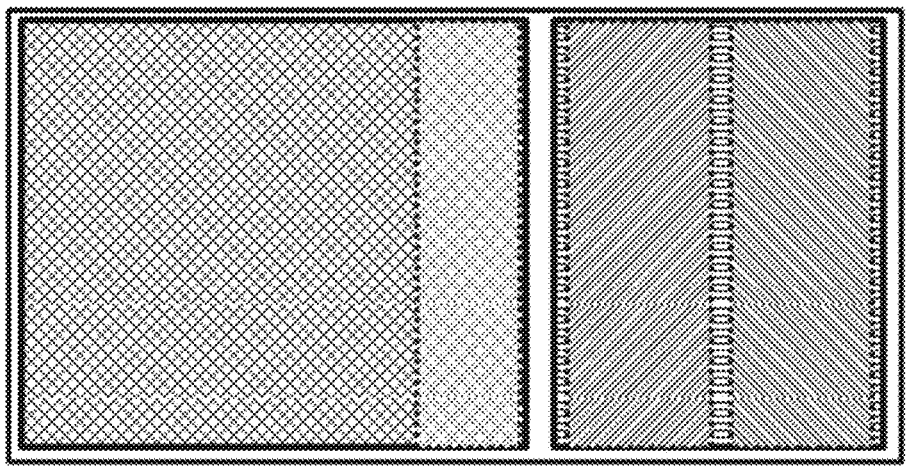
FIG. 9 shows a schematic illustration of an example masking arrangement suitable for fabricating a pixel arrangement as disclosed herein.
Figure 9:
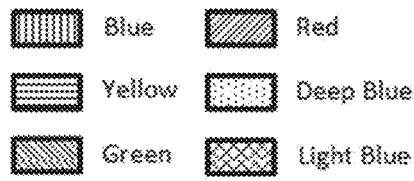

In an embodiment, each emissive region deposited during each of two masked deposition operations may be combined with a color altering layer to form one or more pixels. FIG. 9 shows an example arrangement in which each type of emissive region is combined with one or more color altering layers to create multiple sub-pixels. For example, the two masked regions may correspond to a light blue emissive region 910 and a yellow emissive region 920, each of which may be deposited in one of two masking steps as previously described. A deep blue color altering layer 930 may be combined with a light blue emissive region 910 to form a deep blue sub-pixel. Red and green color altering layers 930, 940, respectively, each may be combined with a portion of a yellow emissive region to form red and green sub-pixels. A light blue emissive region also may be left unfiltered to form a light blue sub-pixel. As described with respect to FIG. 7, use of the light and deep blue sub-pixels may improve performance and device lifetime. In addition, the relatively long light blue lifetime can extend overall display operation and provide improved power efficiency, since the light blue sub-pixel is unfiltered.

Figure 10:
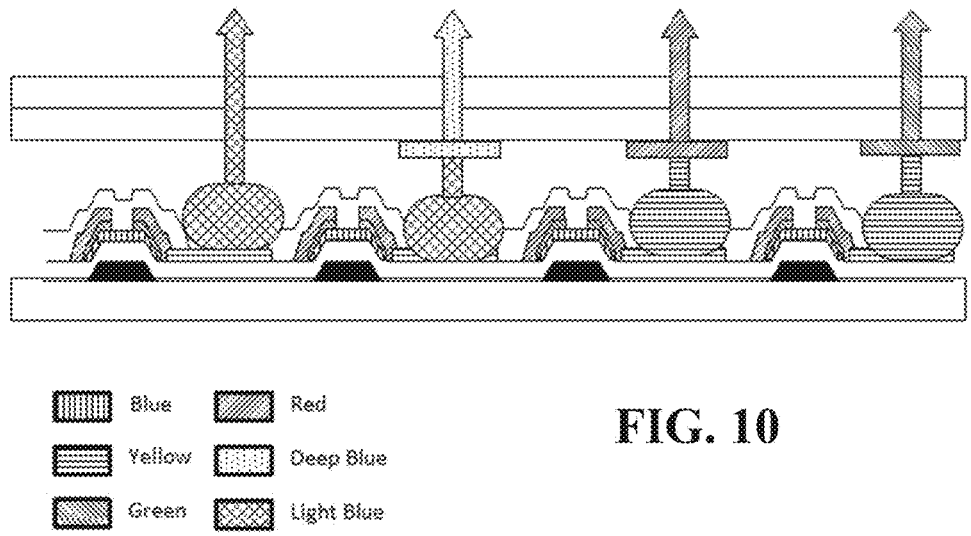
FIG. 10 shows a schematic illustration of a pixel arrangement according to an embodiment disclosed herein.

FIG. 10 shows a pixel arrangement corresponding to the mask and color altering layer arrangement described with respect to FIG. 9. As shown, four sub-pixels are created from two emissive regions of a first color, one of which is unfiltered, and two emissive regions of a second color. Following the example of FIG. 9, a light blue sub-pixel is formed from an unfiltered light blue emissive region, a deep blue sub-pixel is formed from a light blue emissive region and a deep blue color altering layer, a red sub-pixel is formed from a yellow emissive region and a red color altering layer, and a green sub-pixel is formed from a yellow emissive region and a green color altering layer. The specific emission colors and color altering layers shown are illustrative only, and various other colors, color altering layers, and combinations may be used without departing from the scope of embodiments disclosed herein.

Various techniques may be used to fabricate the arrangements disclosed herein. In general, it may be desirable for the optical cavity (i.e., the optimized layer thicknesses in terms of optics from the device, which does not require or refer specifically to a microcavity) for each color to be tuned for that color. However, such a restriction may require each sub-pixel stack to have a different optical path length, adding complexity to the manufacturing process.

Figure 21A:
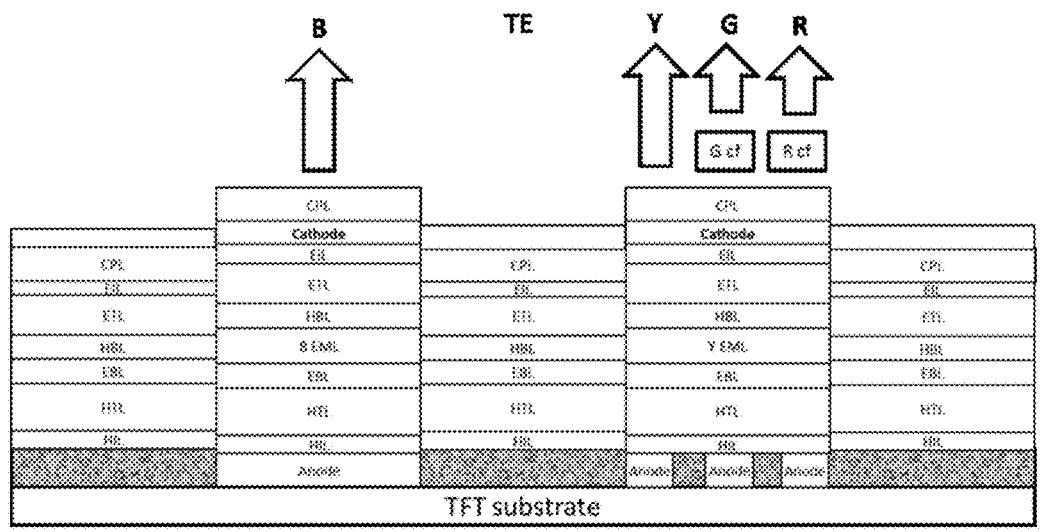
FIGS. 21A and 21B show top-emission (TE) and bottom-emission (BE) configurations to achieve an arrangement as disclosed herein, respectively.
Figure 21B:
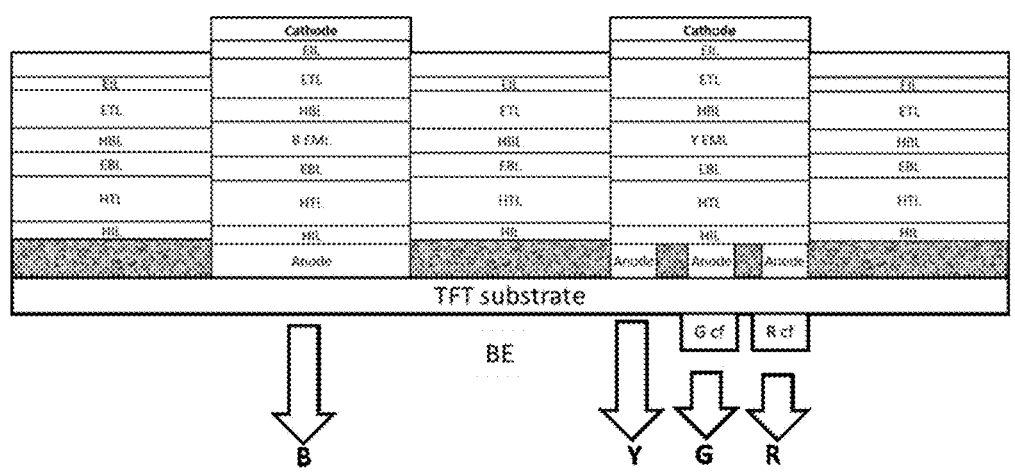

For example, FIGS. 21A and 21B show top-emission (TE) and bottom-emission (BE) configurations to achieve an arrangement as disclosed herein, such as shown, for example, in FIG. 15. In this arrangement, the transport layers are a common thickness across all sub-pixels. For a top-emission device, the capping layer (CPL) also may be common to all sub-pixels. The fabrication of an arrangement as shown in FIGS. 21A and 21B may require the use of only two high-resolution masks to deposit blue and yellow emissive layers, respectively. As described in further detail, the various regions of blue and yellow emissive layers may be used as separate emissive regions in separate sub-pixels, which may be the same or different colors. That is, OLED emissive material deposited during a single deposition step may be used to create multiple sub-pixels, and multiple colors of sub-pixels, as disclosed herein.

Figure 22A:
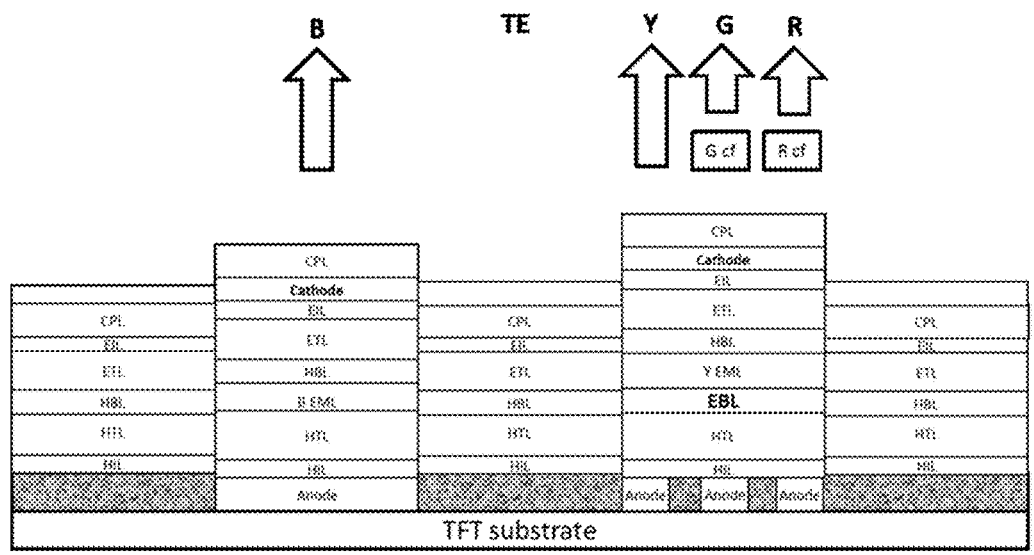
FIGS. 22A and 22B show top- and bottom-emission devices, respectively, in which an additional masking step is used to deposit an additional thickness of hole transport (HTL) or electron blocking layer (EBL) according to an embodiment.
Figure 22B:
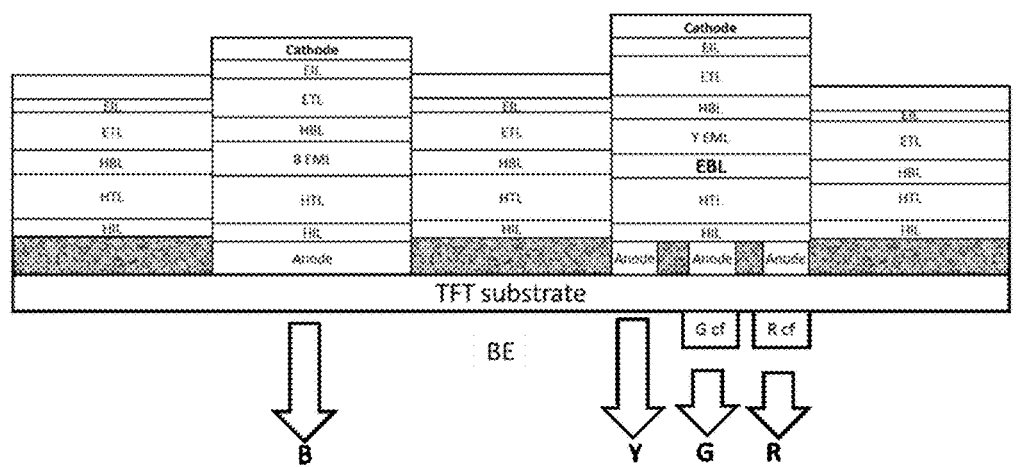

As another example, FIGS. 22A and 22B show top- and bottom-emission devices in which an additional masking step is used to deposit an additional thickness of material, such as hole transport layer (HTL) material, electron blocking layer (EBL) material, hole injection layer (HIL) material, or the like, between the common HTL and yellow emissive layer (EML). Such a configuration may increase the external efficiency of the yellow emissive layer and/or associated sub-pixels. Alternatively or in addition, the additional masking step may be used to deposit additional ETL and/or HBL material between the yellow EML and the common electron transport layer (ETL). As described in further detail below, the use of such additional material may be used to configure a sub-pixel to have an optical path length that is particularly suited to the color of light emitted by the sub-pixel. Additional masking steps may be used for the green and red sub-pixels.

Figure 23A:
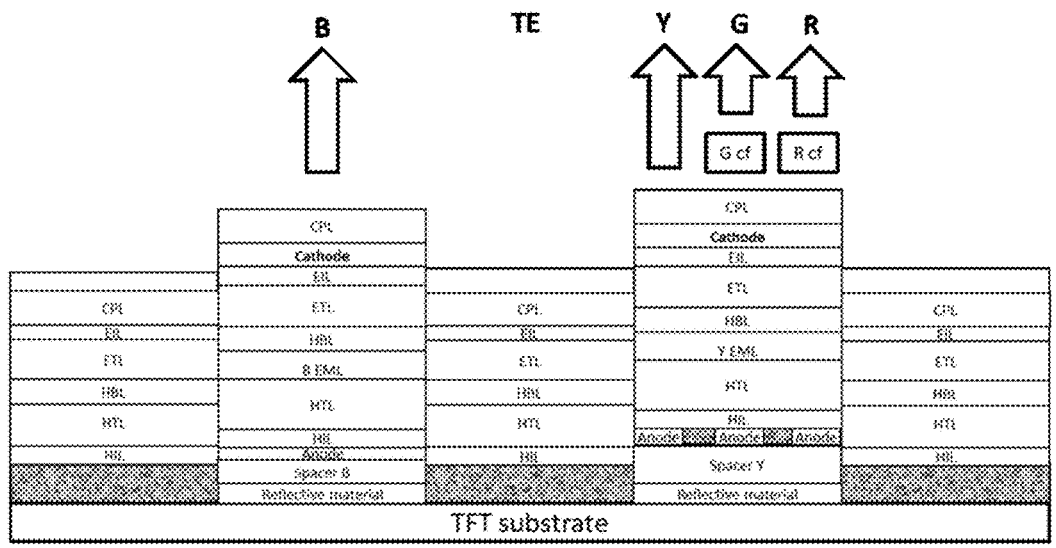
FIGS. 23A and 23B show top- and bottom-emission devices, a configuration in which the anodes may be patterned separately to individually optimize emission from each sub-pixel according to an embodiment.
Figure 23B:
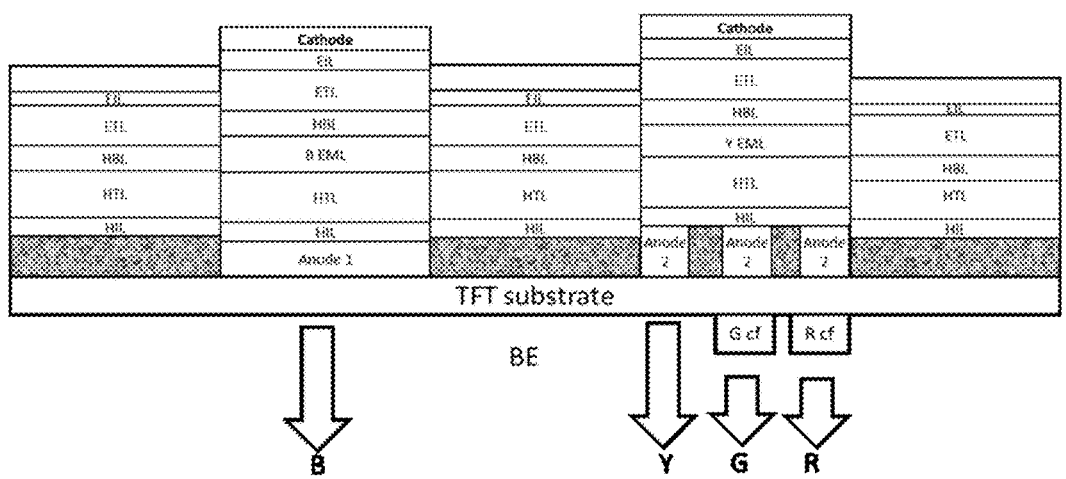

As another example, FIGS. 23A and 23B show a configuration in which the anodes may be patterned separately to individually optimize emission from each sub-pixel. As specific examples, two anodes may be used for the yellow and blue sub-pixels; or three anodes may be used for yellow, blue, and red or green sub-pixels; or four anodes may be used for the yellow, blue, red, and green sub-pixels. Such configurations may increase the efficiencies, lifetimes, and color of each associated sub-pixel. For a bottom-emission device, these configurations may be achieved by having a thicker TCO. For a top-emitting architecture, metal reflector spacer and/or TCO anodes may be used. In this case the reflector spacer length is part of the pixel optical cavity, so separately patterning the spacer between the TCO and the reflector metal may allow the optical cavity to be tuned to a desired color for each sub-pixel.

It will be understood that a variety of layers are shown in FIGS. 21-23 for illustration purposes, but that not all layers shown are required, other layers may be used, and other arrangements of layers may be used other than as specifically indicated with respect to each example.

As previously indicated, in some embodiments it may be advantageous for different sub-pixels to be "tuned" to a particular color or range of colors based upon the optical cavity, which may or may not be a microcavity, associated with the sub-pixel. In some embodiments, the optical path length may be different between sub-pixels within a pixel. Various techniques may be used to achieve different optical path lengths, i.e., different optical thicknesses, such that each display color (e.g., red, green, blue and yellow) can have a specific optical thickness that may improve or optimize the resulting color and efficiency. In some embodiments, these approaches are independent of, or do not negatively affect, the patterning requirements for the emissive layers or the resolution required for the masked deposition techniques disclosed herein, and thus may avoid the undesirable complexities that conventional deposition techniques may impose. Embodiments disclosed herein also may be used, for example, to optimize the cavity of a top emission architecture in which only common-thickness organic layers are used outside the emissive layer or layers, such as where the emissive layer is to be patterned by OVJP.

In some embodiments, various layers for individual sub-pixels can be produced using the same mask and/or printing technique that is used to deposit the emissive layer. For example, assuming the same resonant node for each sub-pixel, the blue optical stack will be the thinnest, followed by green, yellow and red in order of increasing thickness. The blue sub-pixel can be tuned optically by using the same mask and/or printing technique to pattern the HTL for the blue sub-pixel as is used to deposit the blue emissive layer. A similar approach can be used for other sub-pixels, such as a green sub-pixel formed from a yellow OLED deposition as disclosed herein. In such a configuration, additional optical thickness may be added to optimize yellow and red sub-pixels. That is, the yellow sub-pixel thickness may be optimized for the green sub-pixel, and additional cavity modifications may be made to optimize the yellow and red sub-pixels. More generally, a single mask and/or deposition technique may be used to pattern one or more layers within a sub-pixel, to obtain an optical path length specific to and/or optimized for the sub-pixel, while allowing for different optical path lengths for other sub-pixels within a pixel arrangement.

Figure 57:
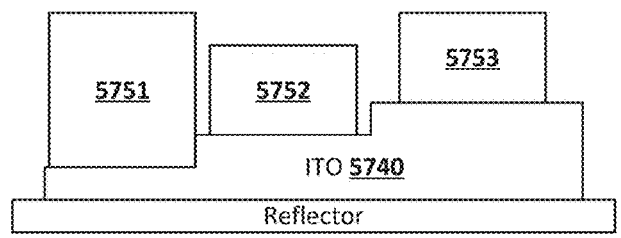
FIG. 57 shows a schematic representation of an electrode stack for a plurality of sub-pixels according to an embodiment.

In an embodiment, different optical path lengths for each sub-pixel may be formed by patterning an electrode, such as the anode, so that the region of the electrode under each organic stack of the sub-pixel has a different thickness. FIG. 57 shows an example of such a configuration. In the example, the electrode material 5740 under each OLED organic stack 5751, 5752, 5753 may be of different thicknesses. The electrode material or materials disposed in a stack with a particular OLED stack or sub-pixel may be referred to as an electrode stack. For example, the electrode stack under OLED stack 5751 is thinner than the electrode stack under OLED stacks 5752 and 5753. In the example shown in FIG. 57, the organic stacks 5752 and 5753 have the same thickness, resulting in different total thicknesses for the corresponding sub-pixels. In contrast, organic stacks 5751 and 5753 have different thicknesses, but the corresponding sub-pixels have the same or about the same thickness. Different relative thicknesses may result from different manufacturing processes. For example, if the electrode 5740 is patterned and common transport layers are used across the sub-pixels, the organic stacks may be approximately the same thickness. More generally, each sub-pixel may have the same or different thickness than other sub-pixels, and/or each organic stack may have the same or different thickness than other organic stacks. The thicknesses of organic layers within each sub-pixel also may be the same or different, for example, depending upon the different fabrication techniques used to fabricate the various layers. In some embodiments, the total thickness of organic layers within some or all of the sub-pixels in a pixel may be the same. In general, two layers or stacks may be considered to have the same thickness, and/or two optical path lengths may be considered to be the same, if one is within 3%, 2%, or 1% of the other. For example, if a first organic stack has an optical path length that is not more than 3% higher or lower than a second organic stack, then the first and second stacks are considered to have the same optical path length. Alternatively or in addition, some or all of the same types of organic layers within each sub-pixel may be the same as in some or all of the other sub-pixels, as illustrated throughout the present disclosure. For example, the thickness of one or more transport, blocking, injection, and/or emissive layers may be the same in one or more sub-pixels within a pixel.

A structure such as shown in FIG. 57 may be fabricated, for example, using repeated depositions of electrode and/or other materials, photoresist, etching, and/or lift off processes to produce separate optical path lengths for individual sub-pixels. In general, an electrode may be patterned so that a transparent layer, such as a transparent conductive oxide layer, has a different optical thickness, thus providing a different optical thickness and path length between the electrode pad and a reflector as shown in FIG. 57.

Fabrication of structures to provide different optical path lengths and thereby enhance light output from different sub-pixels can be accomplished by using semiconductor fabrication processes such as lift off, deposition and etching. These processes may be performed as part of the backplane fabrication process, before deposition of the organic layers. The optical path length may be modified by depositing a transparent layer between the reflector and the organic layers, and adjusting the thickness of the transparent layer for the emission wavelength of the sub-pixel. Alternatively or in addition, the composition of the transparent layer may be modified, for example to modify the refractive index of the material by changing the ratio of the constituents. As a specific example, in a $Si_xN_y$ film, the ratio of Si to N in the film may be selected to achieve a desired index of refraction of the film. Such arrangements may be achieved by combinations of deposition and wet etch, deposition and dry etch and lift-off deposition. In general, each technique also may make use of a patterned photoresist to define the individual sub-pixel cavities.

Figure 58:
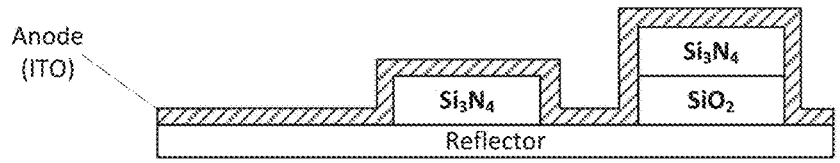
FIG. 58 shows a schematic representation of an electrode stack for a plurality of sub-pixels according to an embodiment.

In deposition and etching techniques, one or more layers of material are disposed between a reflective layer and an electrode, to change the thickness of the electrode stack in different regions of the electrode. For example, layers of silicon dioxide and silicon nitride may be fabricated on top of a metal reflector layer, under an ITO anode. The etch chemistries are chosen to have good selectivity between silicon dioxide and silicon nitride, so that the underlying layer can be used as an etch stop. As described in further detail, both dry etches and wet etches can be used to obtain the desired optical path length. FIG. 58 shows a schematic representation of a group of sub-pixels and a cross section of the cavity layers beneath the pixels. In the example structure, silicon dioxide may be deposited and patterned first, followed by silicon nitride. The silicon dioxide layer then forms an etch stop for the silicon nitride etch. The thickness of the silicon dioxide and silicon nitride may be chosen to provide the correct optical path length for the individual sub-pixels, such as green and red sub-pixels. Thus, the example shown in FIG. 58 shows regions having three different optical path lengths: one where there is no oxide or nitride film over the reflector, one in which there is only a nitride film over the reflector, and one in which there is both an oxide film and a nitride film over the reflector.

As a specific example, a structure as shown in FIG. 58 may be fabricated by blanket depositing $SiO_2$ over a substrate and/or reflector layer. A photoresist is than patterned over the $SiO_2$ layer and the $SiO_2$ layer etched using, for example, buffered HF (wet etch) or $NF_3$ (dry etch), after which the photoresist is removed. Similarly, a blanked layer of $Si_3N_4$ is deposited over the $SiO_2$ layer and the reflector layer, followed by a layer of photoresist. The $Si_3N_4$ is then etched using, for example, using $H_3PO_4:H_2ONF3/O2/N_2$ (wet etch) or $NF_3/O_2/N_2$ (dry etch). The photoresist is then removed, and a blanket layer of ITO or other electrode material, shown with hash marks, may be deposited over the remaining layers.

Figure 59:
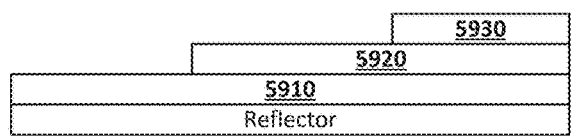
FIG. 59 shows a schematic representation of an electrode stack for a plurality of sub-pixels according to an embodiment.
Figure 60:
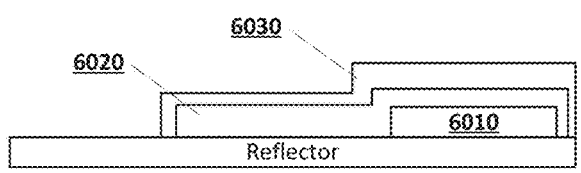
FIG. 60 shows a schematic representation of an electrode stack for a plurality of sub-pixels according to an embodiment.

FIG. 59 shows another example structure according to an embodiment. A structure such as shown in FIG. 59 may be fabricated, for example, by repeatedly depositing a blanket layers of ITO, patterning a layer of photoresist, depositing the next layer of ITO, and performing a lift off technique to remove a portion of the prior ITO layer. For example, ITO layers 5910, 5920, 5930 may be deposited in order, using intervening photoresist and liftoff techniques between sequential ITO layers. Similar structures, such as shown in FIG. 60, may be obtained by using the same general process with different masks for the photoresist layers. For example, ITO layers 6010, 6020, 6030 may be deposited in order, using intervening photoresist and liftoff techniques between sequential ITO layers.

In some embodiments, a common anode structure may be used for multiple sub-pixels and a deposition technique such as OVJP may be used to pattern different optical lengths for different sub-pixels. For example, different HTL thicknesses may be used for different colors of sub-pixels, such as for the yellow and red sub-pixels in a four-color display as disclosed herein. Alternatively or in addition, OVJP can be used to deposit the thicker HTL material in a 'mask-less' process. The concern over 'spill over' from OVJP is a minor issue when considering using OVJP to deposit non-emissive regions such as the HTL. In contrast to other conventional uses of OVJP, in embodiment disclosed herein, spill-over into neighboring sub-pixels from OVJP likely has little or minor effect on the neighboring sub-pixel performance. If the HTL is deposited by OVJP in multiple different thicknesses for different sub-pixels, impurity issues commonly associated with OVJP deposition may be mitigated by depositing a common EBL, HBL, or similar layer on the HTL to prevent contact of the EML interface with the OVJP layer. The common layer also may increase the efficiency of separate types of sub-pixels, such as increasing the external efficiency of yellow and red sub-pixels. Alternatively, a high resolution mask step could add additional ETL, HBL or other material between one or more emissive layers and a common ETL or other common layer. If the ETL is deposited by OVJP in multiple different thicknesses any impurity issues associated with OVJP deposition can be mitigated by depositing a common HBL on the EML. This prevents contact of the EML interface with the OVJP layer. OVJP techniques as disclosed herein may allow for the fabrication of devices such as top emission OLED devices of different colors, where OVJP is used to selectively deposit the emissive layers. This may allow for all common transport layers to be employed, thus allowing for each OLED sub-pixel color to have an optimized optical stack.

Using the techniques disclosed herein, a full-color pixel arrangement for use in a device such as an OLED display may be fabricated in which each pixel includes emissive regions of not more than two colors, disposed laterally adjacent to one another over a substrate. As used herein, "laterally adjacent" refers to sub-pixels or regions that are not disposed in a stack with one another, but may be of different thicknesses and/or disposed at different points within OLED stacks that are adjacent to one another relative to a substrate. For example, two adjacent sub-pixels may both include emissive regions of the same color. Each emissive region may be a different thickness, and may not be aligned perfectly or at all with each other in a direction parallel to the substrate. Such regions are considered laterally adjacent to one another because they are not in a common OLED stack, and because they are disposed adjacent to one another over a common substrate or other layer. Each pixel in the pixel arrangement include multiple sub-pixels, each of which may be configured to emit light of a different color than other sub-pixels in the pixel, and each of which may have a different optical path length than each other sub-pixel in the pixel. For example, a pixel may include red, yellow, green, and/or blue sub-pixels, each of which may have an optical path length configured to optimize output for the respective color emitted by the sub-pixel. As used herein, the "optical path length" of a sub-pixel or other arrangement refers to the optical distance within the sub-pixel, such as between a reflective surface and an exterior surface of an electrode opposite the reflective surface within the sub-pixel. The optical path length refers to the distance traversable by light within the sub-pixel, and may be weighted for different indices of refraction of materials within a stack that makes up the sub-pixel. Thus, the optical path length of a sub-pixel refers to the sum of the optical path lengths for each material in the sub-pixel stack between the reflective surface on one side of the device, and the transparent surface where light leaves the device on the other, with each optical path length being equal to the product of the thickness of the material and the refractive index of that material. Typically the optical path length excludes the thickness of the substrate on which a device is fabricated.

In some embodiments, one or more sub-pixels may have the same, about the same, or different optical path lengths than one or more other sub-pixels within a pixel. For example, two sub-pixels may have the same optical path length when they include some or all common layers between the sub-pixels, possibly with the exclusion of color altering layers disposed in each sub-pixel. That is, a first sub-pixel may have a different optical path length than one, two, or three other sub-pixels disposed within the same pixel.

Figure 61A:
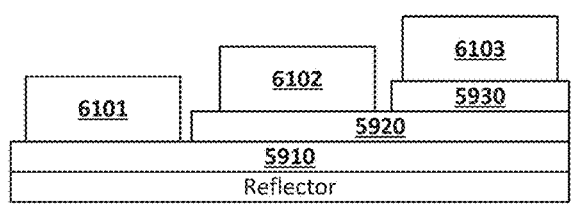
FIGS. 61A and 61B show schematic representations of sub-pixel arrangements having different optical path lengths.
Figure 61B:
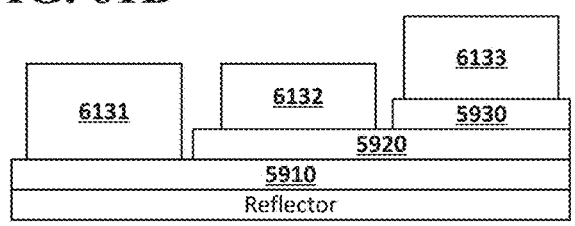

As previously described, different optical path lengths may result from electrode stacks disposed in a stack with the organic OLED stack used to generate light within each sub-pixel. For example, FIGS. 56-60 show examples of electrode arrangements in which transparent layers and/or electrode material is arranged to form three electrode stacks of different heights relative to a substrate. When OLEDs are disposed in stacks with the illustrated electrode stacks, they may have different optical path lengths due to the different heights of electrode stacks. Alternatively or in addition, the OLED stacks themselves may have different heights, such as where different thicknesses of transport and/or blocking layers are used within each sub-pixel. The combination of OLED stack height and electrode stack height may result in sub-pixels that have the same or different optical path lengths. FIG. 61A shows an example arrangement in which three example sub-pixels have optical path lengths that are different, using the example electrode stack arrangement shown in FIG. 59. In the example, each of three sub-pixels includes emissive stacks 6101, 6102, 6103, which, when combined with the three electrode stacks formed by different layers 5910, 5920, 5930, result in three sub-pixels having three different optical path lengths. Similarly FIG. 61B shows a configuration in which two sub-pixels 6131, 6132 have the same optical path length, which is different than the optical path length of a third sub-pixel 6133. Although the examples shown and described with respect to FIGS. 56-61 use three sub-pixels for clarity, similar arrangements may be used that include four sub-pixels as disclosed herein.

As disclosed herein, each sub-pixel in an arrangement in which sub-pixels have different optical path lengths may include other layers and features. For example, a sub-pixel may have an optical path length configured to optimize output of the pixel for a particular color emission, such as yellow. However, the sub-pixel may be used to emit a different color light, such as green light. To do so, a color altering layer may be disposed in a stack with the yellow emissive region, in a sub-pixel having an optical path length optimized for yellow emission. Thus, as disclosed herein, multiple sub-pixels may have the same color emissive region, and may have path lengths optimized for that color, while still being configured to emit light of different colors.

Figure 25:
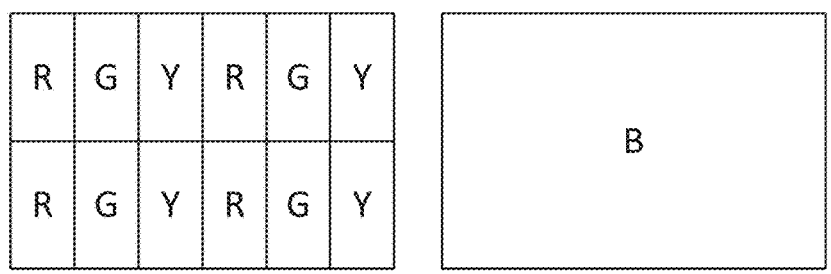
FIG. 25 shows an example arrangement in which there are multiple yellow, red, and green sub-pixels in each pixel that includes a single blue sub-pixel according to an embodiment.

The use of optimized optical path lengths for one or more sub-pixels as disclosed herein may be advantageous when top emission and/or cavity designed OLEDs are used, for example, with configurations as shown in FIGS. 36-39, 41-43, 46-51, and throughout the present disclosure. Furthermore, arrangements that allow HTL or other layer materials to be deposited in a striped, cross-hatched, or similar configurations may facilitate deposition of different optical path-length pixel arrangements using techniques such as OVJP. As a specific example, configurations such as illustrated in FIG. 25 may be fabricated using OVJP deposition techniques, while achieving different optical path lengths for the different sub-pixels.

Alternatively or in addition to the arrangements previously described, embodiments disclosed herein may provide OLED structures that include only two colors of emissive regions and/or arrangements that include four or more sub-pixels within each pixel of a full-color OLED display. Additional colors beyond those emitted by the emissive regions may be achieved, for example, by use of color altering layers as disclosed herein.

Figure 24:
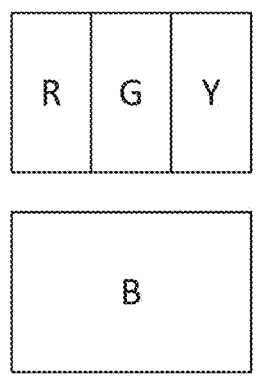
FIG. 24 shows an example schematic arrangement in which yellow sub-pixels are located in a separate plane with respect to the substrate and blue sub-pixels according to an embodiment.

For example, some embodiments provide architectures and methods for constructing a superposition and/or spatial color synthesis OLED pixel architecture. In such an embodiment, one color of OLED deposition may be located adjacent to and/or in a separate plane from one or more other depositions and/or the substrate. FIG. 24 shows an example schematic arrangement in which yellow ("Y") sub-pixels are located in a separate plane with respect to the substrate and blue ("B") sub-pixels. In this configuration, either the Y sub-pixels or B sub-pixels may be substantially transparent. Red and green color altering layers then may be superposed over a portion of each of the yellow sub-pixels to render red and green in the final device.

An architecture such as shown in FIG. 24 may have several advantages over a conventional side-by-side pixel arrangement. For example, it may allow the fill factor of blue sub-pixels to be maximized to increase their lifetime. The blue sub-pixels may also be microcavities as disclosed in further detail herein, such as top-emission (TE) OLEDs combined with a substantially Lambertian emission Y sub-pixel plane. Such a configuration may allow the blue spectrum to be manipulated for color saturation and efficiency, while minimizing the negative angular dependence issues associated with a full color display where all the sub-pixels are top-emitting, i.e., color shift and image distortions that occur as a function of angle. For a given resolution, the lifetime of yellow sub-pixels, including the red and green color-altered sub-pixels, also may be enhanced, as the aperture ratio for these pixels may be higher since there are only 3 sub-pixels per plane instead of 4. The ratio of yellow, red, or green sub-pixels to blue also may be greater than 1, i.e., there may be more than 1 yellow, red, or green sub-pixel for each blue. An example of such a configuration is shown in FIG. 25, in which there are multiple yellow, red, and green sub-pixels in each pixel that includes a single blue sub-pixel. The display resolution will then be determined by the Y(RG) (i.e., yellow emissive region with red and green color altering layer) sub-pixels. Such a configuration may be acceptable for full-color OLED displays and similar devices, because the human eye typically has relatively poor spatial resolution in the blue region of the spectrum and thus is relatively insensitive to the luminance of the blue sub-pixel. Although FIG. 25 illustrates a configuration in which the blue sub-pixel has the same area as the combined Y(RG) sub-pixels, it will be understood that other configurations may be used in which the blue and yellow emissive regions, and/or the blue, red, and green sub-pixels, have different relative sizes.

The two planes of OLED sub-pixels may be constructed in a variety of ways. For example, in the Y(RG)B display, the Y(RG) sub pixels and B sub-pixels may be fabricated on separate backplanes and then attached together, with one of the backplanes being substantially transparent. Alternatively, the OLED planes may be fabricated on top of one another over one backplane.

Another way of fabricating OLEDs on two different planes is for the blue sub-pixel to be approximately the same size as the yellow sub-pixel on the second plane, so that blue light from the first plane is not lost and absorbed by the red and green color filters of the second plane. This will still result in higher fill factor displays than putting all four colors in one plane. As red and green are only required to make highly saturated colors, these sub-pixels typically can be relatively small compared to the yellow and blue sub-pixel areas.

Figure 26:
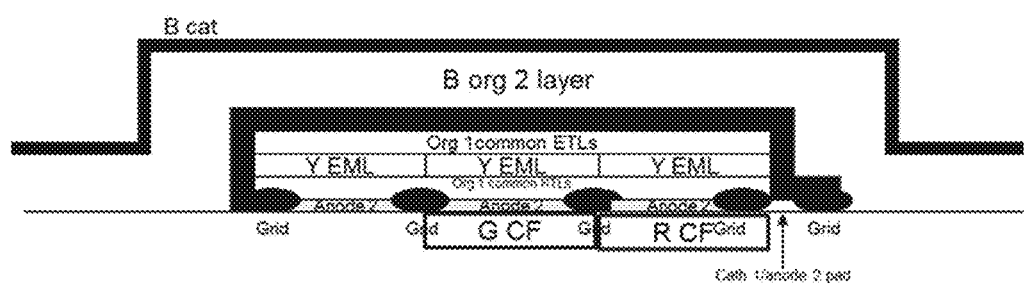
FIG. 26 shows an example device configuration having two planes of sub-pixels according to an embodiment.

FIG. 26 shows an example device configuration having two planes of sub-pixels. The two planes include blue and yellow emissive regions. Green and red are rendered by the use of color altering layers disposed in a stack with portions of the yellow emissive region or regions. In the example shown in FIG. 26, a center electrode is common to both planes of sub-pixel emissive regions.

Figure 27:
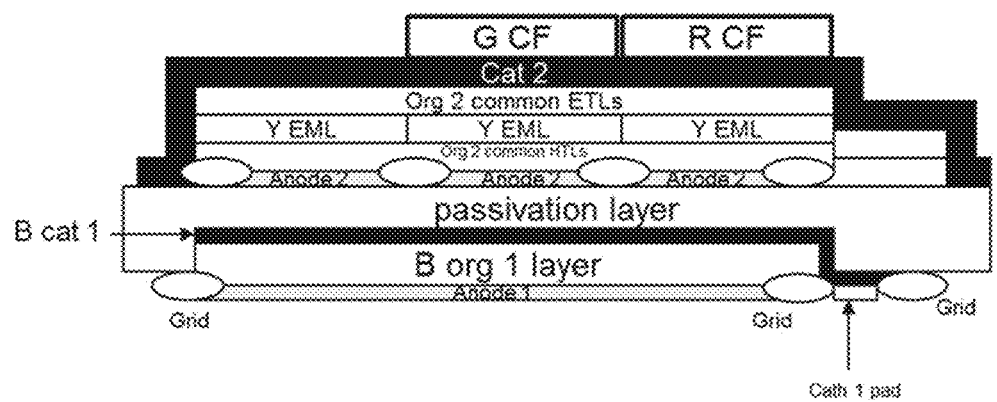
FIG. 27 shows an example top-emitting device configuration having two planes of sub-pixels according to an embodiment.

FIG. 27 shows an example top-emitting device configuration having two planes of sub-pixels. As with the example shown in FIG. 26, red and green are rendered through the use of color altering layers disposed in a stack with portions of the yellow emissive region or regions. In the example shown in FIG. 27, a passivation layer is disposed between the planes of sub-pixel emissive regions.

More generally, embodiments disclosed herein may include two emissive layers of different colors, with only a portion of one emissive layer superposed with a second emissive layer. As used herein, two layers or regions are "superposed", or one layer or region is "superposed" with another, if one layer is disposed above or below the other, relative to a substrate or similar reference. Thus, as previously described, one layer that may be described as "above" or "below" another layer, or closer to the "top" or "bottom" of a device than another layer, also may be described as being "superposed" with that layer. A color altering layer may be superposed with a portion of the second emissive layer. For example, as previously described, yellow and blue emissive regions or layers may be superposed within a device, and one or more color altering layers may be superposed with a portion of the yellow emissive layer that is not superposed with the blue emissive layer, relative to a substrate. Additional color altering layers may be superposed with other portions of the second emissive layer, such as where red and/or green color altering layers are superposed with a yellow emissive region. In an embodiment, the device may include emissive layers or regions of exactly two colors, and the device may emit light of at least four colors.

As previously described with respect to the example devices including superposed blue and yellow layers, one layer may act as a hole transport or similar layer relative to the emission of the other layer, i.e., the layer may act to transport holes for recombination within the first layer, while generating little or no emission itself, in the region that is superposed with the first layer. An intervening electrode and/or a passivation layer may be disposed between the two layers, as previously shown in and described with respect to FIGS. 22-23. Thus, as previously described, an emissive region of one color may include some or all of a layer that may provide the emission for that color in an emissive region elsewhere in the device, while contributing to the ultimate emission of an emissive region of another color in a different portion of a device.

Figure 12:
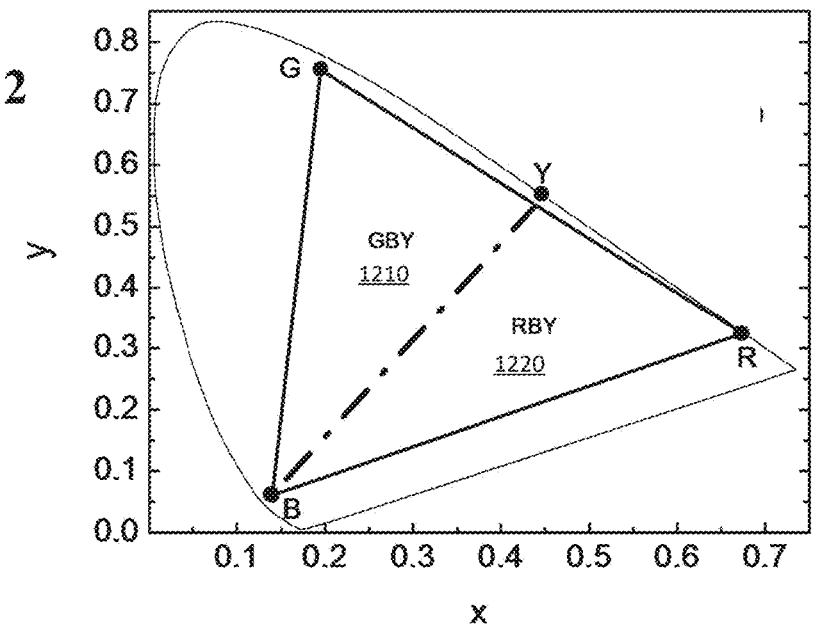
FIG. 12 shows the 1931 CIE diagram with coordinates for pure red, green, and blue, and for a multi-component yellow source that lies outside the RG line according to an embodiment disclosed herein.
Figure 13:
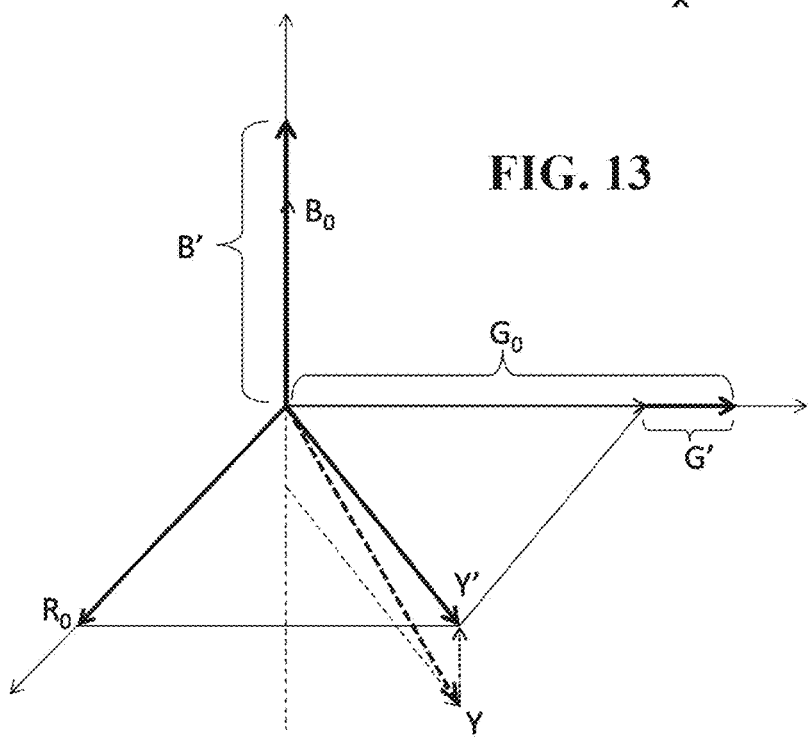
FIG. 13 illustrates an example color point rendered without the use of a red sub-pixel according to an embodiment disclosed herein.

Embodiments of the invention disclosed herein may use a variety of drive schemes. In many embodiments, four sub-pixels may be available to render each color. Typically, only three sub-pixels may be needed to render a particular color; thus there are multiple options available for the electrical drive configuration used to render the color. For example, FIG. 12 shows the 1931 CIE diagram with coordinates for pure red, green, and blue, and for a multi-component yellow source that lies outside the RG line according to an embodiment disclosed herein. In a four sub-pixel arrangement as disclosed herein, when rendering a color in the GBY space 1210, the red sub-pixel is not required; similarly, if the color to be rendered is within the RBY space 1220, the green sub-pixel is not required. FIG. 13 illustrates an example color point rendered without the use of a red sub-pixel, i.e., a point which lies within the GBY space 1210 in FIG. 12. As shown the initial contribution of pixels for the example point may be $R_0$, $G_0$, $B_0$ for the red, green, and blue sub-pixels, respectively, in a RGBY arrangement. In an RGBY arrangement as disclosed herein, the equivalent contributions for yellow, green, and blue sub-pixels may be Y', G', B', respectively. Notably, the red sub-pixel need not be used to render the desired color.

Figure 14:
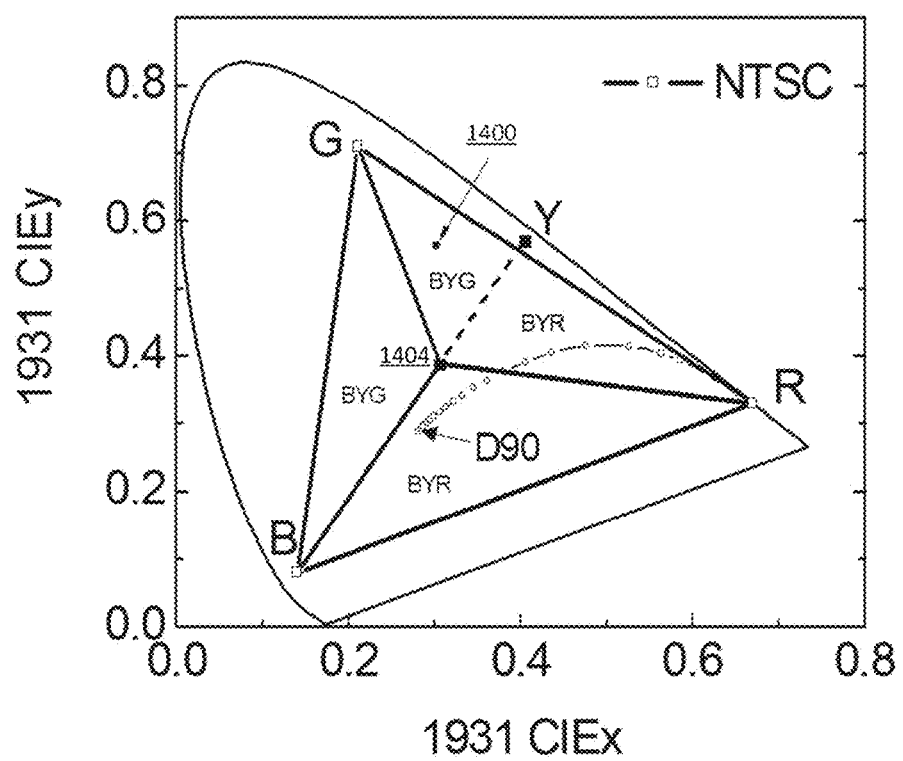
FIG. 14 shows a CIE diagram that identifies red, green, blue, and yellow points, an established white point, and various color regions according to an embodiment disclosed herein.

Another drive arrangement according to embodiments disclosed herein is to fix a white point using yellow and blue sub-pixels. A desired color may then be rendered through use of the green or red sub-pixel, depending on whether the color lies within the GBY or RBY space. FIG. 14 shows a CIE diagram that identifies red, green, blue, and yellow points as previously disclosed. A white point 1404 may be established along the BY line using a combination of only the blue and yellow sub-pixels, as shown. A color point 1400 falling in the GBY space, i.e., on the green side of the BY line, thus may be rendered by using the green sub-pixel in addition to the blue and yellow sub-pixels. Similarly, a point in the BYR space, i.e., on the red side of the BY line, may be rendered using the blue, yellow, and red sub-pixels. Thus, embodiments disclosed herein allow for a variety of drive arrangements, and may provide additional flexibility, efficiency, and color range compared to conventional RGBW and similar arrangements.

An emissive region, layer, or device disclosed herein may be a single-layer emissive layer, or it may be a stacked device. Each emissive region, layer, or device may also include multiple emissive materials which, when operated in conjunction, provide the appropriate color light for the component. For example, a yellow emissive region may include both red and green emissive materials in an appropriate proportion to provide yellow light. Similarly, any emissive region or device may be a stacked device or otherwise include emissive sub-regions of sub-colors that are used to provide the desired color for the region or device, such as where a stacked configuration with red and green devices is used to provide a yellow emissive region. Each also may include multiple emissive materials that provide light of the same color or in the same region. Further, each emissive material used in any of the configurations disclosed herein may be phosphorescent, fluorescent, or hybrid, unless indicated specifically to the contrary. Although a single emissive region as disclosed herein may include multiple emissive materials, it may be described as emitting only a single color, since typically it will not be configured to allow for only one of the emissive materials to be used. For example, a yellow emissive region may include both red and green emissive materials. Such a region is described herein as a yellow emissive region and is considered a single-color emissive region, since the red and green emissive materials cannot be activated independently of one another.

According to embodiments of the disclosed subject matter, a pixel including at least four sub-pixels may be driven based on projections associated with a color signal. The sub-pixels may correspond to or include emissive regions containing two or fewer colors, such as a blue emissive region and a yellow emissive region. Multiple sub-pixels may be formed from a single emissive region as previously described, such as by the use of color altering layers optically coupled to portions of one of the sub-pixels. Such a pixel arrangement may include no more than two color altering layers.

In operation, a color signal that defines or otherwise provides an intended color to be generated by the pixel is used to drive the pixel. As an example, a display containing thousands of pixels may be configured to display an image of an automobile at a given time. A particular pixel may be located in an area of the display such that, to display the automobile, the intended color output by the pixel is an orange represented by the hex value #FFA500. Instead of driving all four sub-pixels, three of the four sub-pixels may be driven such that the light that would have been emitted by a primary color sub-pixel in a conventional display (e.g., a green sub-pixel) may be emitted instead by a secondary color pixel (e.g., a yellow sub-pixel). Further, of the three of four sub-pixels that are driven, a primary color sub-pixel (e.g., a red sub-pixel) may be driven at a lower magnitude based on a secondary sub-pixel (e.g., the yellow sub-pixel) emitting a portion of the light that the primary color sub-pixel (e.g., red sub-pixel) would have emitted if driven without the secondary sub-pixel.

Figure 18:
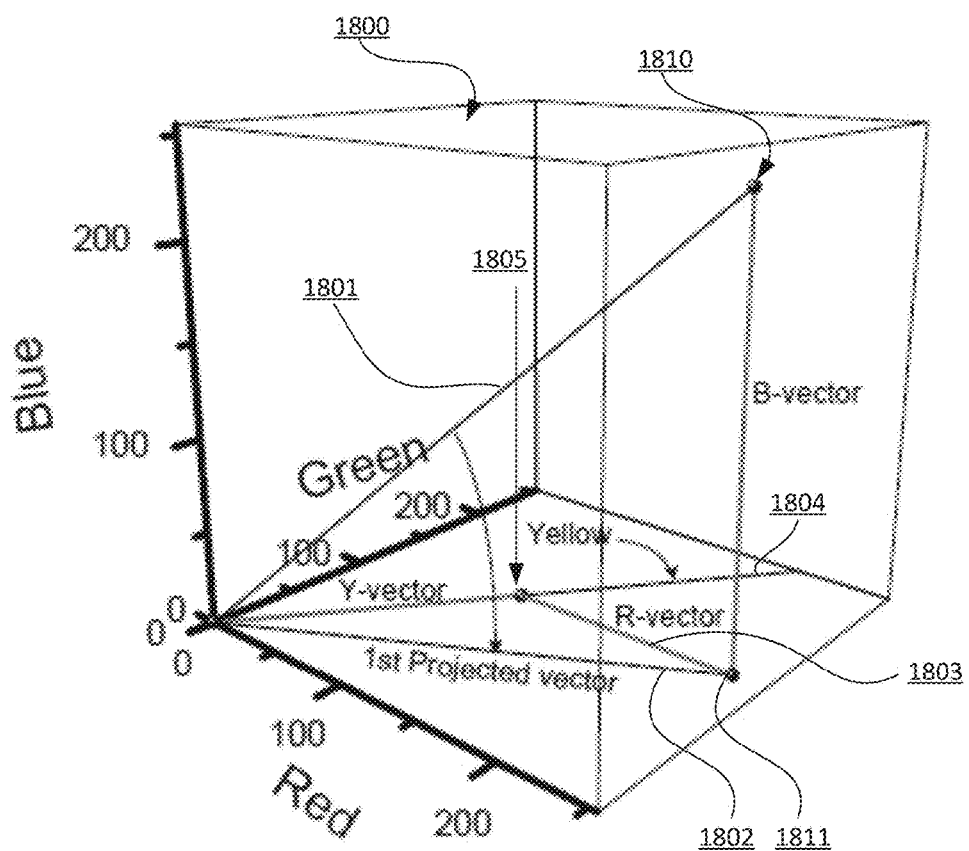
FIG. 18 shows a diagram that identifies red, green, blue and yellow points and associated color spaces, according to an embodiment disclosed herein.
Figure 20A:
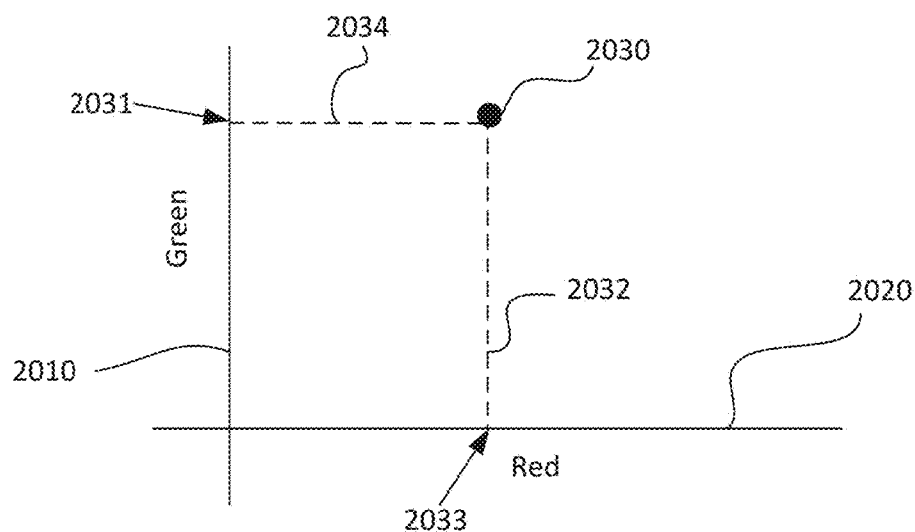
FIG. 20A shows a color space defined by two sub-pixels, according to an embodiment disclosed herein.
Figure 20B:
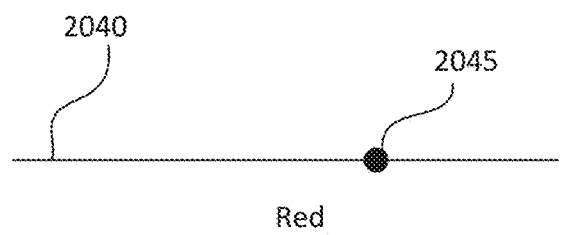
FIG. 20B shows a color space defined by a single sub-pixel, according to an embodiment disclosed herein.

As disclosed herein, a color space may be defined by one or more sub-pixels. A color space may correspond to the range of colors available based on the color emission range of one or more sub-pixels. An example of a three sub-pixel color space is shown in FIG. 18. The three axes (Red, Blue, and Green) represent the color space available based on the three respective red, blue, and green sub-pixels, as shown by the box 1800. Notably, any color point within the color space box 1800 may be emitted by driving the Red, Blue, and Green sub-pixels at levels corresponding to the projection of the color point onto each respective sub-pixel. An example of a two sub-pixel color space, such as a "slice" of the color space illustrated in FIG. 18, is shown in FIG. 20a. Here the x axis 2020 is represented by the emission capability of a red sub-pixel and the y axis 2010 is represented by the emission capability of a green sub-pixel. Notably, any color point within the color space represented by the two axes may be emitted by driving the red and the green sub-pixel at levels corresponding to the projection of the color point onto each respective sub-pixel. As a more specific example, a color point 2030 within the color space represented by the red and green color space may be projected onto the red axis as shown by projection 2032 and may be projected on to the green axis as shown by projection 2034. The color point 2030 may be emitted by driving the red sub-pixel at a value corresponding to 2033 (i.e., the projection point of the color point 2030 onto the red sub-pixel axis) and the green sub-pixel at a value corresponding to 2031 (i.e., the projection point of the color point 2030 onto the green sub-pixel axis). As an example of a single sub-pixel color space is shown in FIG. 20*b*. Here, the only axis 2040 corresponds to the emission capability of a red sub-pixel. Notably, any color point within this red pixel's color space may be represented by a point on the axis 2040. As a specific example, point 2045 is a color point that can be emitted by driving the red sub-pixel at the point 2045 itself. It will be understood that the same sub-pixel or sub-pixel type used to show the single sub-pixel color space may be a part of the double and/or triple sub-pixel color space. As a specific example, a red color pixel may be have the emission capability represented in FIG. 20*b* as the red color pixel in FIGS. 20*a* and 18.

As previously described, a display pixel as disclosed herein may include at least four sub-pixels. A projection of an original color signal onto a color space defined by two of the four sub-pixels may be determined. As an example, one way of producing the color specified in an original color signal is to emit a red, green, and blue light from red, green, and blue sub-pixels, respectively. As disclosed herein, alternatively, the original color signal may be projected onto a color space defined by two of the sub-pixels such as, for example, the red and the green color space. Notably, the projection of the original color signal onto a color space defined by two of the sub-pixels may correspond to the magnitude of emission, corresponding to the two sub-pixels, required to emit the portion of the original color signal corresponding to the two sub-pixels.

FIG. 18 shows an illustrative example of projecting an original color signal onto a color space defined by two sub-pixels. As shown in FIG. 18, an original color signal may be represented by point 1810. The point 1810 may indicate that the original color signal is one that can be emitted by driving the red, green, and blue sub-pixels based on the direction and magnitude of the point 1810. As disclosed herein, to produce the specified color using two sub-pixels, a projection of the original color signal onto the color space defined by the red and green sub-pixels, may be determined. This projection may be represented by the first projection vector 1802 as shown in FIG. 18. Projecting the original color signal onto the red and green color space may result in a component of the original color signal that is based only on the red and green color space. In other words, the projection represents the red/green component of the original color signal.

As previously described, a color space also may be defined for a single sub-pixel. As shown in FIG. 20*b*, a color space for a single sub-pixel may be represented by a line as the color space is only single dimensional (as a result of being defined for driving a single sub-pixel). The color space for a single sub-pixel may be for a primary color (e.g., blue, green, red) or may be for a secondary color such as yellow, magenta, cyan, or the like. As an example, a yellow sub-pixel may have a color space that is a factor of red and green color spaces. As an illustrative example, as shown in FIG. 18, the y-vector 1803 represents the color space for a yellow sub-pixel. As shown, the color space for the yellow sub-pixel can be represented by points within the red green color space such that the red and/or green sub-pixel may be driven to emit the color points represented by the yellow color space.

After determining the first projection of the color signal, a second projection of the first projection onto a color space defined by a single sub-pixel may be determined. The color space defined by the single sub-pixel may be for a sub-pixel associated with a secondary color such that the secondary color is within the color space of two other sub-pixels in the pixel onto which the first projection was determined. In other words, the color space for the single sub-pixel may be a combination of at least two other colors emitted by two other respective sub-pixels in a pixel. As an example, the second projection may be onto a color space defined by a yellow sub-pixel such that the light emitted by the yellow sub-pixel may be light that is within the color space of the red and green sub-pixel. In an illustrative example, as shown in FIG. 18, the color space for a yellow sub-pixel may be defined by the Y-vector 1804. As shown, the Y-vector 1804 may represent the color space defined by a yellow sub-pixel. The first projection represented by the first projection vector 1802 may have an end at point 1811. The first projection vector 1802 may be projected on the Y-vector 1804 such that the second projection corresponds to point 1805 on the Y-vector 1804.

A second projection of a first projection may represent a single sub-pixel vector that corresponds to components of both components of the two other sub-pixels that the two sub-pixel color space is associated with. As an example, as shown in FIG. 18, the projection onto the Y-vector represented by point 1805 represents a color point associated with both red and green components of the first projection. In this example, the point 1805 represents the entire green component of the first projection vector and represents the entire red component less the R-vector 1803 (i.e., RedComponent−R-vector=Red_portion_of_Y-vector). As a more specific example, the point 1811 of the first projection vector corresponds to a red value of 200 and a green value of 150 (as shown in FIG. 18). The projection of the first projection vector onto the Y-vector 1804 results in point 1805. Point 1805 on the Y-vector represents the entire green component (i.e., 150) and represents a value of 100 for the red component. Here, the R-vector may represent the remaining value of 100 such that the overall red value of 200 is represented by the R-vector plus the red component of the Y-vector at point 1805.

According to embodiments of the disclosed subject matter, a sub-pixel corresponding to the second projection may be driven based on the magnitude of the second projection. Driving the third sub-pixel based on the magnitude of the second projection may result in emission of a light that is representative of one or more attic components of the first projection onto the color space represented by two color pixels. Continuing the previous illustrative example, as shown in FIG. 18, the yellow sub-pixel may be driven based on the magnitude associated with the second projection point 1805 such that the yellow sub-pixel emits all of the green component (150) associated with the first projection vector 1802 and a portion of the red component (100) of the total red component (200) of the first projection vector 1802. Notably, driving the yellow sub-pixel at the magnitude associated with the second projection may effectively eliminate the need to drive the green sub-pixel as the green component value (150) is emitted by the yellow sub-pixel. Additionally, driving the yellow sub-pixel at the magnitude associated with the second projection may effectively reduce the intensity at which the red pixel needs to be driven to produce the desired color. The reduction may correspond to the magnitude of the R-vector such that, when aggregated, the red component of the yellow emitted light plus the R-vector equal or are substantially close to the red component of the first projected vector. Such a configuration may be more energy efficient than a conventional three-color arrangement in which each of the red, green, and blue sub-pixels would need to be driven at levels corresponding to the red, green, and blue components of the desired color.

More generally, according to embodiments disclosed herein, at least a one sub-pixel in a pixel may not be activated to emit an original color signal. For example, as described above, a desired color may be achieved without activating a green sub-pixel at all, by using a yellow sub-pixel to obtain the green component of the desired color. As described above, a second sub-pixel may be driven based on the difference between a first projection and a second projection, such as the red sub-pixel in the above example. A third sub-pixel may be driven based on the magnitude of the second projection as previously described, such as the yellow sub-pixel in the above example. Finally, a fourth sub-pixel may be driven based on the respective color component of the original color signal. For example, a blue sub-pixel may be driven at a level corresponding to the blue component of a color signal in the example described with respect to FIG. 18. Notably, there may be no need to drive the first sub-pixel at all, since the third sub-pixel can be driven at a magnitude that includes the necessary color component of the first sub-pixel. Additionally, the second sub-pixel may be driven at a reduced level as a result of the third sub-pixel being driven at a magnitude that includes at least a portion of the necessary color component of the second sub-pixel. Notably, the third sub-pixel may emit a color equivalent to a combination of colors emitted by the first and second sub-pixels.

According to embodiments disclosed herein, an original color signal may be defined by three primary colors. For example, the original color signal may be defined by red, green, and blue coordinates (R, G, B). Each primary color may have a sub-pixel associated with it. Additionally, a secondary sub-pixel may emit light having color coordinates (r', g', 0) such that it contains components of both R and G. The secondary sub-pixel may be driven at ((G×r')/g', G, 0) where (G×r')/g' corresponds to the red color component of the original signal (R, G, B) and G corresponds to the entire green component of the original signal. The red sub-pixel may be driven at (R−(G×r')/g', 0, 0), where R−(G×r')/g' corresponds to the remaining fraction of R such that (G×r')/g' and R−(G×r')/g' (i.e., the component of the secondary sub-pixel and the component of the red sub-pixel) in combination are equivalent to R, the red component of the original color signal. Accordingly, between the secondary sub-pixel and the red sub-pixel, both the R and the G component of the original color signal are covered. The sub-pixel corresponding to a blue emitted color may be driven at (0, 0, B) such that, among the secondary sub-pixel, the red sub-pixel, and the blue sub-pixel, the original color signal (R, G, B) is reproduced. Notably, the green sub-pixel in this example may not be activated to emit the original color signal (R, G, B). Here, the green sub-pixel in this example may not be activated because g'/r' is greater than or equal to G/R, which corresponds to the secondary sub-pixel being capable of emitting the entire green component but not the entire red component. Described another way, in this case the projection onto the green/red color space corresponds to a point lying on the "red side" of the "yellow line", i.e., the side on which the R-vector illustrated in FIG. 18 falls.

Figure 19:
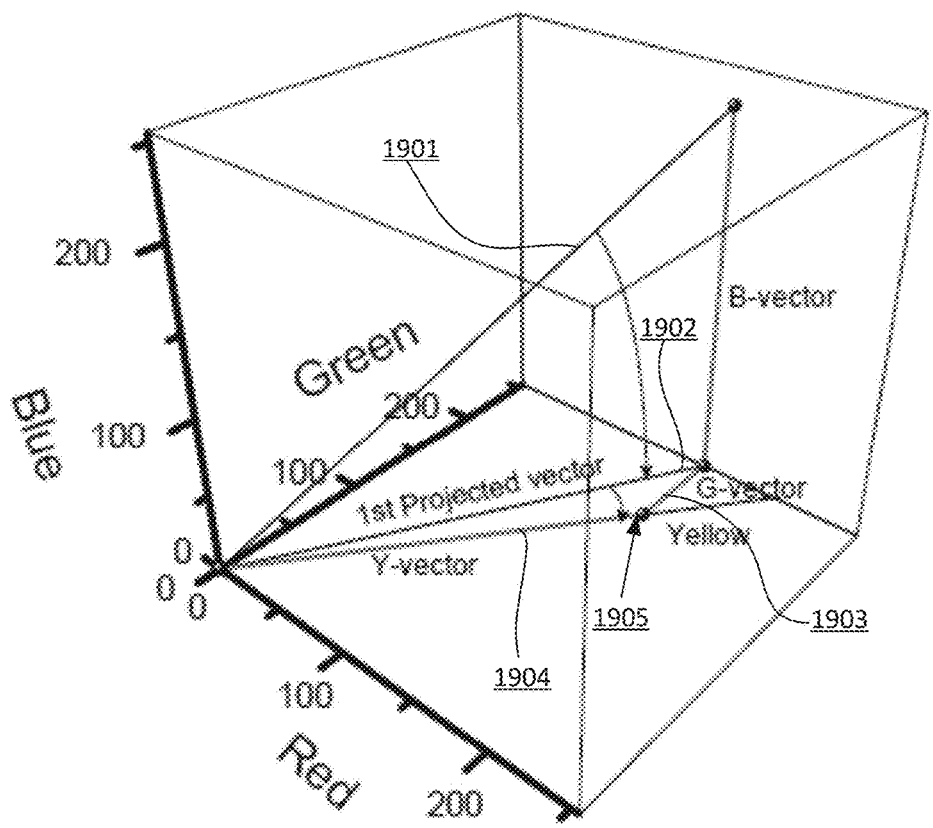
FIG. 19 shows another diagram that identifies red, green, blue and yellow points and associated color spaces, according to an embodiment disclosed herein.

As another illustrative example, as shown in FIG. 19, an original color signal may be represented by vector 1901 and a first projection of the original color signal may be determined onto the color space defined by the red and green sub-pixels. The first projection may correspond to the first projected vector 1902. A second projection onto the Y-vector 1904 may be determined and may correspond to the point 1905 on the Y-vector. The point 1905 may correspond to the entire red component of the first projected vector 1902 and a fraction of the green component of the first projected vector 1902. The entire green component may be represented by the point 1905 plus the G-vector 1903, as shown in FIG. 19.

According to embodiments disclosed herein, an original color signal may be defined by three primary colors. For example, the original color signal may be defined by red, green, and blue coordinates (R, G, B). Each primary color may have a sub-pixel associated with it. Additionally, a secondary sub-pixel may emit light having color coordinates (r', g', 0) such that it contains components of both R and G. The secondary sub-pixel may be driven at (R, R×g')/r', 0) where (R×g')/r' corresponds to a fraction of G, the green color component of the original signal (R, G, B) and R corresponds to the entire red component of the original signal. The green sub-pixel may be driven at (0, G−(R×g')/r', 0), where G−(R×g')/r' corresponds to the fraction of G remaining such that (R×g')/r' and G−(R×g')/r' (i.e., the component of the secondary sub-pixel and the component of the green sub-pixel) combine to form G, the green component of the original color signal. Accordingly, among the secondary sub-pixel and the green sub-pixel, both the R and the G component of the original color signal are covered. The sub-pixel corresponding to a blue emitted color may be driven at (0, 0, B) such that, between the secondary sub-pixel, the green sub-pixel, and the blue sub-pixel, the original color signal (R, G, B) is reproduced. Notably, the red sub-pixel in this example may not be activated to emit the original color signal (R, G, B). Here, the red sub-pixel in this example may not be activated because g'/r' is less than G/R which corresponds to the secondary sub-pixel being capable of emitting the entire red component but not the entire green component. This case corresponds to that in which the projection lies on the "green side" of the Y-vector shown in FIG. 19, in contrast to the point illustrated in FIG. 18.

According to an embodiment of the disclosed subject matter, a secondary color sub-pixel (e.g., a yellow sub-pixel) may have a color space that can be defined by three or more primary colors. As an example, FIG. 20a shows a color point 2030 which corresponds to a red component 2033 and a green component 2031. Color point 2030 is defined by two primary colors. Similarly, a color space for a sub-pixel may be defined by two primary colors. As shown in FIG. 18, the color space for the yellow sub-pixel (Y-vector) is defined within the red green color space. The points on the yellow sub-pixel color space are all within the red green color space. Alternatively, if, for example, a color signal is such that it contains a red component, green component, and a blue component, it may be originally emitted by three sub-pixels corresponding to primary colors. Similar to the color signal that is defined by three primary colors sub-pixels, a color space for a sub-pixel may be defined by three or more primary colors. The techniques disclosed herein may be applied by first projecting the color space, for the sub-pixel defined by three or more primary colors, onto a color space defined by two colors (e.g, the Y-vector in FIG. 18 would be a projection of the yellow sub-pixels color space rather than the actual color space itself). The sub-pixel defined by three or more primary colors may be driven based on the first and second projections onto the sub-pixel projection. Additionally, two sub-pixels may be operated at reduced values based on driving the sub-pixel defined by three or more primary colors. As an illustrative example, a yellow sub-pixel may have a color space defined by red, green, and blue colors. A projection of the yellow sub-pixels color space may correspond to the Y-vector shown in FIG. 18. Based on the techniques disclosed herein, the green sub-pixel may not be activated and the red sub-pixel may be driven at a reduced level based on driving the yellow sub-pixel at a magnitude associated with a projection onto the Y-vector. Additionally, the blue sub-pixel may operate at a reduced level based on the difference between the yellow sub-pixel's color space and the Y-vector (i.e., the projection of the yellow sub-pixels color space onto the red-green color space).

If an original color signal is within the color space of two sub-pixels (i.e., instead of three sub-pixels), only a first projection may be needed and the original color signal may be emitted using only two sub-pixels. Here, a secondary sub-pixel color space may also be contained within the color space of the same two sub-pixels that the original color signal is in. Accordingly, the original color signal may be projected onto the color space of the secondary sub-pixel. The secondary sub-pixel may be driven based on the magnitude of the projection. The secondary sub-pixel may be driven such that it contains an entire first color component of the original color signal and a portion of a second color component of the original signal. A different sub-pixel may be driven to compensate for the remaining portion of the second color component of the original signal. Accordingly, only the secondary sub-pixel and the other sub-pixel may be driven of the at least four sub-pixels within the pixel.

It will be understood that at any given color signal, a given sub-pixel may be activated or not activated based on the color signal. As an example, using the notation introduced previously, when g'/r' is greater than or equal to G/R, then a green sub-pixel may not be activated whereas when it is less than G/R, a red sub-pixel may not be activated. It will be understood that for two different color signals, a given sub-pixel may be active or not active. It will also be understood that although colors such as red, green, blue, yellow, magenta, and cyan are disclosed herein, the techniques disclosed herein may be applied to any color signals and/or sub-pixels associated with any colors.

Figure 56:
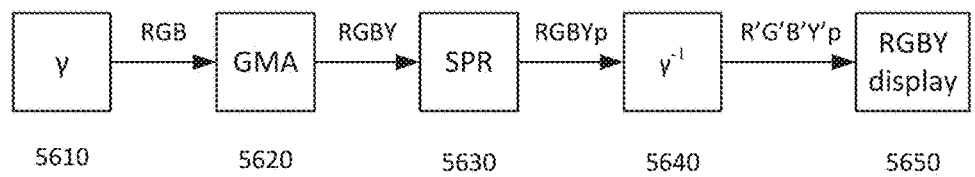
FIG. 56 shows an example system and process for rendering display data according to an embodiment.

FIG. 56 shows another example of processing conventional display data for display on an RGBY display as disclosed herein. In general, conventional R'G'B' data may be received, digitally processed, and displayed on an RGBY display as shown. R'G'B' data, which has been conventionally digital gamma quantized, may be received by a linearizing function 5610. The function applies a desired gamma to convert the R'G'B' data to linear RGB data, which may subsequently be digitally processed. The RGB data is converted to RGBY data in a Gamut Mapping Algorithm (GMA) 5620, which provides several functions including the color vector conversion from RGB color vectors to RGBY color vectors that substantially reproduce the same colors. The GMA also may account for the fact that an RGB color space and an RGBY color display have differing color gamuts. The RGBY data is mapped, subpixel and metamer rendered in the SPR function 5630, the result of which is represented as RGBYp. The RGBYp data is received by a gamma correction block 5640, which operates to gamma quantize the linear RGBYp data to R'G'B'Y'p data that matches the gamma distribution of the available light levels of the RGBY display. The R'G'B'Y'p data is then provided to the RGBY display 5650. A specific example of rendering for an RGBY display is provided herein with respect to the example arrangement shown in FIG. 39. Additional information regarding the development and use of filter kernels is provided in U.S. Pat. No. 7,688,335, the disclosure of which is incorporated by reference in its entirety.

Displays and similar devices as disclosed herein are often fabricated using a fine metal mask, as previously described. Such a mask may be referred to herein as a pixelated mask, since it is scaled to allow for the deposition of sub-pixels as opposed to large-area depositions. That is, the purpose of the pixelated mask is to deposit individual color emissive regions or layers, such as for use in addressable sub-pixels of particular colors, not to differentiate between different panels or displays where each opening in the mask is of the size of the display itself, such as white-emitting panels or displays, which are fabricated on a large-scale substrate for manufacturing efficiency. A pixelated mask may be referred to in context in the art as a fine metal mask, though other masks also may be referred to as fine metal masks. Embodiments of displays disclosed herein may be designed and fabricated using layouts that may increase the pixelated mask opening size, increase the vertical and horizontal spacing between mask openings, and lead to designs in which the mask resolution may be only half of that of the display itself. Further, techniques as disclosed herein may allow for the fabrication of full-color OLED displays and similar devices using only two colors of depositions of emissive material, and/or four or more colors of sub-pixels. Similar to embodiments previously described, such arrangements may be achieved, for example, by disposing one or more color altering layers in a stack with one or more portions of an emissive region to form multiple sub-pixels from a single color deposition.

Making an accurate pixelated mask, especially for large sizes or high resolution, is relatively difficult. Thus, the mask arrangements, pixel arrangements, and fabrication techniques disclosed herein may provide significant advantages for manufacturing cost and device yield. Techniques disclosed herein also may lower the resolution requirements for IJP and OVJP printing. Use of the approaches disclosed herein also may allow for fabrication of the same resolution display by printing or otherwise depositing organic stripes of wider width, with greater separation between adjacent stripes, than could otherwise be achieved.

FIG. 28A shows an example OLED deposition according to an embodiment. In this example, only the OLED depositions used to make the yellow and blue emissive regions are shown. As previously described, red and green sub-pixels may be further defined through the use of color altering layers such as color filters disposed over portions of the blue and/or yellow emissive regions. FIG. 28B shows the corresponding pixelated mask, in which the unshaded areas correspond to openings in the mask.

FIG. 29A shows an example sub-pixel emissive material layout according to an embodiment, in which sub-pixels of the same color are grouped together in adjacent pixels on the same row. FIG. 29B shows the corresponding pixelated mask arrangement. As can be seen from the mask layout, the size of the mask openings is increased over those in FIG. 28, and the horizontal spacing between mask openings is increased. Such a configuration may simplify the fabrication and use of the mask. Layouts such as shown in FIG. 29B may be particularly suitable for fabrication using printing techniques, and FIG. 29A may be particularly suitable for use with printing technologies such as IJP or OVJP, in which columns of pixels of the same color can be fabricated relatively efficiency. For example, comparing FIGS. 28A and 29A, it is apparent that each stripe in FIG. 29A is double the width and includes only one emissive region transition per pixel. In addition, wider gaps may be incorporated into the mask and arrangement designs, thus lowering the printing resolution requirements for the same resolution.

Notably, as described with respect to FIG. 29 and other example arrangements disclosed herein, the provided fabrication techniques may allow for only a single emissive region color change per pixel. This may be advantageous regardless of deposition technique because, regardless of the technique used it is necessary to have an alignment tolerance between emissive layers or regions of different colors to allow for manufacturing tolerances that ensure the correct emissive material is deposited on any given sub-pixel area. Conventional RGB displays typically require three such alignment tolerances per pixel, thus reducing the fill-factor of each sub-pixel and consequently the overall display lifetime. In embodiments disclosed herein, a full-color display may be fabricated using only one change in color per pixel, allowing for an increased sub-pixel fill factor while maintaining power efficiencies equivalent or comparable to conventional RGB displays, by not filtering all light emitted by the display.

Figure 30A:
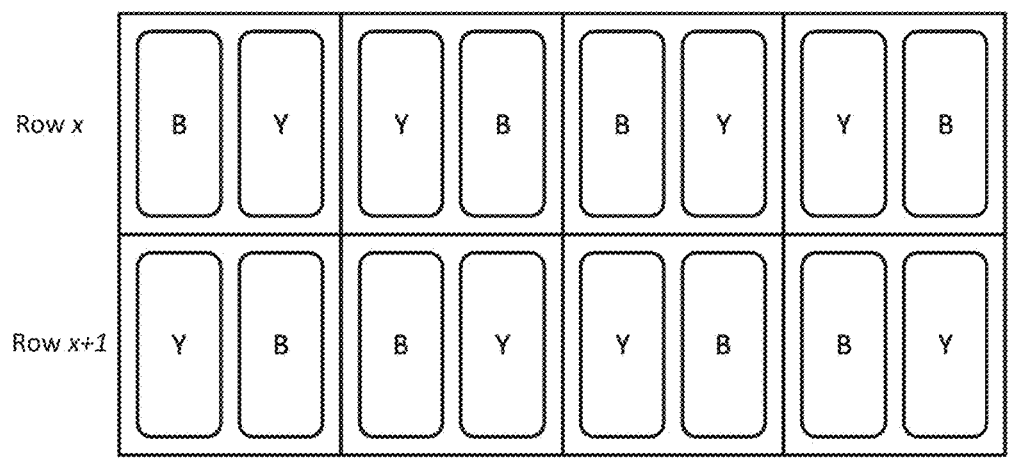
FIGS. 30A and 30B show an example sub-pixel layout and corresponding pixelated mask, respectively, according to an embodiment.
Figure 30B:
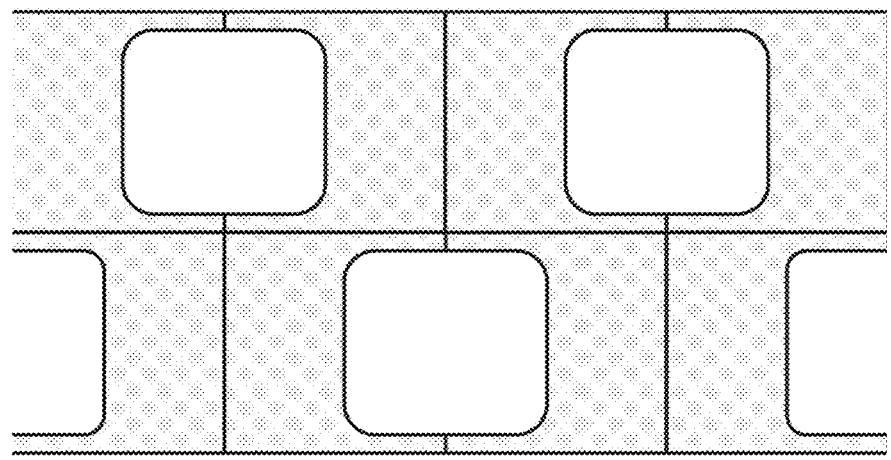

FIGS. 30A and 30B show another example sub-pixel layout and corresponding pixelated mask, respectively, according to an embodiment. In this configuration, sub-pixels of the same color are grouped in each row, but the yellow and blue OLED depositions and emissive regions are staggered from one row to the next row, i.e., from row x to row x+1. The advantage of this layout is shown in FIG. 30B, which demonstrates that mask openings may be staggered from row to row, leading to a more rigid mask design since no mask opening is directly parallel to another mask opening.

A notable difference between arrangements as illustrated in FIGS. 29 and 30 is that each vertical column in FIG. 30 has sub-pixels of different colors, whereas in FIG. 29 each sub-pixel color is in a stripe formation. As described in further detail herein, a staggered layout as shown in FIG. 30 may be implemented by staggering the data lines that supply pixel video information so that each external data driver is still driving pixels of the same color, but on different rows, and is multiplexed using the scan lines. Each yellow sub-pixel may be divided into 2 or 3 sub-pixels, for example to render red and green, or red, green and yellow, using color altering layers such as color filters. Thus, each yellow sub-pixel may have 2 or 3 data lines running through it, while each blue sub-pixel may have one data line connecting the sub-pixels to the external driver. An example of data lines staggered to avoid shorting is provided in FIG. 35, though other layouts may be used. More generally, in an embodiment the number of data lines required by the display may be less than three times the number of sub-pixels in the display.

Figure 31:
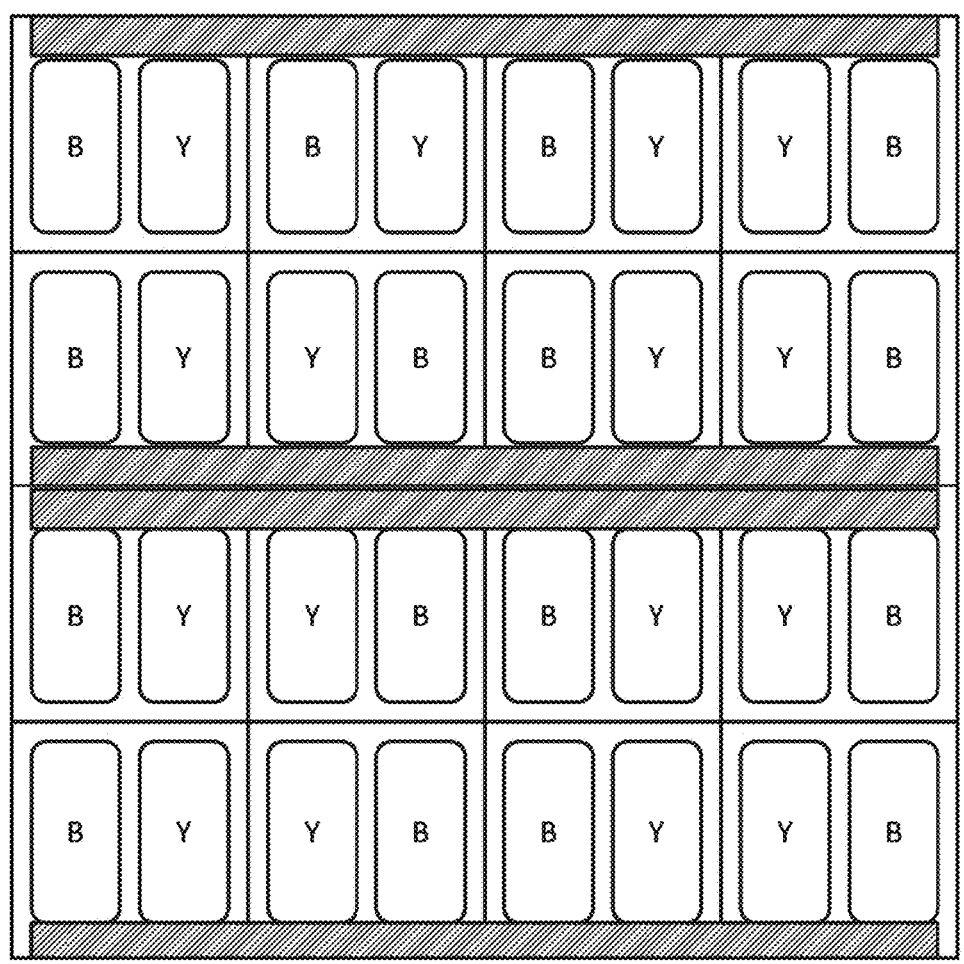
FIG. 31 shows an example sub-pixel layout according to an embodiment.
Figure 32:
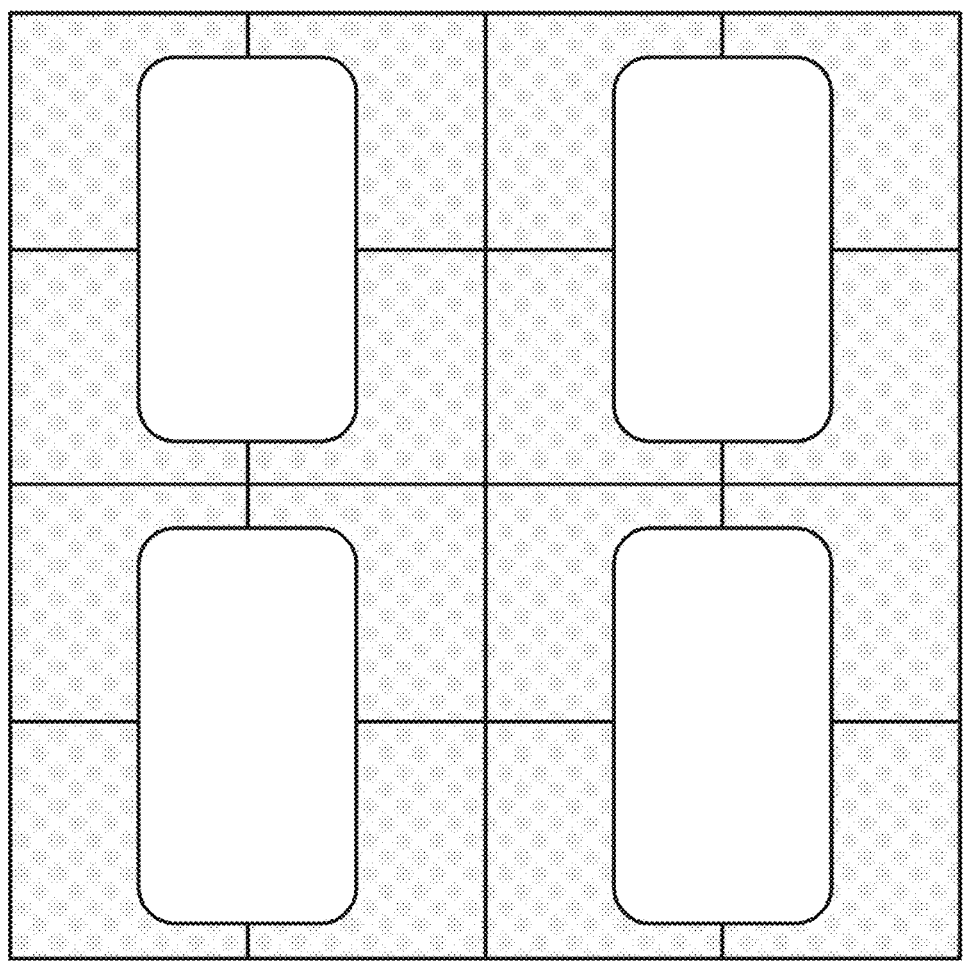
FIG. 32 shows an example mask design to implement such a configuration.

FIG. 31 shows another example sub-pixel layout according to an embodiment. In this configuration, the position of the TFTs and scan lines (shown in hashed shading) is changed for each row. As shown, the TFTs and scan lines may be disposed in the upper half of a sub-pixel for one row, and the lower half for the subsequent row. FIG. 32 shows an example mask design to implement such a configuration. Notably, each mask opening can evaporate 4 sub-pixels of the same color at the same time, halving both the vertical and horizontal resolutions. The change in the TFT and scan line position allows for an increase the vertical spacing between mask openings, as compared to the arrangement shown in FIG. 30.

Figure 33:
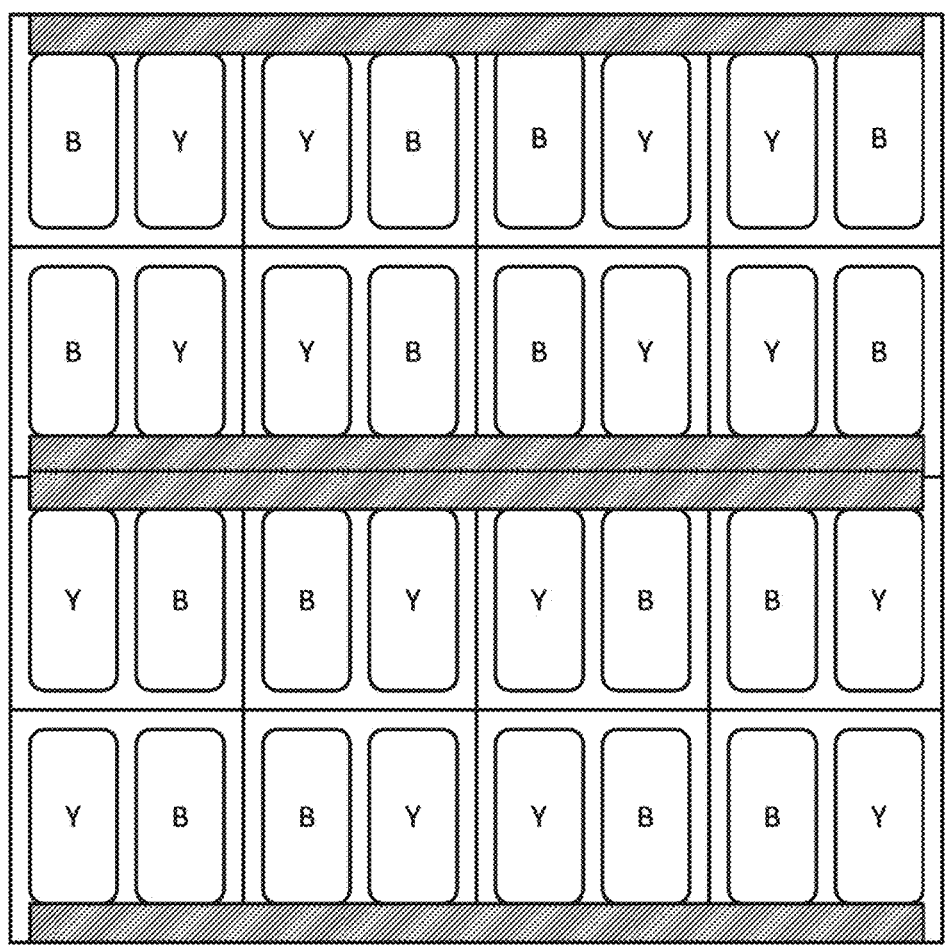
FIG. 33 shows another example of a staggered layout according to an embodiment.
Figure 34:
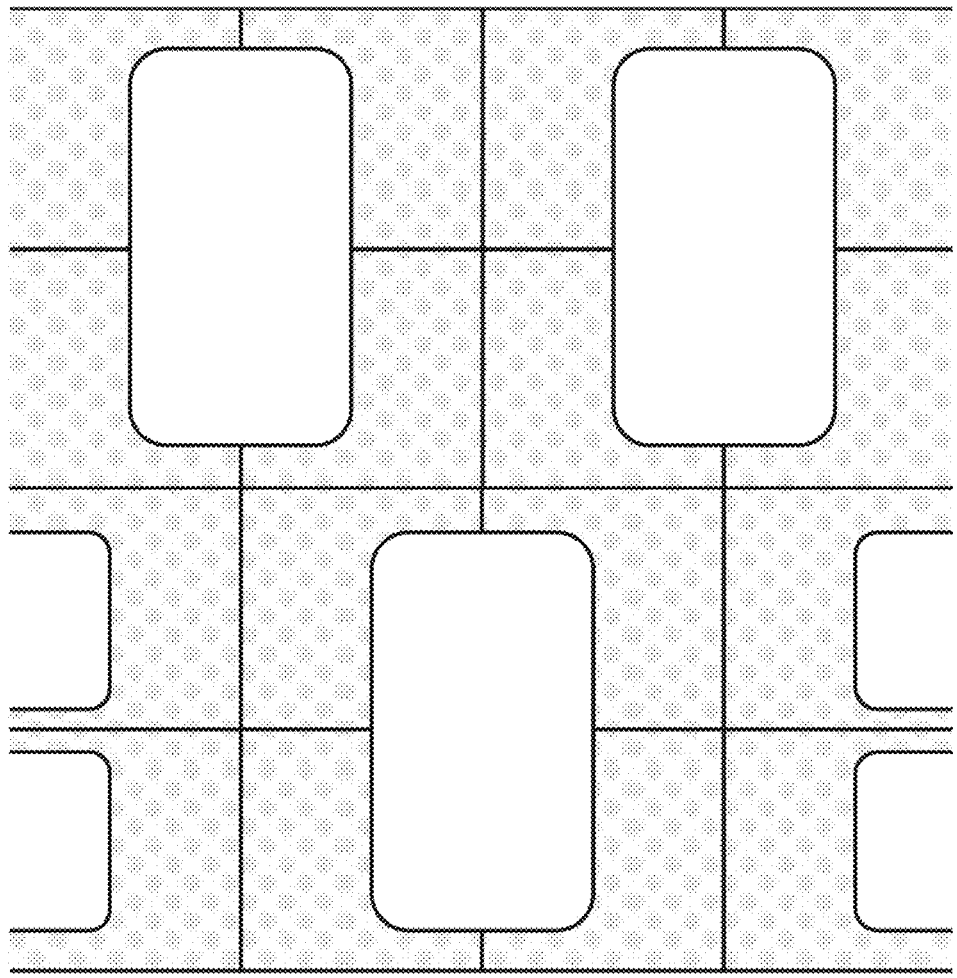
FIG. 34 shows example ask arrangement corresponding to the layout of FIG. 33.

FIG. 33 shows another example of a staggered layout according to an embodiment. FIG. 34 shows an example corresponding mask arrangement. The stagger in the mask openings leads to an even more rigid mask design, because no mask opening is directly parallel to another mask opening. A mask design as shown in FIG. 34 provides a pixelated mask resolution that is less than half the dpi resolution of an arrangement as shown in FIG. 28, at the same display resolution.

Figure 35:
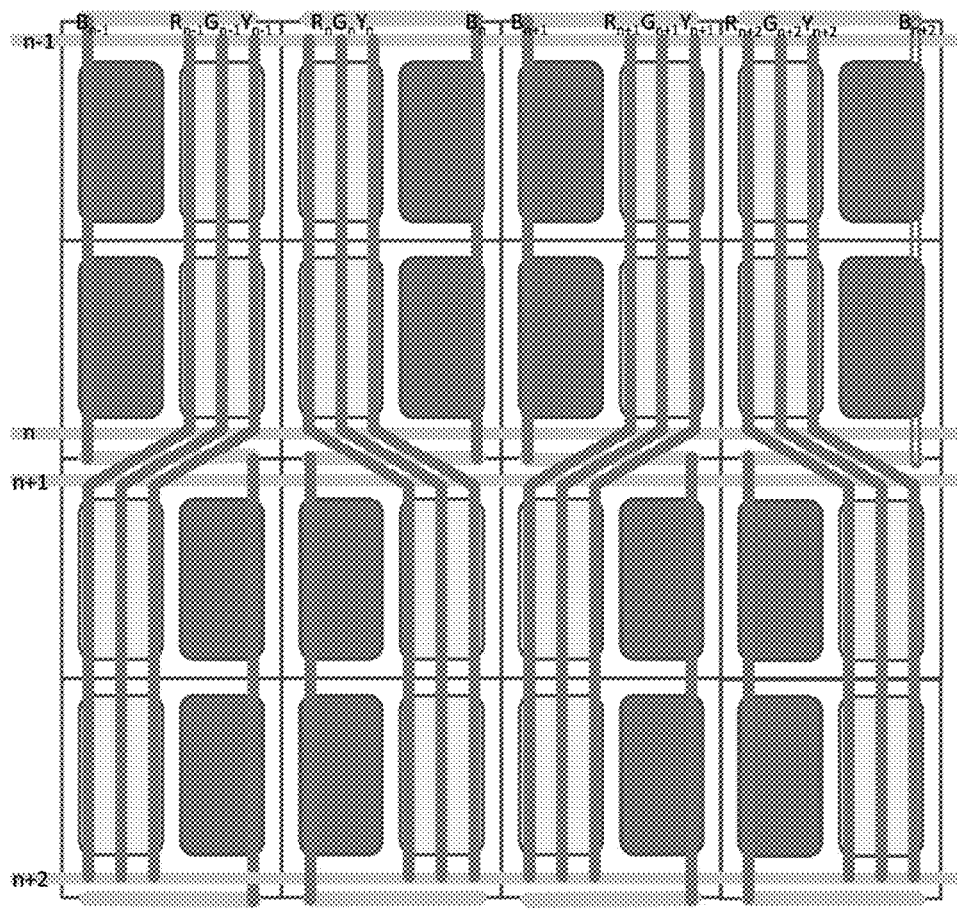
FIG. 35 shows an example of data line formation according to an embodiment.

FIG. 35 shows an example of data line formation according to an embodiment, in which scan line layers are arranged to allow for a staggered layout configuration as previously described. In this configuration, data lines of the staggered sub-pixels can be connected by using the underneath scan line layer.

FIG. 36 shows another example arrangement according to an embodiment. As shown, this arrangement include half the number of red and green sub-pixels relative to the number of yellow sub-pixels, but maintains the same area and number of blue sub-pixels to promote blue lifetime. In this configuration, each pixel only has three sub-pixels, as opposed to four as previously described. Such an arrangement may simplify the associated electrical design by reducing number of data drivers, and reduces the TFT area and the number of TFTs needed per pixel. This allows for improved aperture ratios and display performance. A configuration as shown in FIG. 36 may be advantageous due to the resolution of the eye peaking in the yellow region of the spectrum around 580 nm, and at lower values for red, green, and especially blue.

FIG. 37 shows a variation on the arrangement shown in FIG. 36 in which the blue and yellow sub-pixels may be deposited in pairs, thus allowing for larger openings in the pixelated mask. For example, a mask configured as shown in FIG. 30B may be used to deposit the arrangement shown.

In embodiments as previously described, yellow and blue emissive regions may serve as the main colors to drive the white point, allow for a more saturated red and green, and therefore higher color gamut display, than could be achieved with comparable power consumption using conventional arrangements. The use of a yellow emissive region allows for a high color gamut display with very saturated green and red, but without the typical higher power consumption that would be otherwise expected. Generally, the use of a yellow emissive region makes the display power consumption independent of the overall display color gamut.

Figure 38:
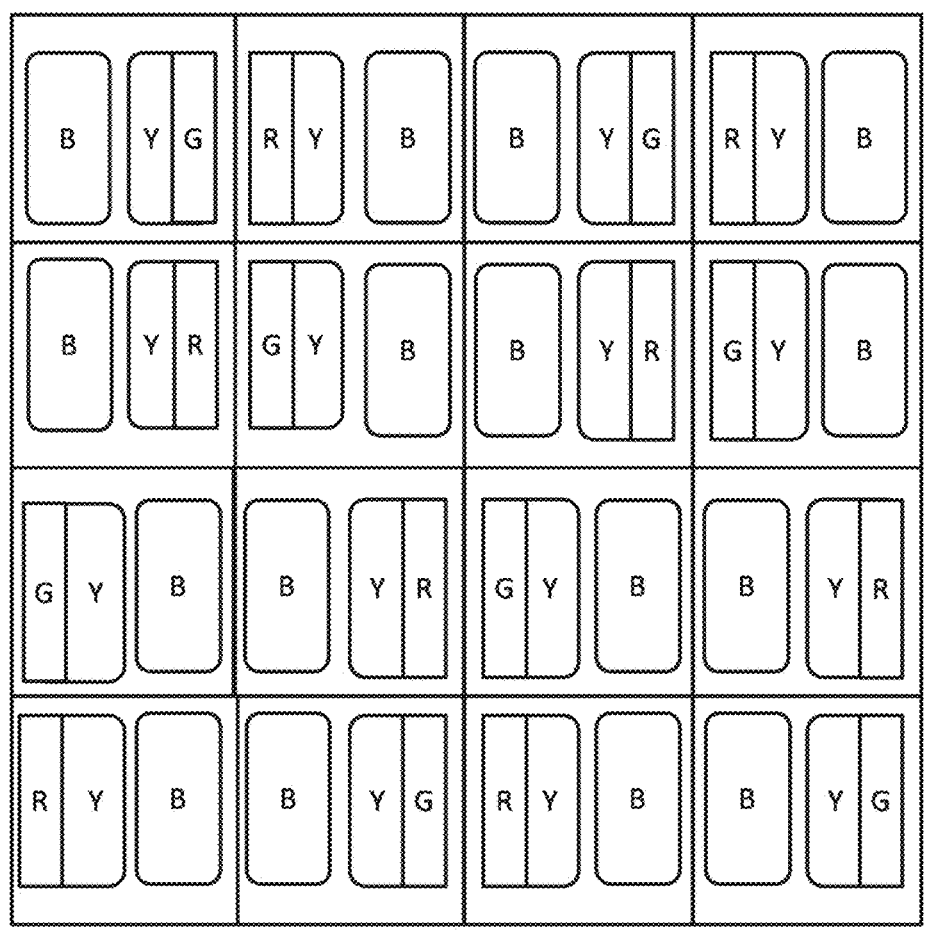
FIG. 38 shows another example arrangement according to an embodiment, in which each mask opening is used to deposit on 4 sub-pixels of the same color at the same time.

FIG. 38 shows another example arrangement according to an embodiment, in which each mask opening is used to deposit emissive material for 4 sub-pixels of the same color at the same time in four different pixels. Such a technique allows the mask resolution in both x and y direction to be half the display resolution, based on the number of openings in the mask relative to the number of pixels in the display. Each pixel has 3 sub-pixels, so the number of data lines and TFTs is not increased from a conventional display. An arrangement as shown in FIG. 38 may only require two depositions of OLED emissive material through the pixelated mask, such as blue and yellow as previously described. An additional masked deposition step may be performed for other layers, such as the HTL. Notably, although there are only two colors of emissive regions in the display, the display includes four primary colors (blue, yellow, green, and red in the illustrated example). As previously described, this may be achieved through the use of color altering layers disposed over portions of the yellow emissive regions to achieve red and green sub-pixels.

Figure 39:
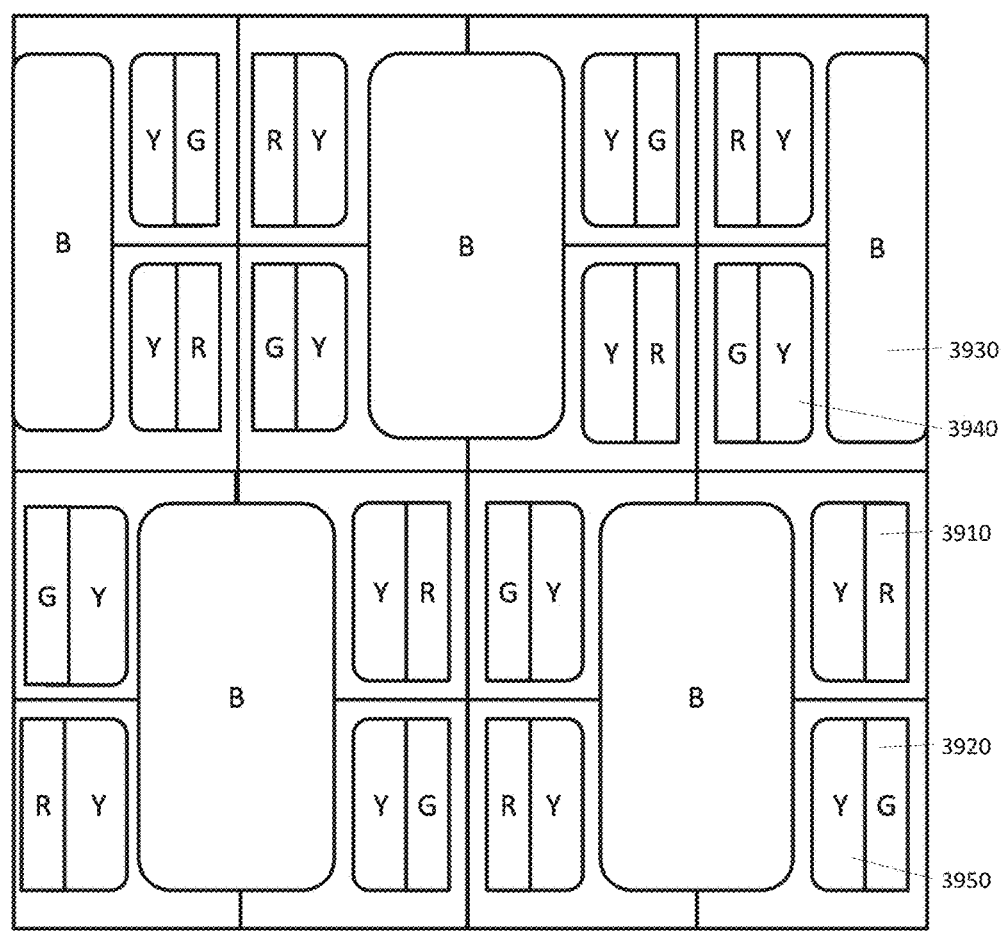
FIG. 39 shows an example arrangement according to an embodiment in which four neighboring blue sub-pixels are replaced by a single large sub-pixel, relative to the arrangement shown in FIG. 38, according to an embodiment.

FIG. 39 shows an example arrangement according to an embodiment in which four neighboring blue sub-pixels are replaced by a single large sub-pixel, relative to the arrangement shown in FIG. 38. Such a configuration may be used because the human eye typically has relatively low resolution for blue tight. As shown, the yellow sub-pixels may be placed closest to the blue sub-pixel. It may be preferred for the width of the large blue emissive regions to be reduced slightly, to allow for the yellow to be spaced approximately evenly one pixel spacing apart. Combining each cluster of four blue sub-pixels together into one large addressable sub-pixel also reduces the required number of data drivers and the number of data lines needed across the display. Thus, the pixel arrangement may include half as many red and green sub-pixels as yellow sub-pixels, and one-quarter the number of blue sub-pixels as yellow sub-pixels. The arrangement shown in FIG. 39 may be fabricated, for example, by using a mask as shown in FIG. 34. The mask resolution is half the display resolution in both x and y direction. In some configurations disclosed herein, a relatively large emissive region may provide sub-pixel functionality to multiple pixels. In such a configuration, the emissive region and associated structure or structures may be considered as providing a "partial" sub-pixel to one or more pixels. For example, where a relatively large blue emissive region is shared by, or used in conjunction with, sub-pixels in four pixels, the blue emissive region may be considered as providing ¼ of a blue sub-pixel to each pixel. Thus, in aggregate, the number of sub-pixels among pixels in a display or a region of a display may be less than the number of colors of sub-pixels in the display or the region of the display.

As previously described, various techniques may be used to convert conventional RGB data for display on an RGBY display, such as shown in FIG. 39 and other examples provided herein. Referring to FIG. 39 as an illustrative example, a layout 3950 of red sub-pixels 3910, green sub-pixels 3920, blue sub-pixels 3930, and yellow sub-pixels 3940 is provided. The yellow sub-pixels 3940 may be arranged such that they may be mapped to incoming pixel data in a one-to-one manner. That is, that the yellow component of RGBY data need not be subsampled in the SPR function 5630 described with respect to FIG. 56. Further, given this one-to-one relationship and the fact that the yellow sub-pixels may be used to provide maximum energy efficiency by metamer shifting as much energy from the red and green sub-pixels, which use relatively inefficient color altering layers, to the yellow sub-pixels, the yellow sub-pixels may be used to reconstruct most of the high spatial frequency image detail.

The red and green sub-pixels 3910, 3920 may be sub-sampled such that an input pixel is mapped to either a red or green sub-pixel, which are arranged in a checkerboard pattern as shown. As such, each red and green sub-pixel may be associated with a single yellow sub-pixel. The red and green sub-pixels may be sub-pixel rendered, sampling the R and G color channels of the RGBY data in the SPR function 5630 using a "diamond filter" such as:

| 0 | 0.125 | 0 |
|---|---|---|
| 0.125 | 0.5 | 0.125 |
| 0 | 0.125 | 0 |

Such a filter may appear to "blur" the resulting image, in which case it may be sharpened using a filter such as:

| −0.0625 | 0 | −0.0625 |
|---|---|---|
| 0 | 0.25 | 0 |
| −0.0625 | 0 | −0.0625 |

The blue sub-pixels may be mapped to four input pixels, thus the filter kernel is a two by two filter with each value multiplied by 25%:

| 0.25 | 0.25 |
|---|---|
| 0.25 | 0.25 |

In the examples provided, the filter kernel represents coefficients in an equation; the positions of the coefficients in each table represent the relative positions of the input pixels being resampled to the sub-pixel reconstructing them. The coefficients are multiplied by the value of the input pixel, then summed and used as the value of the reconstruction sub-pixel. Although described with respect to the example arrangement shown in FIG. 39, one of skill in the art will readily appreciate that similar or identical techniques may be used for the other pixel arrangements disclosed herein.

Figure 40:
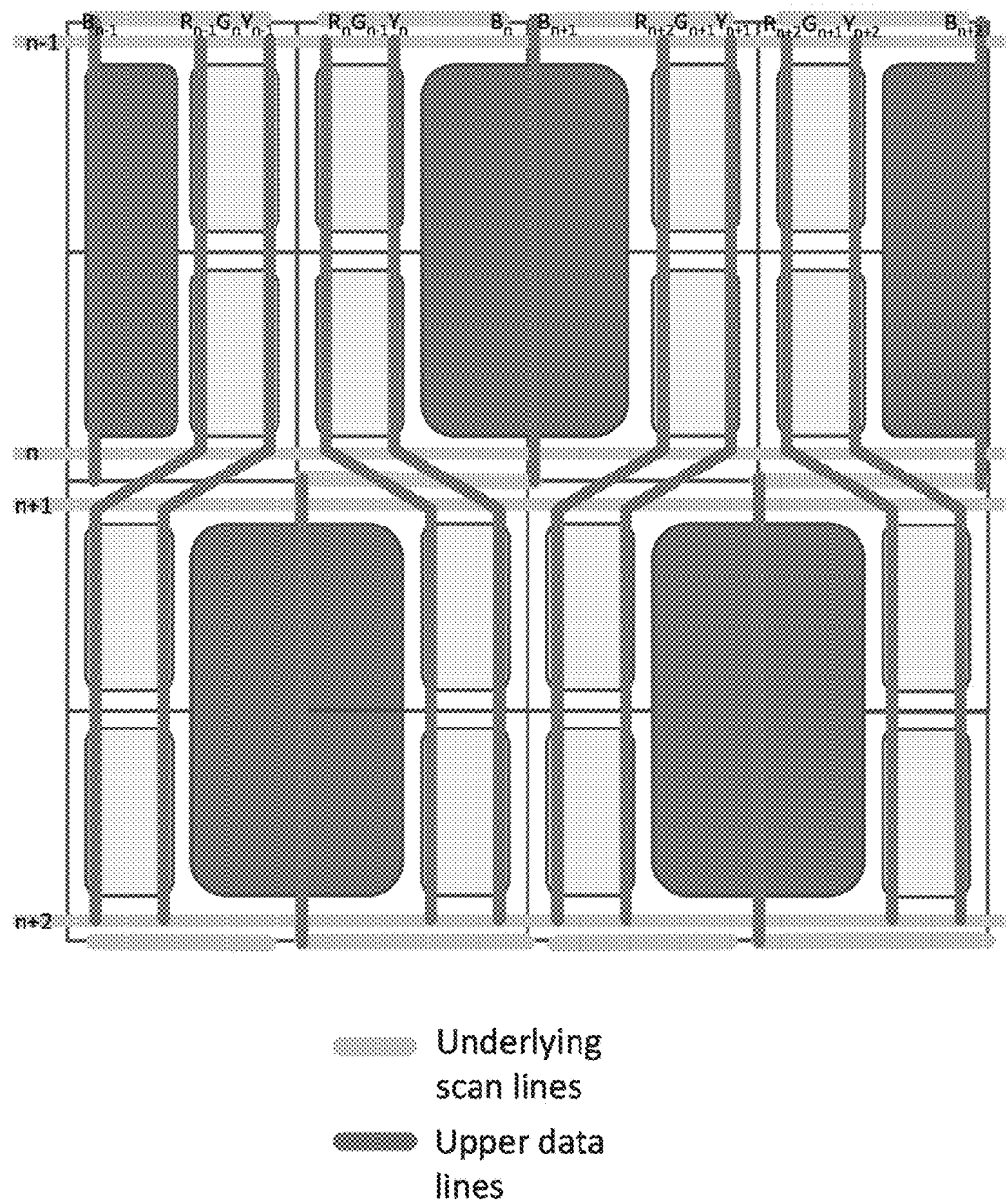
FIG. 40 shows an example arrangement of a scan and data line layout for the sub-pixel arrangement of FIG. 39 according to an embodiment.

FIG. 40 shows an example arrangement of a scan and data line layout for the sub-pixel arrangement of FIG. 39. Notably, the number of lines is significantly reduced relative to the arrangement shown in FIG. 35.

Figure 41:
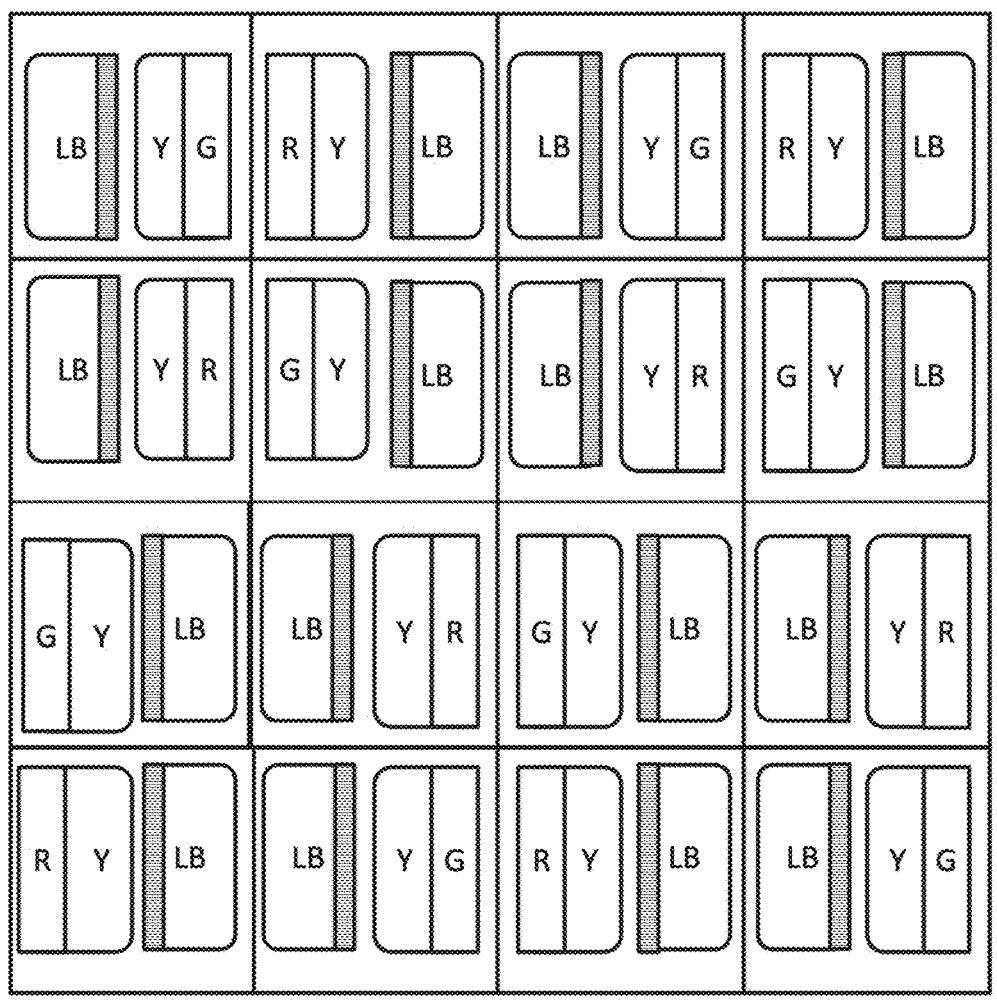
FIG. 41 shows an example RGB1B2Y arrangement according to an embodiment.

In some embodiments, it may be desirable to use three color filters, or two color filters and a microcavity, to achieve a full color display using a RGB1B2Y architecture, i.e., an architecture having red, green, deep blue, light blue, and yellow sub-pixels. In such an arrangement, light blue and yellow emissive regions may be deposited, for example using only two emissive material depositions through a pixelated mask as previously described. In this case, deep blue sub-pixels may be fabricated through the use of a color altering layer or a microcavity disposed in a stack with a portion of each light blue emissive region, shown by the horizontal hashing in FIG. 41. As with the arrangements shown in FIGS. 38-39, such an arrangement only requires two different OLED stack depositions, and can use a mask having half the resolution of the final display. Each pixel may include four sub-pixels, with the display as a whole including five primary colors of sub-pixels (deep blue, light blue, yellow, red, and green). An arrangement as shown in FIG. 41 may provide improved lifetime relative to conventional RGB displays, while having similar power requirements to conventional RGB displays. Notably, such an arrangement only uses a long-lifetime light blue emissive region, by using a color altering layer or microcavity to achieve deep blue sub-pixels, which typically is used for only a small fraction of the time of the light-blue sub-pixels. The table below shows simulation results for an arrangement in which a light blue emissive region is converted to deep blue using a color filter. The unfiltered device has a CIE of (0.15, 0.265) and the filtered device deep blue of (0.13, 0.057)

Bottom Emission BD377 (12% EQE BE Device):

| Range | 1931 CIE | Integrated radiance | Integrated luminance | Photon radiation | Lum. Eff cd/A |
|---|---|---|---|---|---|
| All | 0.151, 0.265 | 8.88 | 1998 | 2.21E+19 | 19.98 |
| <490 nm | 0.130, 0.057 | 4.48 | 289 | 1.05E+19 | 2.89 |
| Ratio | | 0.504 | 0.145 | 0.476 | 0.145 |

Figure 44:
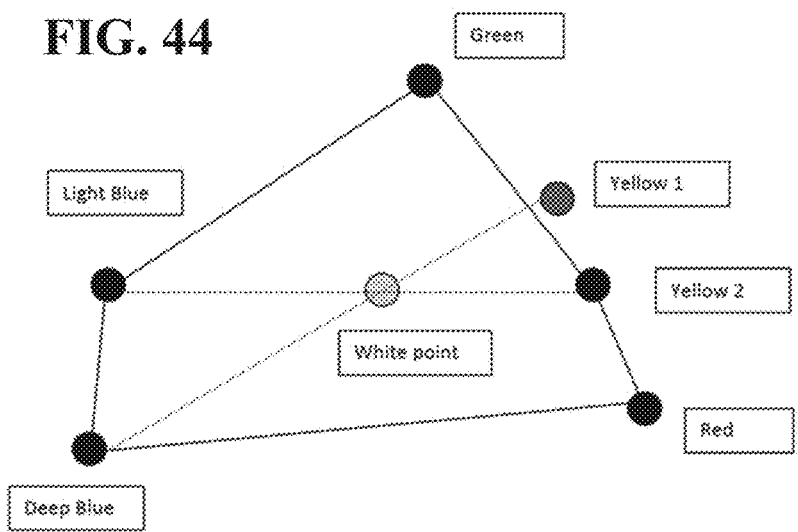
FIG. 44 shows red, green and blue points on a CIE chart and a desired yellow ("Yellow 1") according to an embodiment.

Previous arrangements achieved a desired white point through the use of deep blue and yellow emissive regions, as previously described. Referring to FIG. 44, a yellow suitable for use with a deep blue and yellow arrangement as previously described is labeled as Yellow 1. In a RGB1B2Y as described with respect to FIG. 41, implementation of a white point may be principally achieved by the light blue emissive region, and thus a more reddish yellow "Yellow 2", may be used to support the same white point. If the yellow emissive region is too reddish, it will not have a sufficient green component to make a reasonably efficient green when used with a color altering layer to achieve green sub-pixels as previously described. This implies a trade-off between a light blue emissive region not being so unsaturated that it requires too reddish a yellow to make a white point and therefore not have sufficient green, and the light blue being significantly less saturated than a deep blue, and therefore having improved lifetime. Simulations indicate that a preferred y coordinate of light blue for the RGB1B2Y architecture shown in FIG. 41 may be in the region of $0.15<y<0.20$, or $0.10<y<0.25$.

Figure 42A:
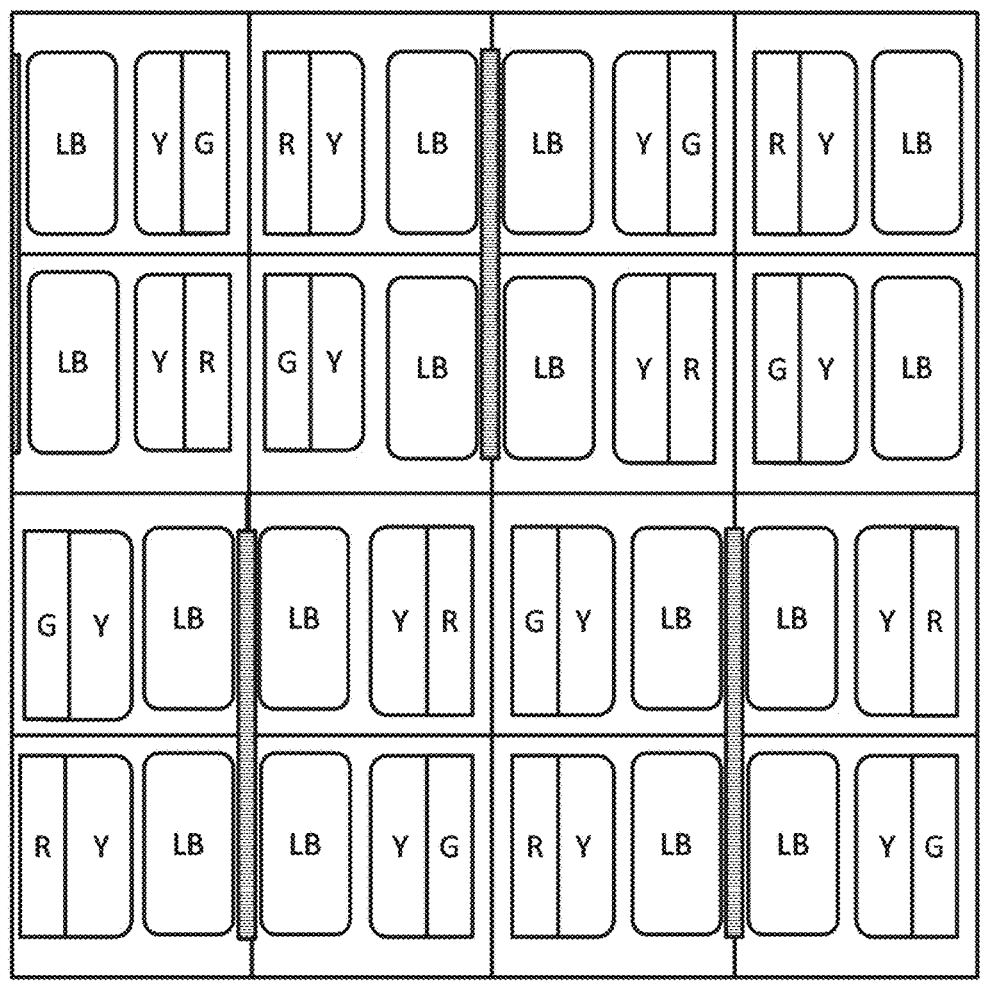
FIG. 42A shows an example variant of the arrangement in FIG. 41, in which four of the deep blue sub-pixels are replaced with a single large deep blue sub-pixel to be shared by four pixels according to an embodiment.

FIG. 42A shows an example variant of FIG. 41, in which four of the deep blue sub-pixels are replaced with a single deep blue sub-pixel to be shared by four pixels. This reduces the number of driving lines and TFT circuits per pixel from 4.0 to 3.25. The deep blue sub-pixels may be formed in what are non-emissive areas in FIG. 41, so as to not reduce the light blue aperture ratio and thus impact its lifetime. In this configuration, the deep blue sub-pixel may use the same light blue OLED deposition as the four neighboring light blue sub-pixels, but with an independently addressable anode. As previously described, the final deep blue emission may be achieved by using a color altering layer and/or a microcavity disposed over the light blue emissive material.

As another example, an arrangement as shown in FIG. 42A may be fabricated using only two high resolution masking steps using a pixelated mask as previously described. For example, depositions through a pixelated mask may be performed for the emissive layer material and for the hole transport layer material. In some cases, only a single high resolution mask deposition process may be used for only the emissive layer material. In contrast, a conventional process would require two OLED depositions (for example, for blue and yellow), and an additional masked deposition step for HTL deposition to increase the thickness of the HTL for the yellow sub-pixel relative to the blue sub-pixel.

As another example, the light blue emissive material may be evaporated over the entire display, and the yellow emissive material deposited through a pixelated mask over the yellow sub-pixels. In this case the emissive regions for the yellow devices would include a two-band blue and yellow emissive layer. As yellow emitters typically have lower energy than blue emitters, excitons in both the blue and yellow bands will transfer to the lower-energy yellow emitters, and only yellow light will be produced from the yellow emissive regions. The blue emissive layer emits light in the blue sub-pixels, but would act as an additional HTL in the yellow emissive regions. If the thickness of the blue EML provides the additional HTL thickness required to optimize the yellow sub-pixel, then no additional HTL masking may be required, allowing for the complete display to be fabricated with only one masking step. Similar to previous arrangements, such an architecture may require only one or two OLED emissive material depositions, and three or fewer masking steps (for OLED materials and the HTL). The mask may have half the resolution of the resulting display, and the display may have 3.25 sub-pixels per pixel. The display may include five primary color sub-pixels (deep blue, light blue, yellow, green, and red), with only two primary emissive region colors (light blue and yellow). Such a configuration may provide improved lifetimes and similar power consumption requirements relative to a conventional RGB display, while only requiring a relatively long-lifetime light blue as opposed to the deep blue typically required.

Figure 42B:
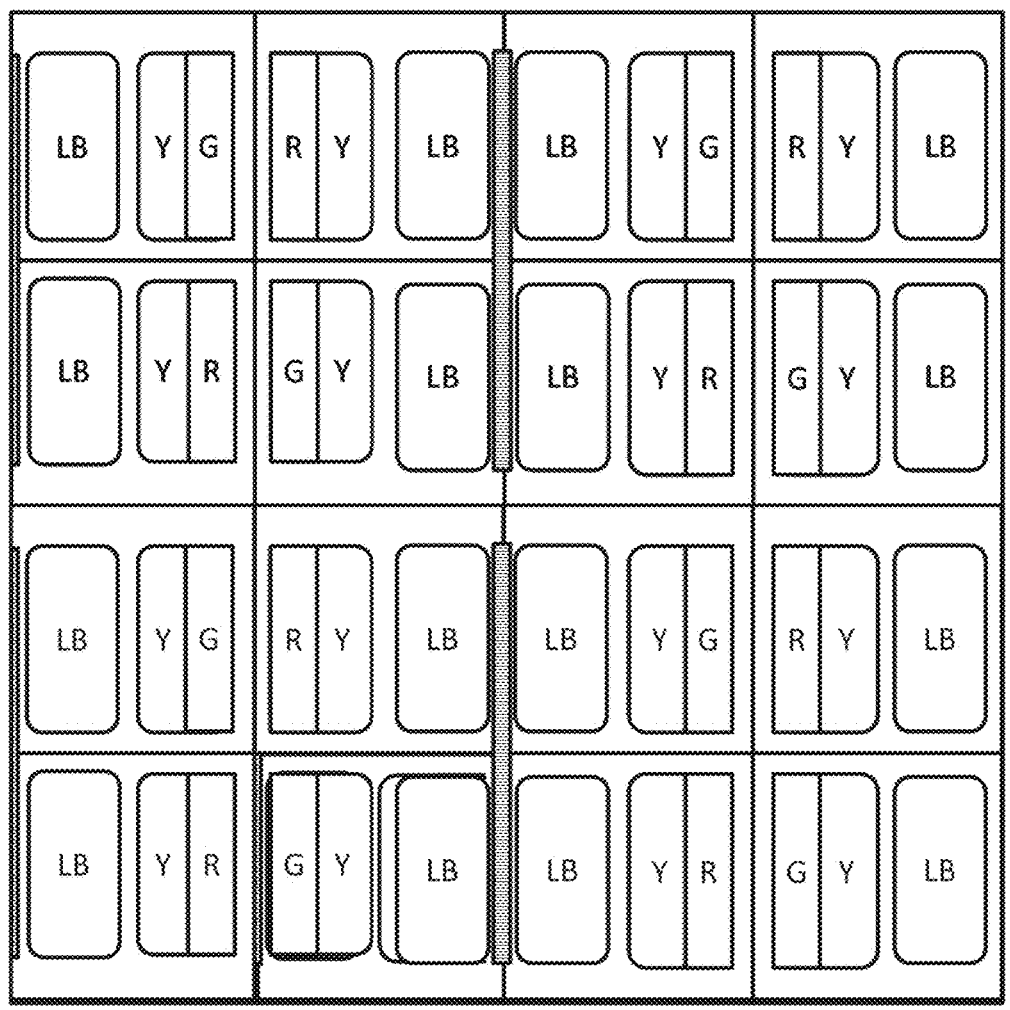
FIG. 42B shows an example arrangement similar to the arrangement of FIG. 42A, which may be more suited for efficient deposition via OVJP and similar printing techniques.

Arrangements disclosed herein also may be arranged so as to be fabricated more efficiently using specific deposition techniques. For example, an arrangement similar to the arrangement shown in FIG. 42A may be used to allow for efficient deposition by OVJP or similar techniques by arranging the various emissive regions and/or sub-pixels in columns. FIG. 42B shows an example arrangement suitable for efficient deposition via OVJP.

Figure 43:
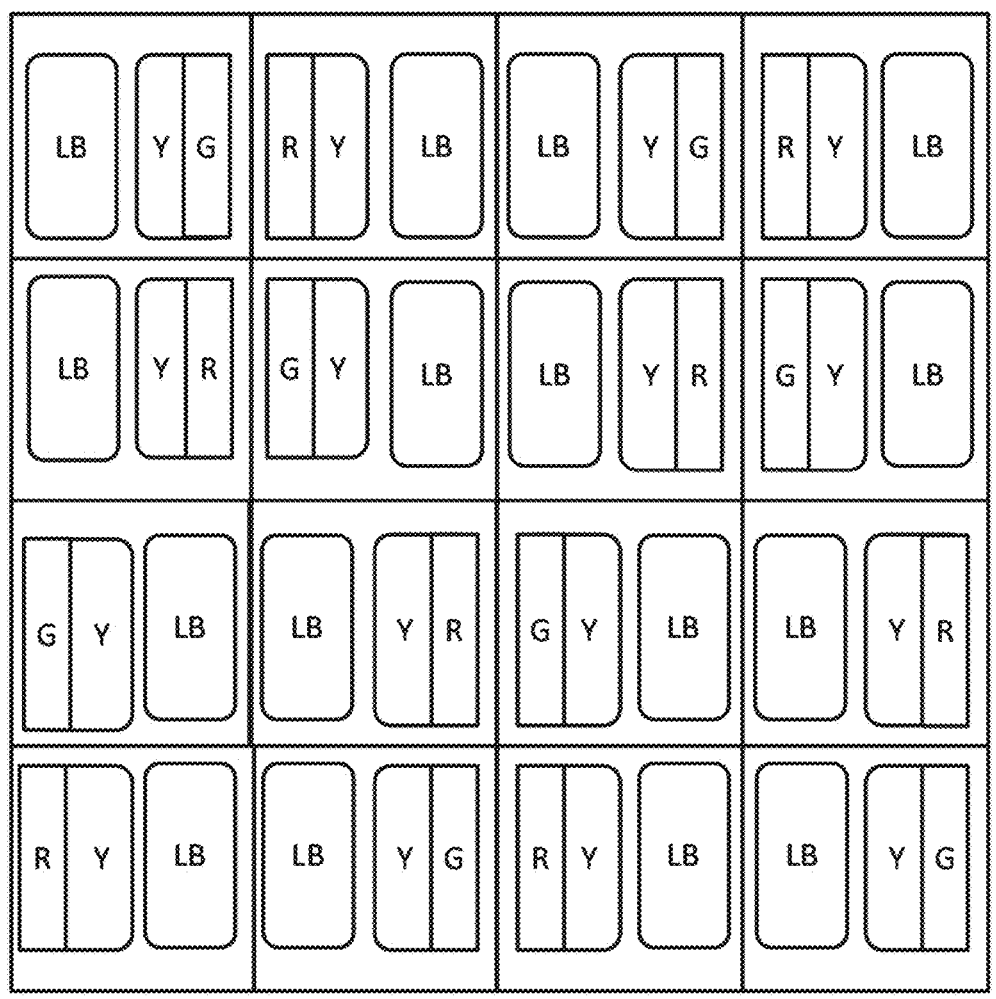
FIG. 43 shows a configuration according to an embodiment, which may be suitable for wearable devices and similar applications.

FIG. 43 shows a similar configuration according to an embodiment, which may be suitable for wearable devices and similar applications, in which typical usage may not require a high color-temperature white point, such as D65 or greater. For applications where a yellowish white (e.g. D30 or D40) is acceptable, the dark blue sub-pixel may be omitted entirely, thus simplifying the display to only 3 sub-pixels per pixel.

Figure 45:
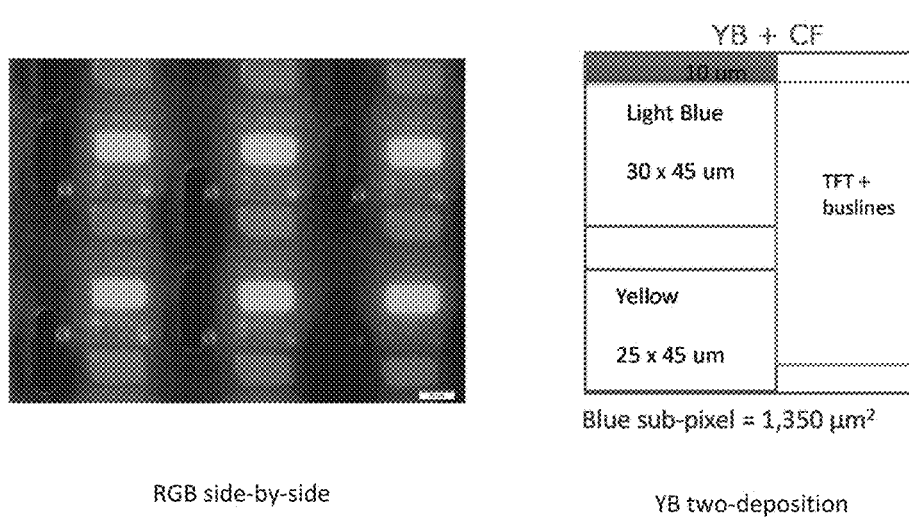
FIG. 45 shows a comparison of an example conventional RGB side-by-side pixel layout to an arrangement as disclosed herein that uses only two OLED emissive region depositions.

FIG. 45 shows a comparison of an example conventional RGB side-by-side pixel layout to an arrangement as disclosed herein that uses only two OLED emissive region depositions. Because most conventional display deposition approaches typically use patterning techniques to deposit individual colors, a spacing is required between sub-pixels of different colors to avoid color mixing. In contrast, because embodiments disclosed herein only require one spacing between sub-pixels of different color per pixel (as opposed to three in a conventional pixel architecture), the fill factor for each sub-pixel can be much higher. FIG. 45 shows an example for a 280 dpi display where the example two-deposition arrangement approximately doubles the blue sub-pixel fill-factor relative to the conventional arrangement. The example shows a 90 μm pixel, with 25 μm between active OLEDs, and assumes that TFTs and buslines occupy 45 μm horizontally.

Figure 46:
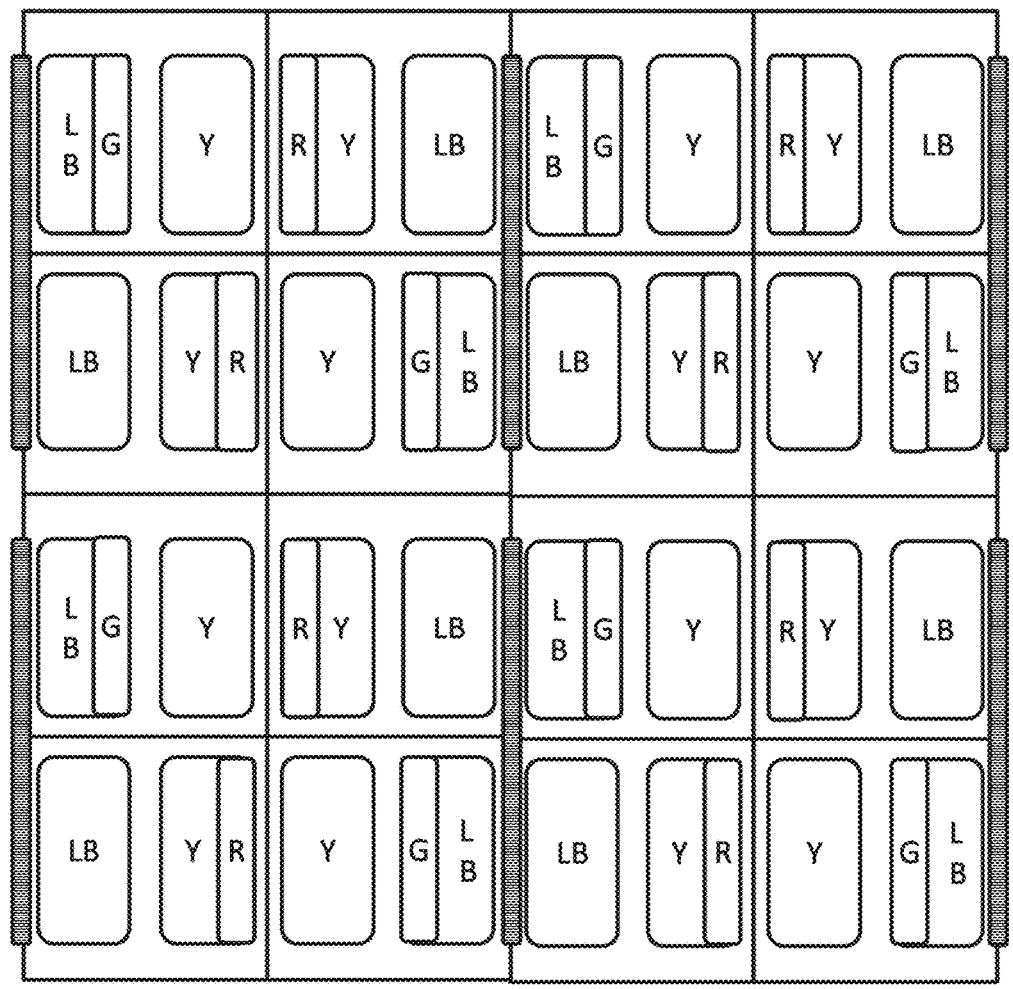
FIG. 46 shows an example arrangement according to an embodiment in which a green color altering layer is disposed over a light blue ("LB") sub-pixel.

The examples described above include arrangements in which various color altering layers are disposed over a yellow emissive region to provide various colors of sub-pixels. However, other arrangements may be used according to embodiments disclosed herein. For example, FIG. 46 shows an example arrangement according to an embodiment in which a green color altering layer, such as a color filter, is disposed over a light blue ("LB") emissive region to provide a green sub-pixel. The use of a light blue emissive region in combination with a green color altering layer may provide deeper green color saturations relative to other embodiments in which a green color altering layer is disposed over a yellow emissive region. A configuration as shown in FIG. 46 also may allow for a greater red color saturation, and/or a higher red efficiency, because the yellow emissive region may be designed to match the light blue white point, without the constraint of matching the green color altering layer as well. Other arrangements also may be used, such as other patterns of red, green, light blue, deep blue, and yellow, in which the red and green sub-pixels are provided using other combinations of color altering layers such as color filters.

Notably, the examples shown in FIGS. 37-43, 46-47, and similar arrangements may include only a single color transition among emissive regions in a horizontal and/or vertical direction between each sub-pixel in any pixel in the arrangement and each adjacent sub-pixel, regardless of whether the adjacent sub-pixel is in the same pixel or an adjacent pixel. That is, the emissive region of each sub-pixel may be adjacent to either the same color emissive region (e.g., adjacent red and green sub-pixels, when both are formed from a yellow emissive layer with red and green color altering layers), or to one other color emissive region. However, in each other horizontal and/or vertical direction within the display, each sub-pixel may be adjacent to other sub-pixels that have the same color emissive region. The horizontal and vertical directions may refer, for example, to the scan and/or data line layout directions within a display. Thus, for staggered layouts as previously described, there may be only a single color transition among emissive regions of adjacent pixels in one direction, but not in a perpendicular direction. The feature of having a single color transition within a pixel refers to the emissive regions within sub-pixels, not to the ultimate color emitted by the sub-pixels, since adjacent sub-pixels may include one or more color altering layers while still having a common emissive region or the same color emissive region within the sub-pixels.

Figure 47:
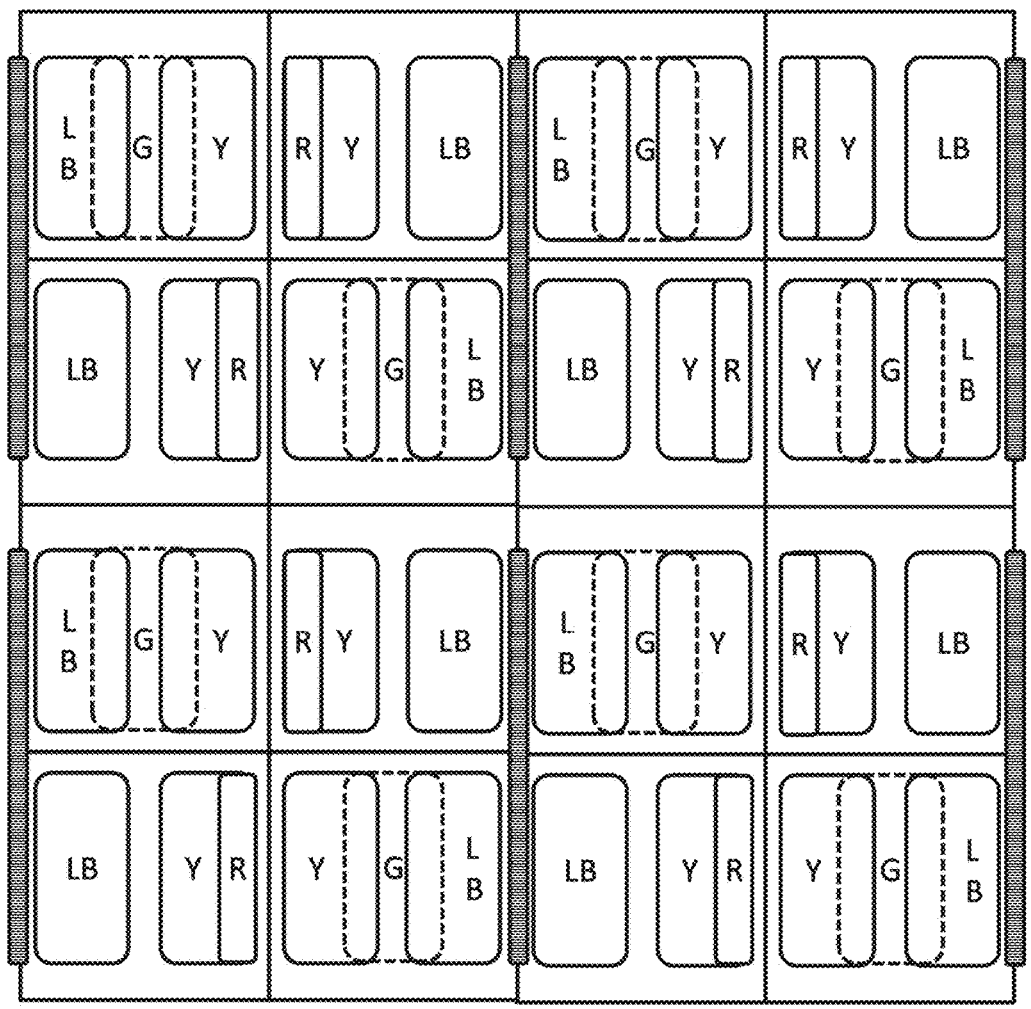
FIG. 47 shows an arrangement according to an embodiment in which a green color altering layer is disposed over both the light blue and yellow emissive regions to produce the green sub-pixel according to an embodiment.

As another example, FIG. 47 shows an arrangement according to an embodiment in which a green color altering layer, such as a color filter, is disposed over both the light blue and yellow emissive regions to produce the green sub-pixel. As with the example shown in FIG. 46, an arrangement as shown in FIG. 47 may provide a deeper green color saturation for the green sub-pixel, and/or a deeper red color saturation for the red sub-pixel since the light blue white point need not be matched to the green color altering layer as well as the red sub-pixel. Other similar arrangements may be used, such as where red, green, and/or deep blue are provided via color altering layers.

Figure 48:
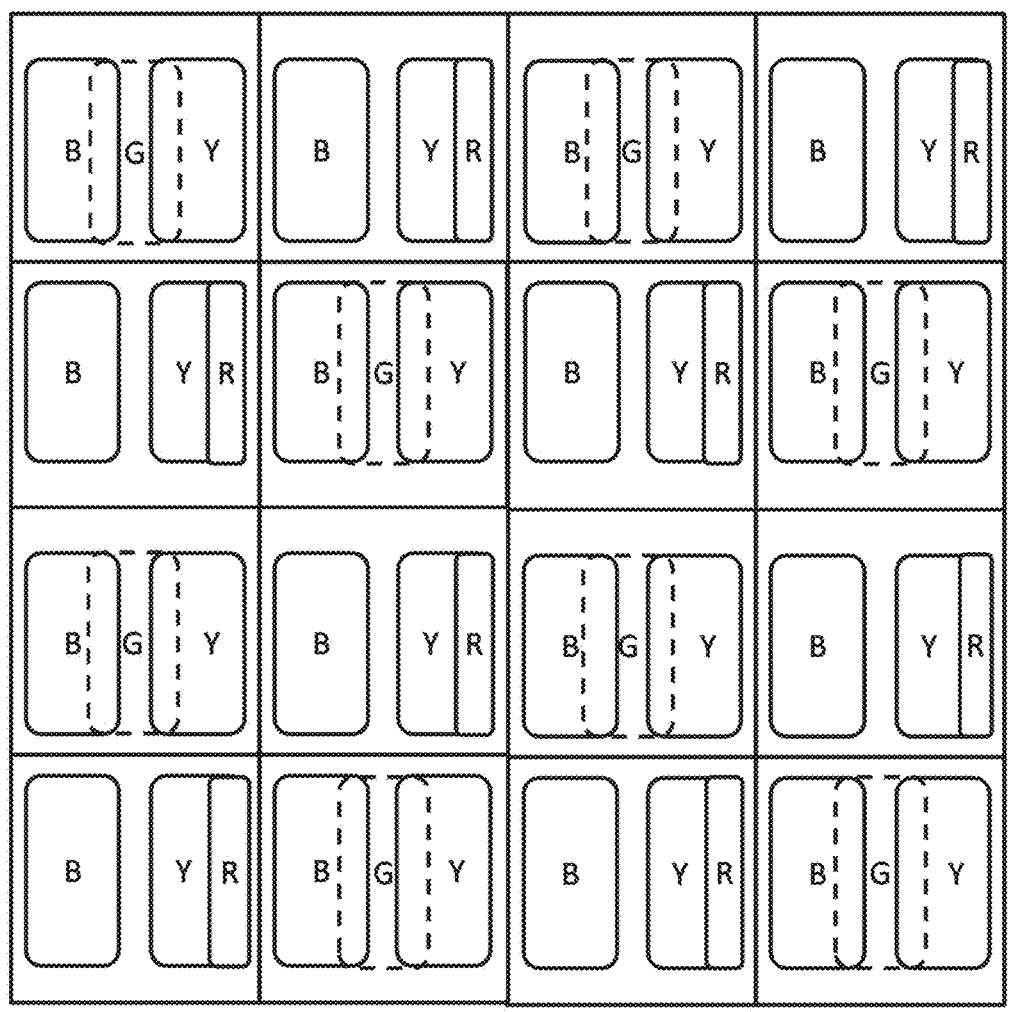
FIG. 48 shows an arrangement according to an embodiment in which a green color altering layer is disposed over deep blue and yellow emissive regions.

As another example, FIG. 48 shows an arrangement according to an embodiment in which a green color altering layer is disposed over deep blue and yellow emissive regions, i.e., a deep blue emissive region is used instead of light blue as shown in FIG. 47. Such an arrangement may provide the same or similar benefits as described with respect to FIG. 47.

Figure 49:
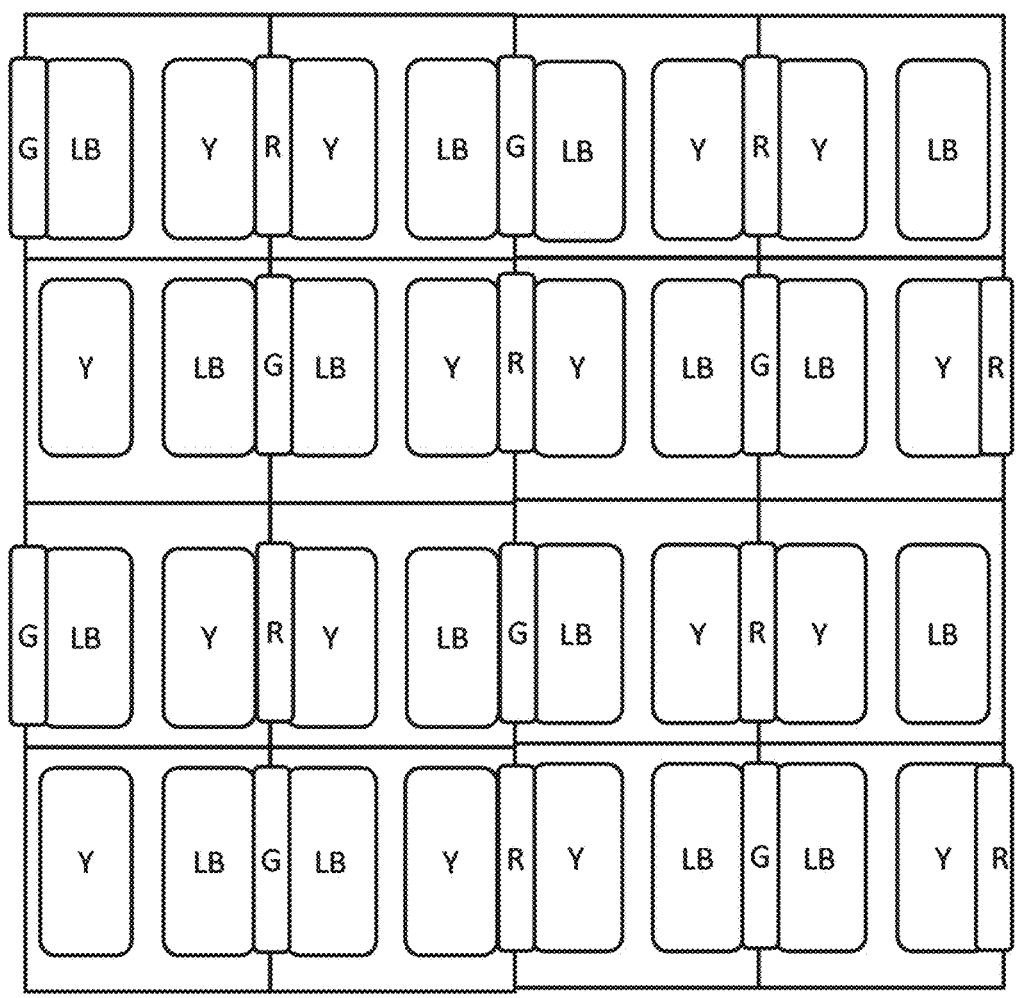
FIG. 49 shows an example arrangement according to an embodiment in which the display requires only 3 TFT circuits per pixel, and in which no deep blue sub-pixels are present.

As previously described, in some applications it may be desirable or acceptable to forego the use of a deep blue sub-pixel, such as for limited displays where a full color gamut is not required. For example, small, portable, and/or wearable displays may not require a deep blue sub-pixel to achieve an acceptable color output range. FIG. 49 shows an example arrangement according to an embodiment in which the display requires only 3 TFT circuits per pixel, and in which no deep blue sub-pixels are present.

Figure 50:
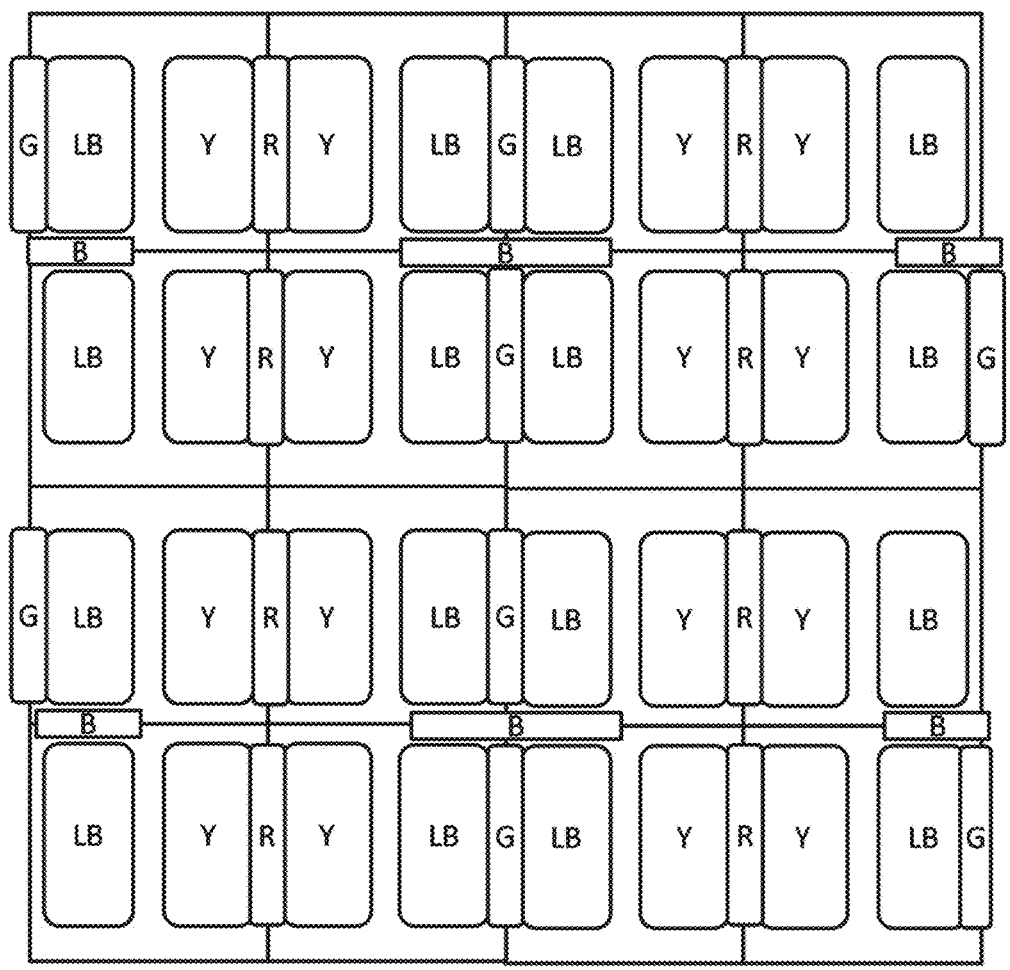
FIG. 50 shows an example arrangement in which a green color altering layer is disposed over a light blue emissive region to provide the green sub-pixel according to an embodiment.
Figure 51:
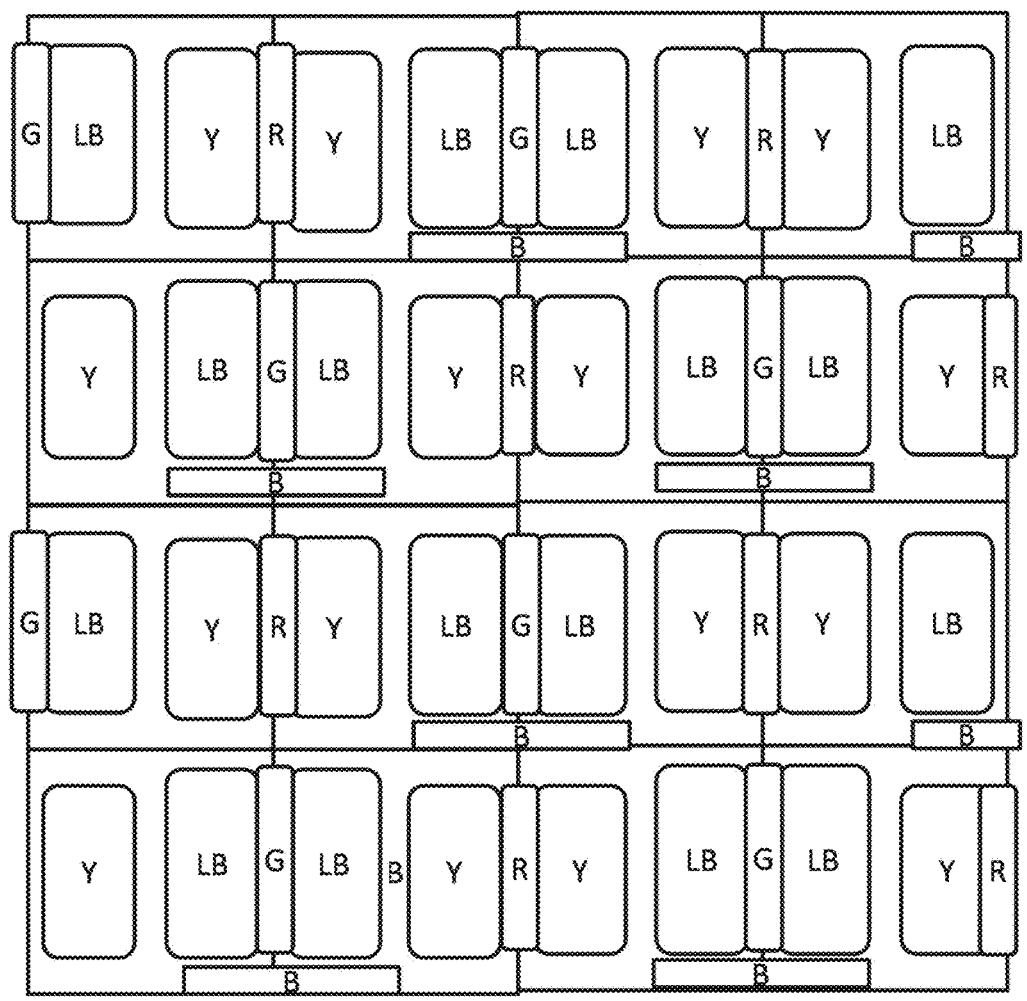
FIG. 51 shows another example according to an embodiment in which a green color altering layer is disposed over a light blue emissive region to provide a green sub-pixel.

In some cases, it may be desirable to use both light blue and deep blue sub-pixels in combination, using various combinations of two colors of emissive regions and various color altering layers as previously described. FIG. 50 shows an example arrangement in which a green color altering layer is disposed over a light blue emissive region to provide the green sub-pixel, and which includes deep blue and light blue sub-pixels. As previously described, the deep blue sub-pixels may be provided through the use of a color altering layer and/or a microcavity disposed over a portion of the light blue emissive region. FIG. 51 shows another example according to an embodiment in which a green color altering layer is disposed over a light blue emissive region to provide the green sub-pixel, and which includes deep blue and light blue sub-pixels, with a different sub-pixel arrangement compared to FIG. 50.

Embodiments disclosed herein may be fabricated using a variety of techniques. For example, a pixel or pixel arrangement in a full-color OLED display may be fabricated using a pixelated mask, such as shown in and described with respect to FIGS. 28-51. Each opening in the pixelated mask may have an area at least equal to the combined area of two, three, or more of the sub-pixels that are to be deposited through the mask. Similarly, the mask may have a total area of at least the combined area of two sub-pixels of different colors of light produced by the display. In some embodiments the mask openings may be relatively small compared to the total area of the mask, such as not more than 5%, 10%, 20%, or the like.

A common emissive material to be used in multiple emissive regions and/or sub-pixels may be deposited through the mask, such that the sub-pixels are arranged adjacent to one another on the substrate. The common emissive material may be a material that is to be used to form multiple stacks within sub-pixels that are addressed as separate and different pixels. As previously disclosed, some embodiments may include no more than two colors of emissive regions, i.e., they can be fabricated using only two OLED depositions through the pixelated mask. For example, as described with respect to FIGS. 28-51, some embodiments may include only blue and yellow, or light blue and yellow, emissive regions.

As previously described, multiple sub-pixels may be fabricated using a single emissive region or adjacent emissive regions, such as by fabricating one or more color altering layers over the emissive region. For example, red, green, and/or deep blue color altering layers may be disposed over yellow and/or light blue emissive regions. In some configurations, a portion of an emissive region may be left unaltered, i.e., no color altering layers may be disposed over or otherwise optically coupled to the emissive region. For example, a yellow emissive region may be optically coupled to a red color altering layer and to a green color altering layer, with the respective portions of the yellow emissive region being separately addressable. A portion of the yellow emissive region also may be left unfiltered so as to provide yellow light, as previously described. More generally, any emissive region that provides emission capable of being converted to one or more other colors may be used.

In some embodiments, multiple color depositions may be performed. For example, an additional emissive layer may be deposited through the pixelated mask, such as to form additional emissive regions in staggered configurations as previously described. The emissive material deposited may be any suitable color, such as yellow, deep or light blue, magenta, cyan, or any other color achievable with organic emissive materials.

In some embodiments, not more than two colors of color altering layers may be used. For example, as previously described, in some configurations only red and green color altering layers are used.

Embodiments disclosed herein may allow for relatively very high-resolution displays and similar devices, due to the efficiency with which sub-pixels may be fabricated and arranged on a substrate. For example, in an embodiment an OLED display may include multiple pixels, each of which includes at least or exactly two OLED emissive material depositions of different colors disposed adjacent to one another over a substrate, as previously described. Such a display may have a resolution of 500, 600, 700, or 800 dpi, or any resolution therebetween.

As previously described, embodiments disclosed herein may allow for the use of pixelated masks that may be much more physically robust than conventional fine metal masks, due to the increased distance between mask openings that can be used. For example, as shown in FIGS. 29-39 and as described elsewhere herein, the distance between adjacent openings in the pixelated mask may be at least twice the distance between adjacent emissive regions of a common color in the display. That is, the distance between adjacent openings in a pixelated mask, measured parallel or perpendicular to a scan or data line in the final device defined by the mask, may be at least twice the distance between adjacent emissive regions of a common color, measured along the same direction. Thus, although devices disclosed herein may have relatively high fill factors and resolutions, the masks used to fabricate the devices may have a relatively large amount of "unused" space, i.e., mask area that does not contain mask openings.

As previously described, in some embodiments it may be desirable to use a microcavity to achieve one or more colors of sub-pixels, such as where a microcavity is disposed over a portion of a light blue emissive region to provide a deep blue sub-pixel. As another example, green sub-pixels as disclosed herein may include a microcavity as an alternative or in addition to the color altering layers previously described, to increase the saturation of the green sub-pixel. Once an OLED is formed in a cavity, the optical path length between the anode and cathode has a very strong effect on the OLED efficiency and performance. Further modeling indicates that additional HTL thickness may be desirable in a stack with the yellow emissive region relative to the blue emissive region, in embodiments disclosed herein that have only blue and yellow emissive regions, to allow for green and/or blue microcavity designs.

For example, it may be desirable to have different HTL thicknesses for the blue emissive region deposition compared to the yellow deposition in configurations that use blue and yellow emissive regions. This may require an additional pixelated mask deposition step. Thus, in some embodiments, three masking steps may be used two for EML deposition and one for HTL deposition. In contrast, a similar configuration would require five masking steps to fabricate a conventional top-emission RGB side-by-side device (3 for EML deposition and 2 for HTL deposition). As another example, an additional HTL may be patterned on the yellow pixel as compared to the blue. More generally, an electrode may be superposed with the two emissive regions, i.e., one being optically coupled to a microcavity, and the other not. When the distance between a selected surface of the electrode and the one emissive region is measured in a direction normal to the electrode, it may be shorter than the distance measured between the same surface and the other emissive region, measured in the same direction.

Figure 52:
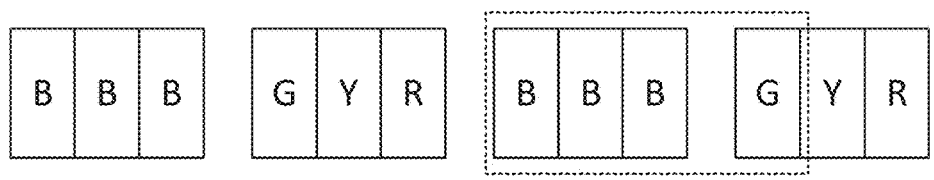
FIG. 52 shows an example schematic pixel layout according to an embodiment.
Figure 53:
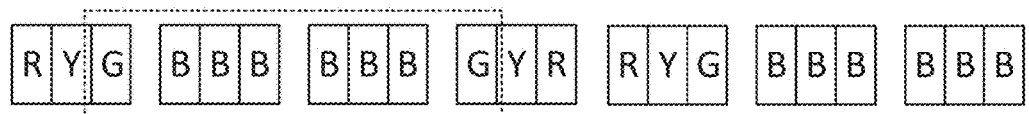
FIG. 53 shows an example schematic pixel layout according to an embodiment.

As another example, in an embodiment an additional HTL may be deposited on yellow and red sub-pixels, and the blue and green sub-pixels may be the same HTL thickness. In such a configuration, the green sub-pixel may be disposed adjacent to the neighboring blue sub-pixel. That is, the portion of the yellow emissive region that is used for the green sub-pixel may be disposed adjacent to the blue sub-pixel of an adjacent pixel. To avoid configurations having two yellow sub-pixels adjacent to each other, the yellow unfiltered sub-pixel may be disposed in between the red and green, as shown, for example, in FIG. 52. A similar arrangement is shown in FIG. 53, for a configuration in which a mask of half the resolution is used, and the blue sub-pixels are grouped, as previously disclosed. The dashed lines in FIGS. 52 and 53 show the HTL masking for cavity fabrication as disclosed herein.

As previously described, when a microcavity is used in an OLED stack, it may change the color output, such as the yellow output, of the stack. According to embodiments disclosed herein, it may be preferred for a yellow sub-pixel to have a color output that lies on a straight line defined by the blue sub-pixel and the desired white point of the device. This is illustrated by FIG. 44, which shows red, green and blue on a CIE chart, and shows a desired yellow ("Yellow 1") as lying on the line connecting the deep blue to the desired white point. This criteria generally results in a minimum overall display power consumption and, in an embodiment, is a preferred mode of operation. Thus, in an embodiment, it may be desirable for a region or sub-pixel coupled to a microcavity to be configured to emit light having 1931 CIE coordinates that lie on a straight line with a selected white point and the coordinates of light emitted by yellow sub-pixels. More generally, it may be advantageous for the region or sub-pixel to emit light having 1931 CIE coordinates that lie within (+/−0.02, 0.02) of any point on a straight line between the CIE coordinates of light emitted by the other region being used to set the selected white point. In some configurations, it may be desirable for the white point itself to lie within a 1-step, 3-step, or 7-step MacAdams ellipse of the Plankian Black Body Locus on the 1931 CIE diagram between the yellow emission and the blue emission.

Figure 54:
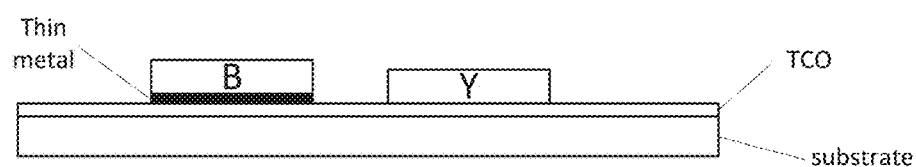
FIG. 54 shows an example device arrangement according to an embodiment, in which a thin metal layer is disposed above a TCO layer.

Another consideration for configurations that include a microcavity is that a microcavity typically causes OLEDs to appear as different colors for different viewing angles, such that the observed output color shifts with viewing angle. This is generally not desirable. However, in many cases the blue color required for a saturated deep blue cannot be easily achieved through just emitter design alone. Often in conventional designs an emitter is selected which has good efficiency and lifetime, and which has a blue but not deep blue output, and then a microcavity is used to produce a very deep blue color. This is especially true for televisions and similar applications where high color gamuts are desired. So while it may be desirable to place the blue sub-pixel within a microcavity, it may not be desirable to place the yellow, green and/or red sub-pixels within microcavities, as this will lead to undesirable color shifts with viewing angle. However, it has been observed that with increasing angle from the perpendicular, reds and greens shift to shorter wavelengths of light, which can cause a blue haze in the white point when viewed off-angle. Thus, in some embodiments, the blue sub-pixel may be placed in a microcavity, whereas the yellow sub-pixel is placed in a non-cavity stack, such as a bottom emission design. More generally, embodiments may include one emissive region or sub-pixel that is placed in or otherwise optically coupled to a microcavity, and another that is not. In an embodiment, a bottom emission OLED stack may be used in conjunction with a reflective cathode and a transmissive anode using a transparent conductive oxide (TCO). A thin metal may be disposed either below or above the TCO, with or without an insulating spacers between the TCO, metal, and OLED stack, such that the thin metal at the anode, in conjunction with the reflective cathode, forms a microcavity. FIG. 54 shows an example schematic representation according to an embodiment in which a thin metal layer is disposed above the TCO with no spacer layers for the blue sub-pixel, and no thin metal is disposed between the yellow sub-pixel and the TCO. Thus, the resulting device includes a microcavity for the blue sub-pixel, and allows for no microcavity for the yellow, red and green emission. Such a configuration may provide a high color gamut and minimal or no change in color with viewing angle, as there will be little or no color shift in the red, green or yellow with viewing angle.

Figure 55:
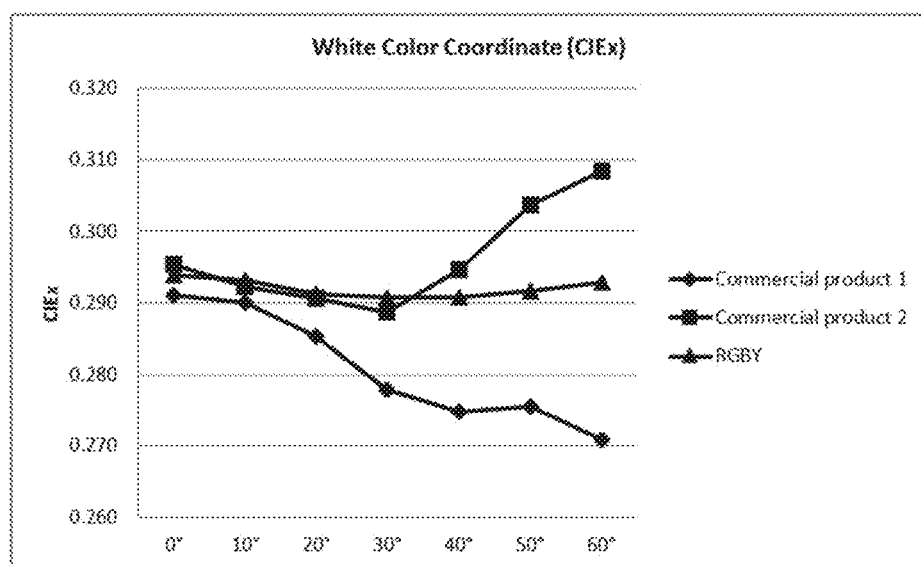
FIG. 55 shows simulation data for an embodiment including blue and yellow emissive regions, with the blue region coupled to a microcavity.
Figure 55:
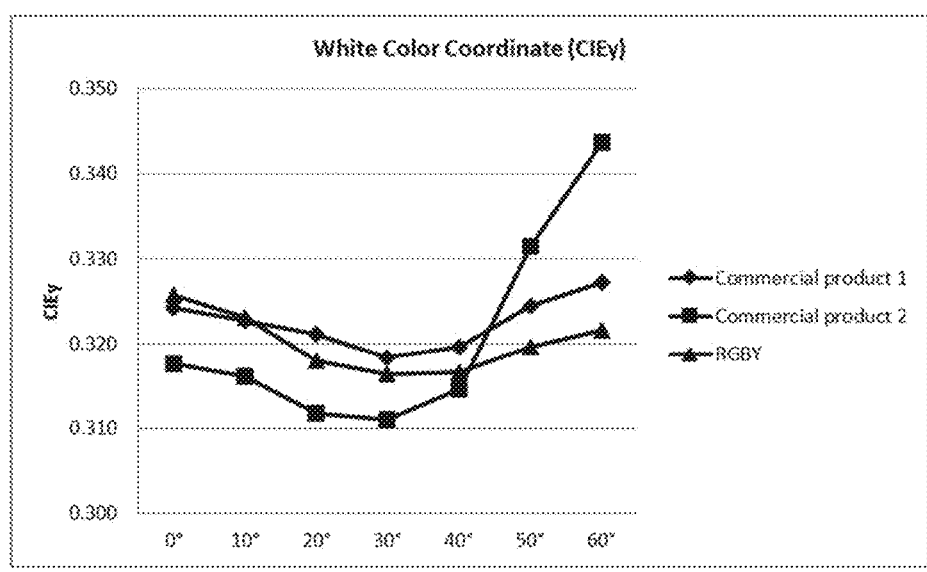

FIG. 55 shows simulation data tier an embodiment including blue and yellow emissive regions, with only the blue region coupled to a microcavity. The white point shift with viewing angle is shown. As illustrated by FIG. 55, the color shift is much less than measured from commercial displays in which all colors are produced from top emission OLEDs. Specifically, the results from measuring commercial top emission displays show as much as a +/−0.02 shift in both x and y CIE coordinate of the white point as the viewing angle is increased from 0° to 60°. In contrast, simulation data for an embodiment as disclosed herein shows a greatly reduced shift, including virtually no shift in the CIE x coordinate and a shift of only 0.005 in the y coordinate. More generally, embodiments disclosed herein allow for a color shift in the 1931 CIE coordinates of the white point of a display of less than (+/−0.01, 0.01) for all viewing angles between 0° and 60°.

As previously described, the various embodiments and configurations disclosed herein may allow for a reduced number of data lines and improved fill factor and resolution for OLED displays. For example, for a given pixel or pixel arrangement in an OLED display as disclosed herein, the pixel may include at least 2 sub-pixels of different colors, and the device may include at least 3 sub-pixels of different colors. That is, each pixel may be described as having a non-integer number of associated sub-pixels, when averaged across the display, and/or when sub-pixels that are shared among pixels are described as a partial sub-pixel. For example, a full-color display may include pixels defined by 2, 3, 4, or more sub-pixels, up to some integer n. However, the device as a whole may include 3, 4, or 5 or more sub-pixels of different colors, respectively, up to n+1. Further, such a configuration may require only n data lines for each of the plurality of pixels.

As used herein, various components may be used as color altering layers as disclosed. Suitable components include color conversion layers, color filters, color changing layers, microcavities, and the like. The dyes used in color conversion layers as disclosed herein are not particularly limited, and any compounds may be used as long as the compound is capable of converting color of light emitted from a light source to a required color, which is basically a wavelength conversion element capable of converting the wavelength of the light from the light source to a wavelength 10 nm or more longer than that of the light of the light source. It may be an organic fluorescent substance, an inorganic fluorescent substance, or a phosphorescent substance, and may be selected according to the objective wavelength. Examples of the material include, but not limit to the following classes: xanthen, acridine, oxazine, polyene, cyanine, oxonol, benzimidazol, indolenine, azamethine, styryl, thiazole, coumarin, anthraquinone, napthalimide, aza[18]annulene, porphin, squaraine, fluorescent protein, 8-hydroxyquinoline derivative, polymethin, nanocrystal, protein, perylene, phthalocyanine and metal-ligand coordination complex.

Examples of the fluorescent dye for converting luminescence of from UV and higher energy light to blue light include, but not limit to the styryl-based dyes such as 1,4-bis(2-methylstyryl)benzene, and trans-4,4'-diphenylstilbene, and coumarin based dyes such as 7-hydroxy-4-methylcoumarin, and combinations thereof Examples of the fluorescent dye for converting luminescence of from blue light to green light include, but not limit to the coumarin dyes such as 2,3,5,6-1H,4H-tetrahydro-8-trifluoromethylquinolizino(9,9a,1-gh)coumarin, 3-(2'-benzothiazolyl)-7-diethylaminocoumarin, 3-(2'-benzimidazolyl)-7-N,N-diethylaminocoumarin, and naphthalimide dyes such as Basic Yellow 51, Solvent yellow 11 and Solvent Yellow 116, and pyrene dyes such as 8-Hydroxy-1,3,6-pyrenetrisulfonic acid trisodium salt (HPTS), and combinations thereof.

Examples of the fluorescent dye for converting luminescence from blue to green light to red include, but not limit to the perylene based dyes such as N,N-bis(2,6-diisopropylphenyl)-1,6,7,12-tetraphenoxyperylene-3,4:9,10-tetracarboxdiimide (Lumogen Red F300), cyanine-based dyes such as 4-dicyanomethylene-2-methyl-6-(p-dimethylaminostyryl-4H-pyran, pyridine-based dyes such as 1-ethyl-2-(4-(p-dimethylaminophenyl)-1,3-butadienyl)-pyridinium perchlorate, and rhodamine-based dyes such as Rhodamine Band Rhodamine 6G, and oxazine-based dyes, and combinations thereof.

Examples of the inorganic fluorescent substance include, but not limit to an inorganic fluorescent substance comprising a metal oxide or metal chalcogenide doped with a transition metal ion, including a rare-earth metal ion.

Many metal-ligand coordination complexes can be used as dyes, they can be both fluorescent and phosphorescent substance.

It may be preferred to use a color conversion layer in the state that the layer is stacked on a color fitter. The stacked structure thereof on the color filter makes it possible to make better color purity of light transmitted through the color conversion layer. In some configurations, a "color altering layer" as disclosed herein may include multiple components, such as a color filter disposed in a stack with a color conversion layer, or just a color conversion layer alone, or just a color filter alone.

The material used for color filters is not particularly limited. A filter may be made of, for example, a dye, a pigment and a resin, or only a dye or pigment. The color filter made of a dye, a pigment and a resin may be a color filter in the form of a solid wherein the dye and the pigment are dissolved or dispersed in the binder resin.

Examples of the dye or pigment used in the color filter include, but not limit to perylene, isoindoline, cyanine, azo, oxazine, phthalocyanine, quinacridone, anthraquinone, and diketopyrrolo-pyrrole, and combinations thereof.

As used herein, and as would be understood by one of skill in the art, a "color conversion layer" (e.g. a "down conversion layer") may comprise a film of fluorescent or phosphorescent material which efficiently absorbs higher energy photons (e.g. blue light and/or yellow light) and reemits photons at lower energy (e.g. at green and/or red light) depending on the materials used. That is, the color conversion layer may absorb light emitted by an organic light emitting device (e.g. a white OLED) and reemit the light (or segments of the wavelengths of the emission spectrum of the light) at a longer wavelength. A color conversion layer may be a layer formed by mixing the fluorescent medium material contained in the above-mentioned color conversion layer with the color filter material. This makes it possible to give the color conversion layer a function of converting light emitted from an emitting device and further a color filter function of improving color purity. Thus, the structure thereof is relatively simple.

Embodiments disclosed herein may be incorporated into a wide variety of products and devices, such as flat panel displays, smartphones, transparent displays, flexible displays, televisions, portable devices such as laptops and pad computers or displays, multimedia devices, and general illumination devices. Displays as disclosed herein also may have relatively high resolutions, including 250, 300, 400, 500, 600, 700 dpi, or more, or any value therebetween.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A full-color pixel arrangement for an OLED display comprising:
    a substrate; and
    a plurality of pixels, each pixel comprising emissive regions of exactly two colors disposed laterally adjacent to one another over the substrate, each pixel of the plurality of pixels comprising:
        a first sub-pixel configured to emit light of a first color, the first sub-pixel having a first optical path length; and
        a second sub-pixel configured to emit light of a second color, the second sub-pixel having a second optical path length different than the first optical path length.

2. The arrangement of claim 1, wherein at least one pixel of the plurality of pixels further comprises:
    a third sub-pixel configured to emit light of a third color, the third sub-pixel having a third optical path length different than the first optical path length.

3. The arrangement of claim 2, further comprising a fourth sub-pixel configured to emit light of a fourth color, the fourth sub-pixel having a fourth optical path length different than the first optical path length.

4. The arrangement of claim 3, wherein the fourth optical path length is different than at least one of the second and third optical path lengths.

5. The arrangement of claim 4, wherein each of the first, second, third, and fourth optical path lengths is different than each of the other of the first, second, third, and fourth optical path lengths.

6. The arrangement of claim 5, further comprising:
    a first electrode stack disposed in a stack with each of the first, second, third, and fourth sub-pixels;
    wherein a first portion of the first electrode stack disposed in a stack with the first sub-pixel has a different thickness than a second portion of the first electrode stack, a third portion of the first electrode stack, and a fourth portion of the first electrode stack, wherein the second, third, and fourth portions are each disposed in a stack with the second, third, and fourth sub-pixels, respectively.

7. The arrangement of claim 6, wherein each of the first, second, third, and fourth sub-pixels comprises at least one organic layer that is the same thickness as in each of the other of the first, second, third, and fourth sub-pixels.

8. The arrangement of claim 1, wherein the total thickness of organic layers in the first sub-pixel is the same as the total thickness of organic layers in the second sub-pixel.

9. The arrangement of claim 1, wherein the total optical path length of organic layers in the first sub-pixel is the same as the total optical path length of organic layers in the second sub-pixel.

10. The arrangement of claim 2, wherein the total thickness of organic layers in the first, second, and third sub-pixels is the same.

11. The arrangement of claim 2, wherein the total optical path length of organic layers in the first, second, and third sub-pixels is the same.

12. The arrangement of claim 1, wherein the thickness of each type of organic layer is the same in each of the first and second sub-pixels.

13. The arrangement of claim 2, wherein the thickness of each type of organic layer is the same in each of the first, second, and third sub-pixels.

14. The arrangement of claim 1, further comprising:
    a first electrode stack disposed in a stack with each of the first, second, and third sub-pixels;
    wherein a first portion of the first electrode stack disposed in a stack with the first sub-pixel has a different thickness than a second portion of the first electrode stack disposed in a stack with the second sub-pixel.

15. The arrangement of claim 14, wherein a third portion of the first electrode disposed in a stack with the first sub-pixel has a different thickness than the first portion of the first electrode.

16. The arrangement of claim 2, wherein each of the first, second, and third sub-pixels comprises a transport layer having a different thickness than a respective transport layer in each of the other sub-pixels.

17. The arrangement of claim 1, wherein each pixel comprises not more than two color altering layers.

18. The arrangement of claim 1, wherein:
    the first sub-pixel comprises an emissive region of a first color; and
    the second sub-pixel comprises an emissive region of a second color.

19. A device comprising the full-color pixel arrangement of claim 1, wherein the device is a type selected from the group consisting of: a wearable device, a flat panel display, a computer monitor, a medical monitor, a television, a billboard, a light for interior or exterior illumination, a signal, a color tunable or color temperature tunable lighting source, a heads-up display, a fully transparent display, a flexible display, a 3D display, a laser printer, a telephone, a cell phone, a personal digital assistant (PDA), a laptop computer, a digital camera, a camcorder, a viewfinder, a micro-display, a vehicle, a large area wall, a theater or stadium screen, and a sign.

20. A method of fabricating a full-color pixel in an emissive device, the method comprising:
    fabricating a transparent layer over a substrate, the transparent layer comprising a first region and a second region, at least one optical characteristic being different between the first and second regions;
    fabricating a first organic emissive stack comprising a first emissive region of a first color over the first region; and
    fabricating a second organic emissive stack comprising a second emissive region of a second color over the second region;
    wherein the pixel comprises emissive regions of not more than two colors.

* * * * *